(12) United States Patent
Lee et al.

(10) Patent No.: US 10,784,272 B2
(45) Date of Patent: Sep. 22, 2020

(54) SEMICONDUCTOR MEMORY DEVICES

(71) Applicant: Samsung Electronics Co., Ltd., Suwon-si, Gyeonggi-do (KR)

(72) Inventors: Kiseok Lee, Hwaseong-si (KR); Junsoo Kim, Seongnam-si (KR); Hui-Jung Kim, Seongnam-si (KR); Bong-Soo Kim, Yongin-si (KR); Satoru Yamada, Yongin-si (KR); Kyupil Lee, Seongnam-si (KR); Sunghee Han, Hwaseong-si (KR); HyeongSun Hong, Seongnam-si (KR); Yoosang Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 4 days.

(21) Appl. No.: 16/027,887

(22) Filed: Jul. 5, 2018

(65) Prior Publication Data
US 2019/0164985 A1 May 30, 2019

(30) Foreign Application Priority Data

Nov. 24, 2017 (KR) .................. 10-2017-0158278

(51) Int. Cl.
*H01L 27/11556* (2017.01)
*H01L 23/532* (2006.01)
(Continued)

(52) U.S. Cl.
CPC .......... *H01L 27/11556* (2013.01); *G11C 7/18* (2013.01); *G11C 8/14* (2013.01);
(Continued)

(58) Field of Classification Search
CPC ......... H01L 27/11556; H01L 23/53295; H01L 27/11524; H01L 28/60; G11C 7/18; G11C 8/14; G11C 11/4097; G11C 11/404
See application file for complete search history.

(56) References Cited

U.S. PATENT DOCUMENTS 7,781,773 B2   8/2010  Thies et al.
8,207,032 B2   6/2012  Fischer
(Continued)

FOREIGN PATENT DOCUMENTS

| JP | 2017028327 | 2/2017 |
| KR | 20110136642 | 12/2011 |
| KR | 20140007241 | 1/2014 |

*Primary Examiner* — Thanh T Nguyen
(74) *Attorney, Agent, or Firm* — Myers Bigel, P.A.

(57) ABSTRACT

A semiconductor memory device comprises a stack structure including a plurality of layers vertically stacked on a substrate. Each of the plurality of layers includes a first dielectric layer, a semiconductor layer, and a second dielectric layer that are sequentially stacked, and a first conductive line in the second dielectric layer and extending in a first direction. The device also comprises a second conductive line extending vertically through the stack structure, and a capacitor in the stack structure and spaced apart from the second conductive line. The semiconductor layer comprises semiconductor patterns extending in a second direction intersecting the first direction between the first conductive line and the substrate. The second conductive line is between a pair of the semiconductor patterns adjacent to each other in the first direction. An end of each of the semiconductor patterns is electrically connected to a first electrode of the capacitor.

20 Claims, 60 Drawing Sheets

(51) Int. Cl.
*G11C 7/18* (2006.01)
*H01L 49/02* (2006.01)
*G11C 8/14* (2006.01)
*H01L 27/11524* (2017.01)
*G11C 11/404* (2006.01)
*G11C 11/4097* (2006.01)

(52) U.S. Cl.
CPC .. *H01L 23/53295* (2013.01); *H01L 27/11524* (2013.01); *H01L 28/60* (2013.01); *G11C 11/404* (2013.01); *G11C 11/4097* (2013.01)

(56) References Cited

U.S. PATENT DOCUMENTS

| | | |
|---|---|---|
| 8,441,053 B2 | 5/2013 | Chen |
| 8,637,912 B1 | 1/2014 | Park |
| 8,780,602 B2 | 7/2014 | Lue |
| 9,318,374 B2 | 4/2016 | Atsumi |
| 9,514,792 B2 | 12/2016 | Kajigaya |
| 2010/0002516 A1 | 1/2010 | Sim |
| 2010/0308390 A1 | 12/2010 | Puget |
| 2013/0161713 A1 | 6/2013 | Yamazaki |
| 2014/0043911 A1 | 2/2014 | Samachisa et al. |
| 2014/0197469 A1 | 7/2014 | Lee |
| 2017/0053906 A1 | 2/2017 | Or-Bach |
| 2017/0092371 A1 | 3/2017 | Harari |
| 2017/0148811 A1 | 5/2017 | Zhang et al. |
| 2017/0221761 A1 | 8/2017 | Or-Bach |
| 2019/0103407 A1* | 4/2019 | Kim ................ H01L 27/10805 |

\* cited by examiner

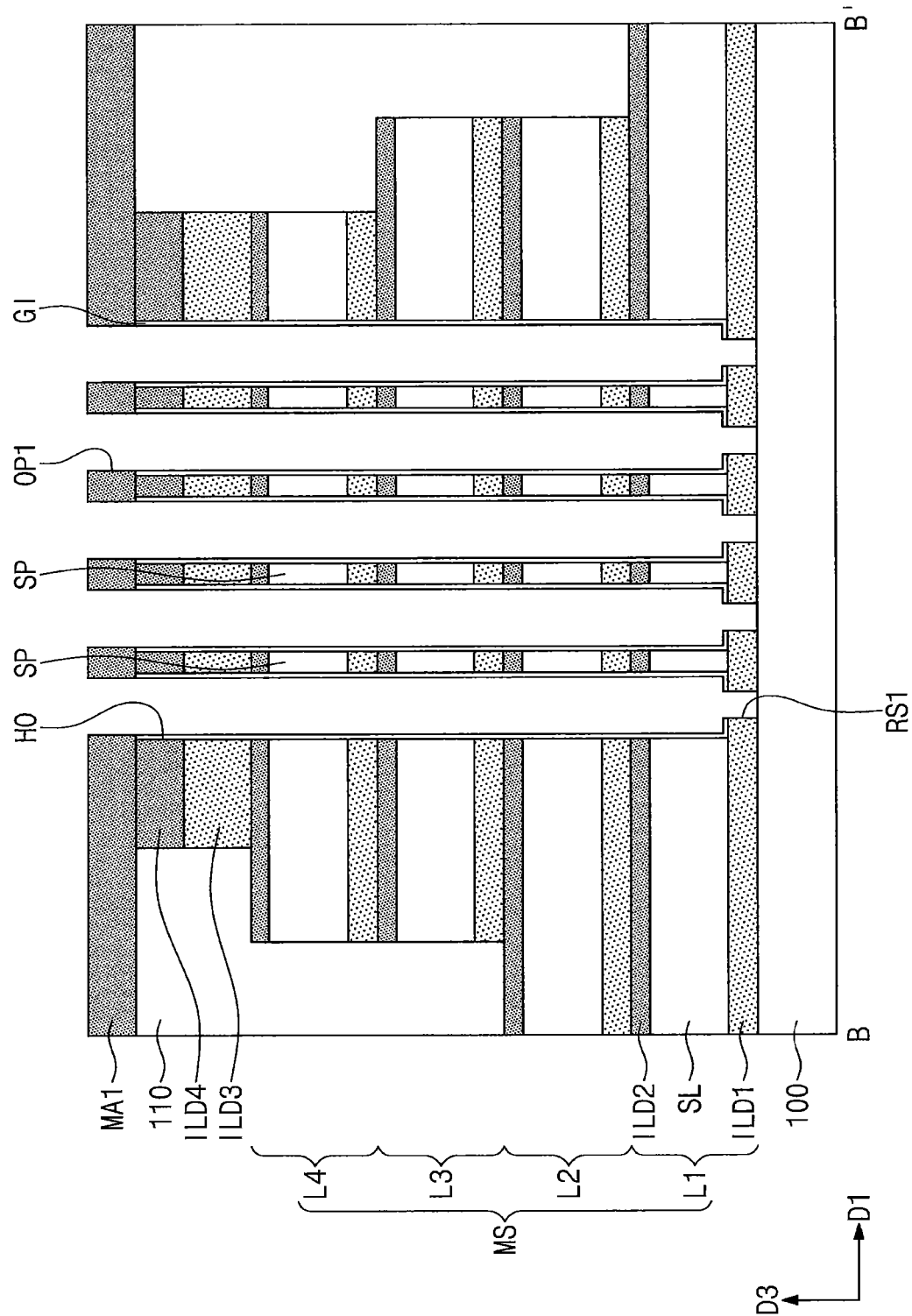

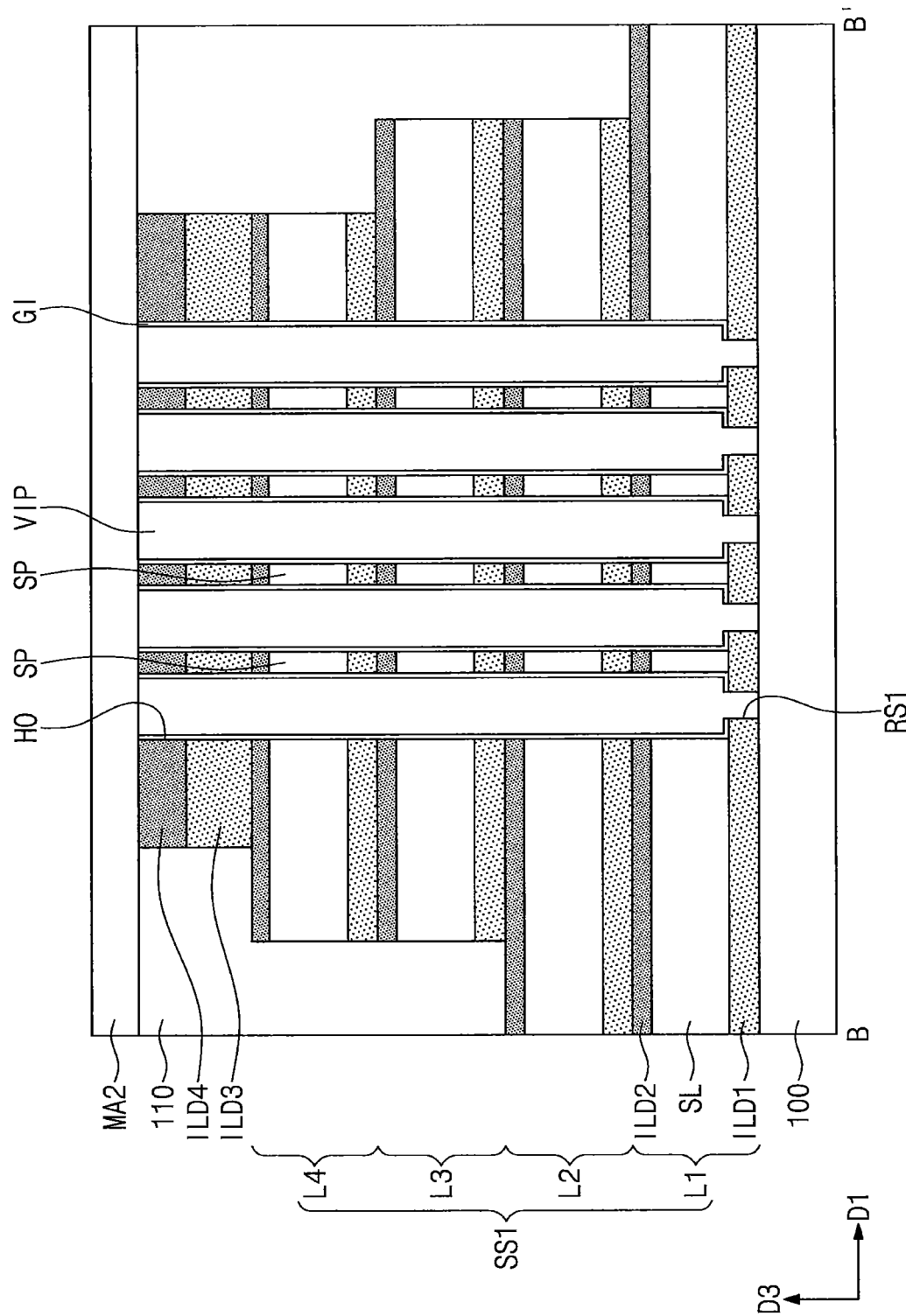

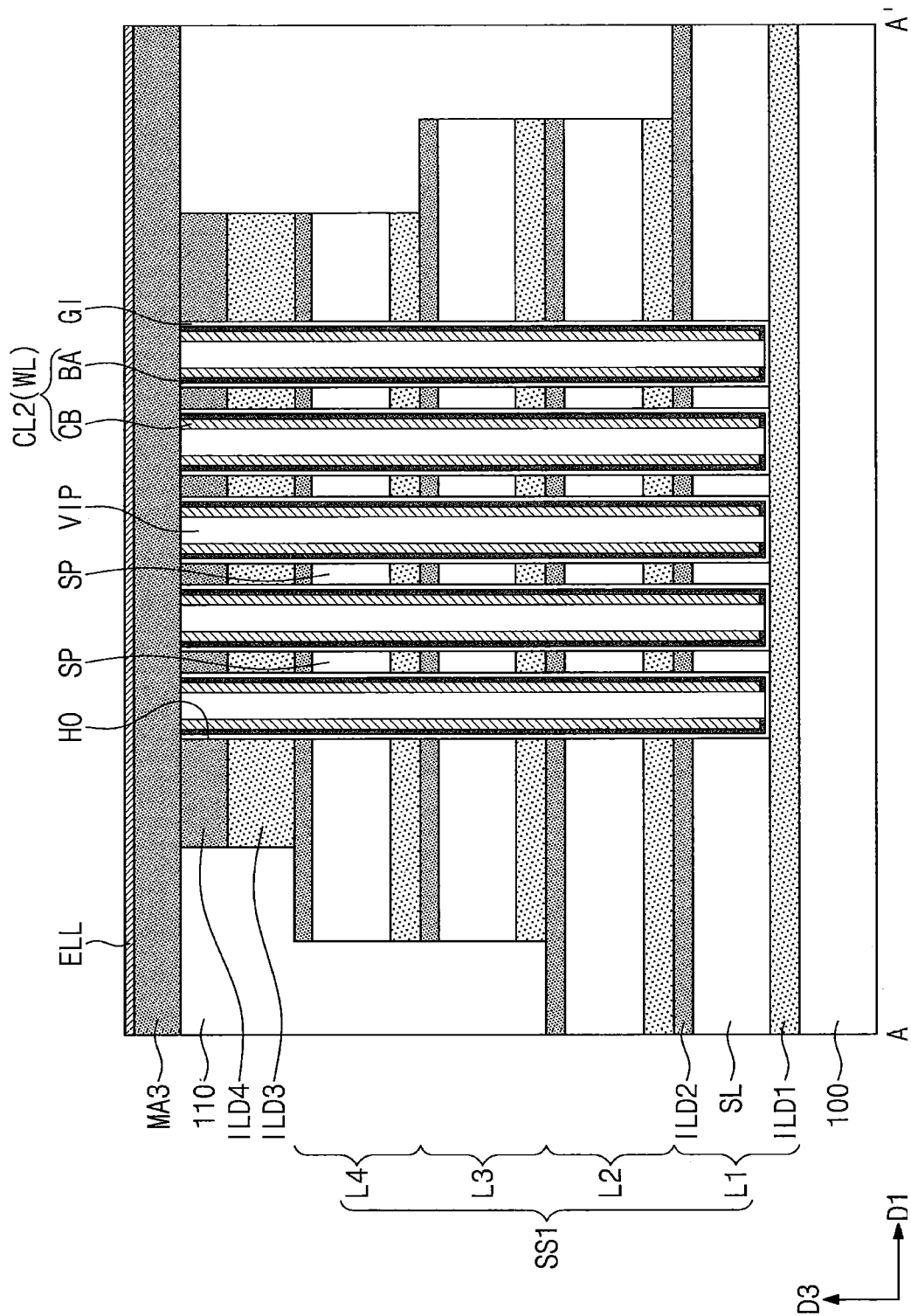

SEMICONDUCTOR MEMORY DEVICES

CROSS-REFERENCE TO RELATED APPLICATIONS

This U.S. nonprovisional patent application claims priority under 35 U.S.C § 119 to Korean Patent Application No. 10-2017-0158278 filed on Nov. 24, 2017, the entire contents of which are hereby incorporated by reference.

BACKGROUND

The inventive concepts described herein relate to semiconductor devices, and more particularly, to three-dimensional semiconductor memory devices having increased integration.

Semiconductor devices have been highly integrated to improve their performance and provide lower manufacturing costs. Since the integration of semiconductor devices may be a factor in determining product price, highly integrated semiconductor devices may become more increasingly demanded. An integration of typical two-dimensional or planar semiconductor devices may be related to the area occupied by a unit memory cell of the device, such that the integration of the device may be influenced by the technology used for forming fine patterns of the device. However, processing equipment used to increase pattern fineness may be expensive and may therefore set a practical limitation on increasing the integration of the two-dimensional or planar semiconductor devices. Therefore, three-dimensional semiconductor memory devices having three-dimensionally arranged memory cells have been proposed.

SUMMARY

Some embodiments of the inventive concepts provide three-dimensional semiconductor memory devices having increased integration.

According to some embodiments of the inventive concepts, a semiconductor memory device may comprise: a stack structure including a plurality of layers vertically stacked on a substrate, each of the plurality of layers comprising a first dielectric layer, a semiconductor layer, and a second dielectric layer that are sequentially stacked, and a first conductive line in the second dielectric layer and extending in a first direction; a second conductive line extending through the stack structure; and a capacitor in the stack structure and spaced apart from the second conductive line the capacitor comprising a first electrode. The semiconductor layer may comprise semiconductor patterns extending in a second direction intersecting the first direction between the first conductive line and the substrate. The second conductive line may be interposed between a pair of the semiconductor patterns adjacent to each other in the first direction. An end of each of the semiconductor patterns may be electrically connected to the first electrode.

According to some embodiments of the inventive concepts, a semiconductor memory device may comprise: a stack structure including a plurality of layers vertically stacked on a substrate; and a second conductive line penetrating the stack structure and extending vertically. Each of the plurality of layers of the stack structure may comprise: a semiconductor pattern extending in a second direction, the semiconductor pattern including a first impurity region, a second impurity region, and a channel region between the first and second impurity regions; a first conductive line electrically connected to the first impurity region and extending in a first direction intersecting the second direction; and a data storage element electrically connected to the second impurity region. The second conductive line may be adjacent to the channel region of the semiconductor pattern.

According to some embodiments of the inventive concepts, a semiconductor memory device may comprise: a stack structure including a plurality of layers stacked vertically on a substrate, each of the plurality of layers including a plurality of memory cell transistors; a word line extending vertically from a top surface of the substrate and connected to gates of the memory cell transistors that are vertically stacked; a bit line extending in a first direction parallel to the top surface of the substrate and connected to sources of respective ones of the memory cell transistors in one layer of the plurality of layers; and a capacitor connected to a drain of respective ones of the memory cell transistors.

BRIEF DESCRIPTION OF THE DRAWINGS

FIGS. 19, 21, 23A, 25A, 27A, 29A, 31A, 33A, and 35A illustrate cross-sectional views taken along line A-A' of FIGS. 18, 20, 22, 24, 26, 28, 30, 32, and 34, respectively.

FIGS. 23B, 25B, 27B, 29B, 31B, 33B, and 35B illustrate cross-sectional views taken along line B-B' of FIGS. 22, 24, 26, 28, 30, 32, and 34, respectively.

DETAILED DESCRIPTION OF EMBODIMENTS

Figure 1:
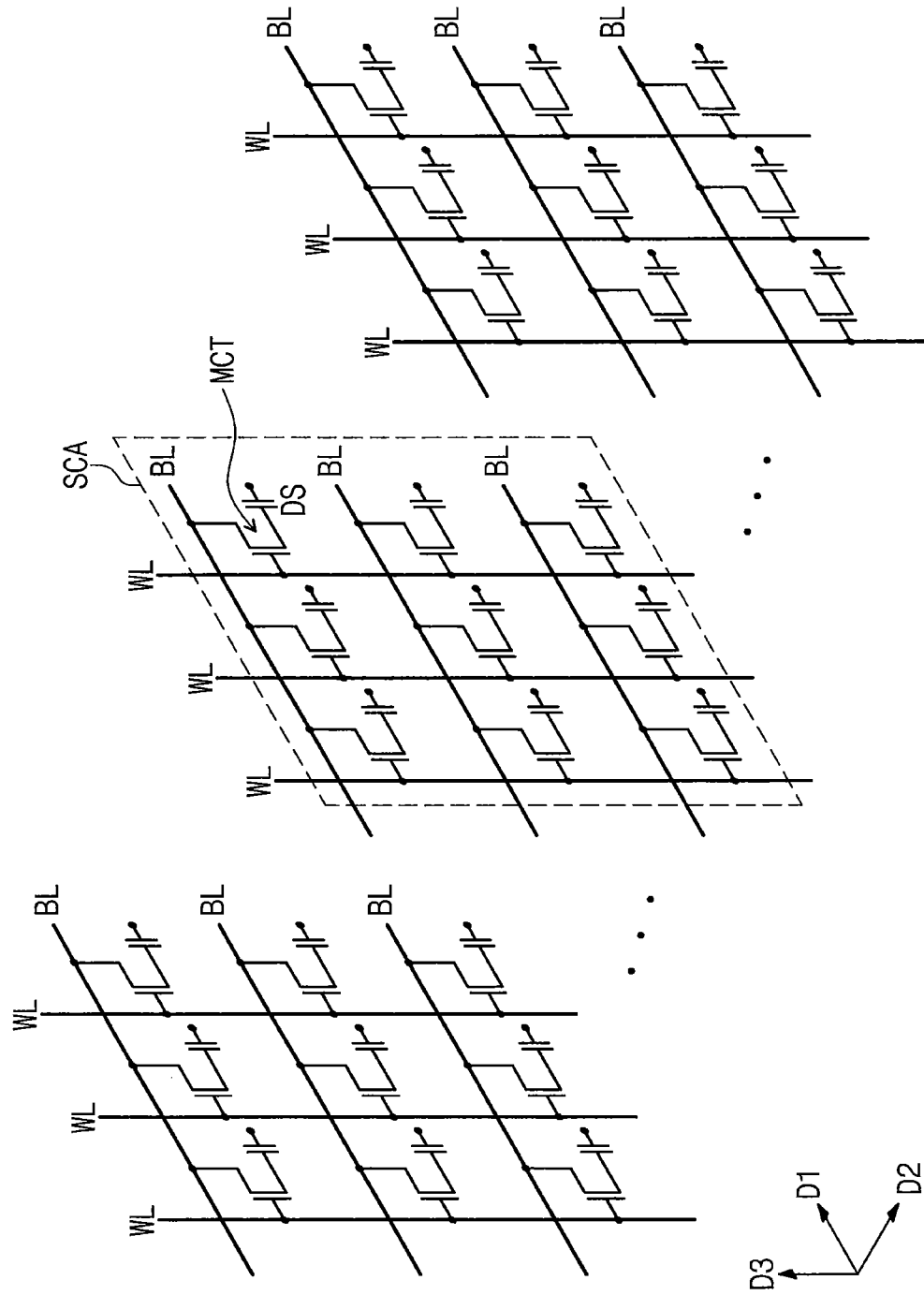
FIG. 1 illustrates a simplified circuit diagram showing a cell array of a three-dimensional semiconductor memory device according to some embodiments of the inventive concepts.

FIG. 1 illustrates a simplified circuit diagram showing a cell array of a three-dimensional semiconductor memory device according to some embodiments of the inventive concepts.

Referring to FIG. 1, a three-dimensional semiconductor memory device according to some embodiments of the inventive concepts may include a cell array consisting of a plurality of sub cell arrays SCA. The sub cell arrays SCA may be arranged along a second direction D2.

Each of the sub cell arrays SCA may include a plurality of bit lines BL, a plurality of word lines WL, and a plurality of memory cell transistors MCT. One memory cell transistor MCT may be disposed between one word line WL and one bit line BL.

The bit lines BL may be or include conductive patterns (e.g., metal lines) disposed on and spaced apart from a substrate. The bit lines BL may extend in a first direction D1. The bit lines BL in one sub cell array SCA may be spaced apart from each other in a vertical direction, or a third direction D3.

The word lines WL may be or include conductive patterns (e.g., metal lines) extending in a vertical direction with respect to the substrate, (e.g., in the third direction D3). The word lines WL in one sub cell array SCA may be spaced apart from each other in the first direction D1.

A gate of the memory cell transistor MCT may be connected to the word line WL, and a first terminal (e.g., a source) of the memory cell transistor MCT may be connected to the bit line BL. Each of the memory cell transistors MCT may be connected to a data storage element DS. For example, the data storage element DS may be or include a capacitor, and a second terminal (e.g., a drain) of the memory cell transistor MCT may be connected to the capacitor.

Figure 2:
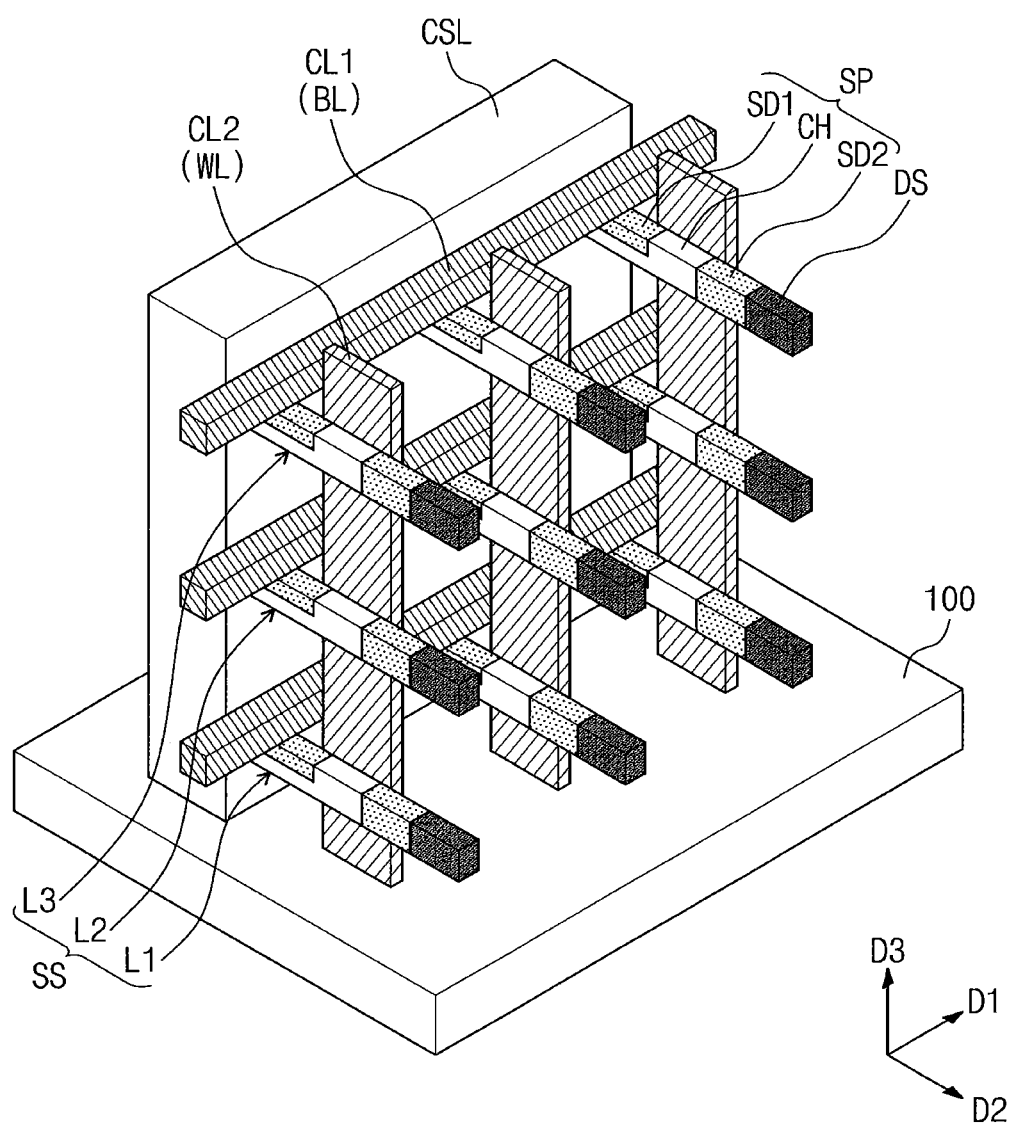
FIG. 2 illustrates a perspective view showing a three-dimensional semiconductor memory device according to some embodiments of the inventive concepts.
Figure 3:
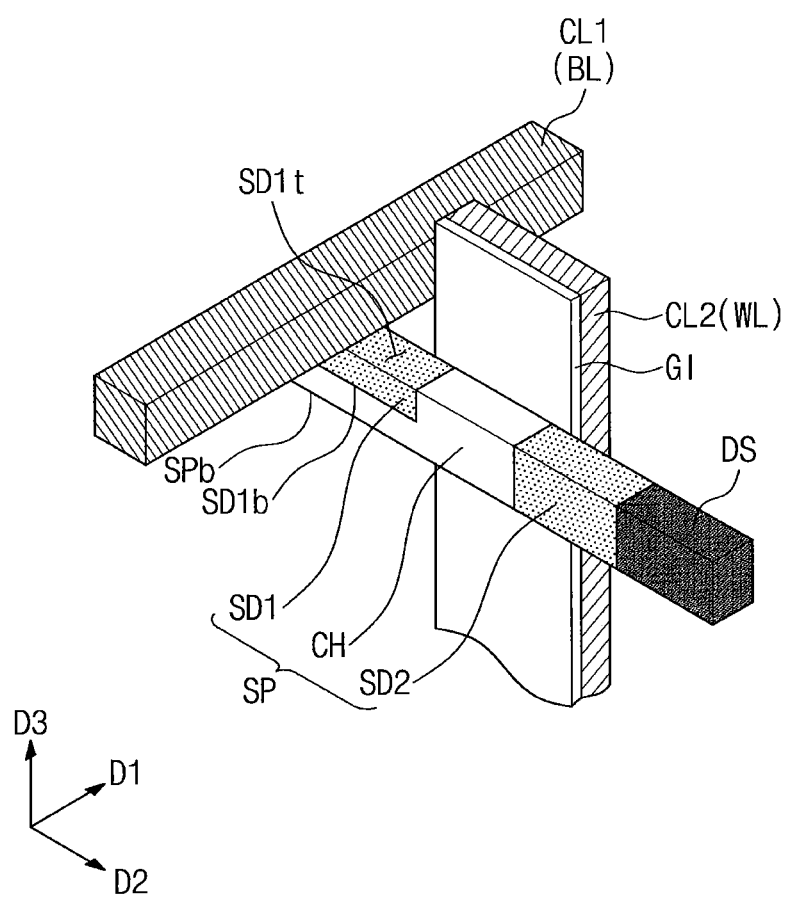
FIG. 3 illustrates a perspective view showing a unit cell of the three-dimensional semiconductor memory device shown in FIG. 2.

FIG. 2 illustrates a perspective view showing a three-dimensional semiconductor memory device according to some embodiments of the inventive concepts. FIG. 3 illustrates a perspective view showing a unit cell of the three-dimensional semiconductor memory device shown in FIG. 2.

Referring to FIGS. 1, 2, and 3, a substrate 100 may be provided with one of the plurality of sub cell arrays SCA discussed above with reference to FIG. 1 thereon. The substrate 100 may be or include a silicon substrate, a germanium substrate, or a silicon-germanium substrate, though the inventive concepts are not limited thereto.

For example, the substrate 100 may be provided with a stack structure SS including first, second, and third layers L1, L2, and L3 thereon. The first to third layers L1 to L3 of the stack structure SS may be arranged (e.g., stacked) in a vertical direction (e.g., the third direction D3). Each of the first to third layers L1 to L3 may include a plurality of semiconductor patterns SP, a plurality of data storage elements DS, and a first conductive line CL1.

The semiconductor patterns SP may extend in the second direction D2. In some embodiments, the semiconductor patterns SP may have a linear, bar, or pillar shape, though the inventive concepts are not limited thereto. For example, the semiconductor patterns SP may include silicon, germanium, silicon-germanium, and/or indium gallium zinc oxide (IGZO). Each of the semiconductor patterns SP may include a channel region CH, a first impurity region SD1, and a second impurity region SD2. The channel region CH may be interposed between the first and second impurity regions SD1 and SD2. The channel region CH may correspond to a channel of the memory cell transistor MCT discussed above with reference to FIG. 1. The first and second impurity regions SD1 and SD2 may correspond to the source and drain of the memory cell transistor MCT discussed above with reference to FIG. 1.

The data storage elements DS may be connected to one respective end of the semiconductor patterns SP. The data storage elements DS may be connected to respective second impurity regions SD2 of the semiconductor patterns SP. The data storage elements DS may be or include memory elements capable of storing data. Each of the data storage elements DS may be a memory element using one of a capacitor, a magnetic tunnel junction pattern, and/or a variable resistance body which includes a phase change material. For example, each of the data storage elements DS may be a capacitor which will be discussed below in detail with reference to FIGS. 4A to 4C.

Each of the first conductive lines CL1 may extend in the first direction D1. In some embodiments, the first conductive lines CL1 may have a linear and/or bar shape, though the inventive concepts are not limited thereto. The first conductive lines CL1 may be arranged (e.g., stacked) along the third direction D3. The first conductive lines CL1 may include a conductive material. For example, the conductive material may include one or more of a doped semiconductor (doped silicon, doped germanium, etc.), a conductive metal nitride (titanium nitride, tantalum nitride, etc.), a metal (tungsten, titanium, tantalum, etc.), and/or a metal-semiconductor compound (tungsten silicide, cobalt silicide, titanium silicide, etc.). The first conductive lines CL1 may correspond to the bit lines BL discussed above with reference to FIG. 1.

Among the first to third layers L1 to L3, the first layer L1 will be representatively described in detail. The semiconductor patterns SP of the first layer L1 may be arranged spaced apart from each other in the first direction D1. The semiconductor patterns SP of the first layer L1 may be located at substantially the same first level. The first conductive line CL1 of the first layer L1 may be disposed on the semiconductor patterns SP of the first layer L1. The first conductive line CL1 may be disposed on top surfaces of the semiconductor patterns SP. The first conductive line CL1 may be disposed on top surfaces of the first impurity regions SD1 of the semiconductor patterns SP. The first conductive line CL1 may be placed at a second level higher (e.g., farther from the substrate 100) than the first level at which the semiconductor patterns SP are located. In some embodiments, the first conductive line CL1 may be directly connected to the first impurity regions SD1. In some embodiments, the first conductive line CL1 may be connected to the first impurity regions SD1 through contacts including metal silicide. The above detailed description of the first layer L1 may also be substantially applicable to the second and third layers L2 and L3.

Second conductive lines CL2 penetrating the stack structure SS may be on the substrate 100. Each of the second conductive lines CL2 may extend in the third direction D3. In some embodiments, the second conductive lines CL2 may have a linear and/or bar shape, though the inventive concepts are not limited thereto. The second conductive lines CL2 may be arranged in the first direction D1. When viewed in a plan view, each of the second conductive lines CL2 may be provided between a pair of the semiconductor patterns SP adjacent to each other. Each of the second conductive lines CL2 may vertically extend (e.g., in the third direction D3) on sidewalls of respective ones of a plurality of the semiconductor patterns SP that are vertically stacked.

For example, a first one of the second conductive lines CL2 may be adjacent to a first one of the semiconductor patterns SP of the first layer L1, a first one of the semiconductor patterns SP of the second layer L2, and a first one of the semiconductor patterns SP of the third layer L3. A second one of the second conductive lines CL2 may be adjacent to a second one of the semiconductor patterns SP of the first layer L1, a second one of the semiconductor patterns SP of the second layer L2, and a second one of the semiconductor patterns SP of the third layer L3.

The second conductive lines CL2 may include a conductive material, such as, for example, one of a doped semiconductor material, a conductive metal nitride, metal, and/or a metal-semiconductor compound. The second conductive lines CL2 may correspond to the word lines WL discussed above with reference to FIG. 1.

A common source line CSL extending in the first direction D1 along one lateral surface of the stack structure SS may be provided on the substrate 100. In some embodiments, the common source line CSL may be coupled to other ends of the semiconductor patterns SP. The common source line CSL may be connected to a body of each of the memory cell transistors MCT discussed above with reference to FIG. 1. The common source line CSL may include a conductive material, such as, for example, one of a doped semiconductor material, a conductive metal nitride, metal, and/or a metal-semiconductor compound.

Although not shown, an insulating material may fill other spaces in the stack structure SS. For example, the insulating material may include one or more of a silicon oxide layer, a silicon nitride layer, and/or a silicon oxynitride layer.

One of the memory cell transistors of FIG. 2 will be discussed below in detail with reference to FIG. 3. The first and second impurity regions SD1 and SD2 may be impurity-doped portions of the semiconductor pattern SP. The first and second impurity regions SD1 and SD2 may have n-type or p-type conductivity. The first impurity region SD1 may occupy an upper portion of the semiconductor pattern SP. The first impurity region SD1 may have a bottom surface SD1$b$ higher than a bottom surface SPb of the semiconductor pattern SP. The semiconductor pattern SP may have a lower portion, which is below the first impurity region SD1, connected to the common source line CSL discussed above with reference to FIG. 2. The first conductive line CL1 may be disposed on a top surface SD1$t$ of the first impurity region SD1, thereby being electrically connected to the first impurity region SD1.

The second conductive line CL2 may be adjacent to the channel region CH of the semiconductor pattern SP. The second conductive line CL2 may be provided on a sidewall of the channel region CH, while extending in the third direction D3. A gate dielectric layer GI may be interposed between the second conductive line CL2 and the channel region CH. The gate dielectric layer GI may include, for example, a high-k dielectric layer, a silicon oxide layer, a silicon nitride layer, a silicon oxynitride layer, or a combination thereof. For example, the high-k dielectric layer may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

Figure 4A:
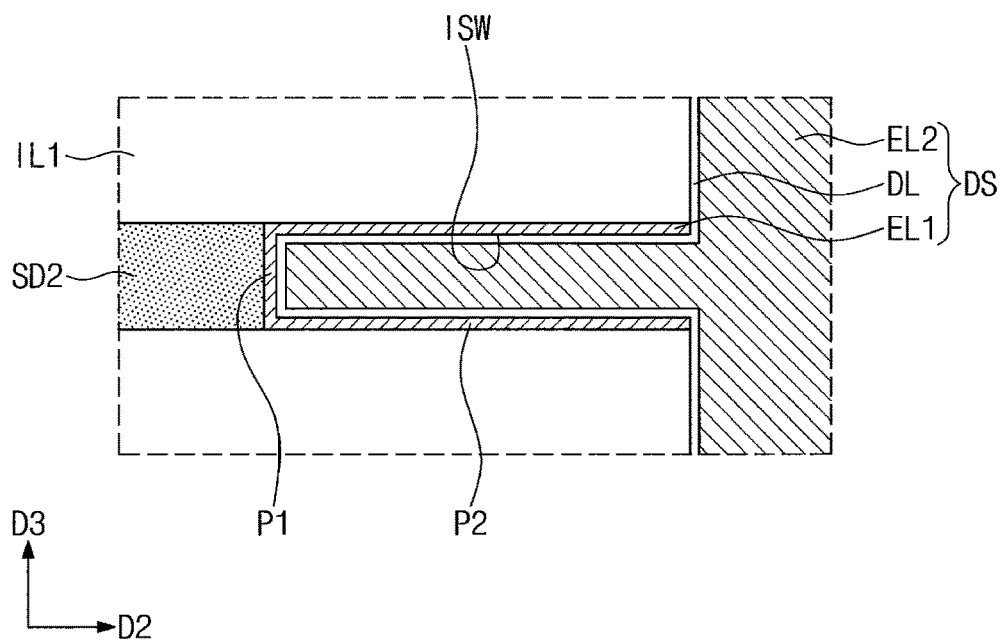
FIGS. 4A to 4C illustrate cross-sectional views showing examples of a data storage element according to some embodiments of the inventive concepts.
Figure 4B:
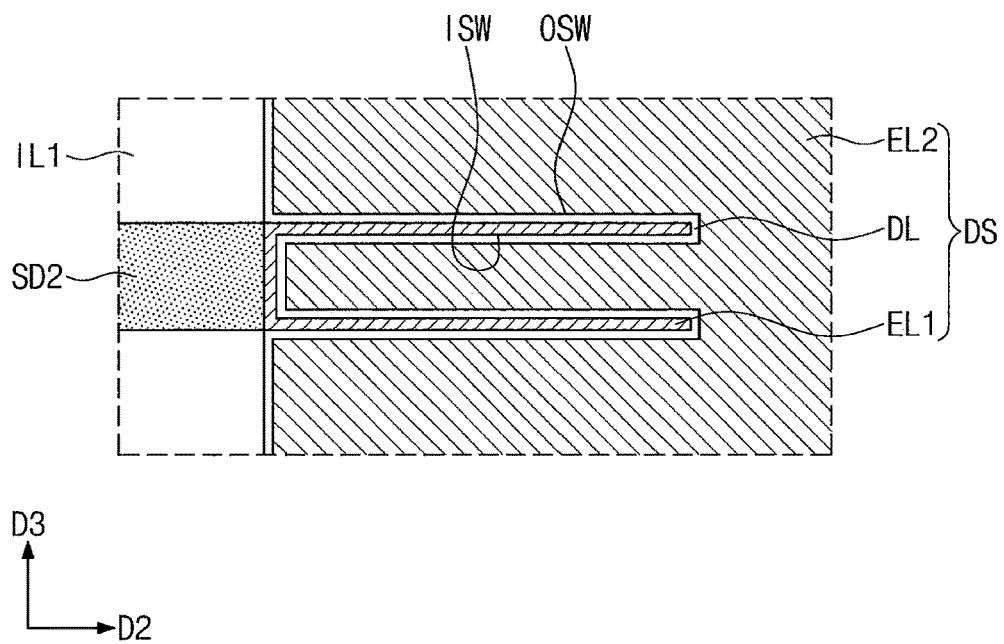
Figure 4C:
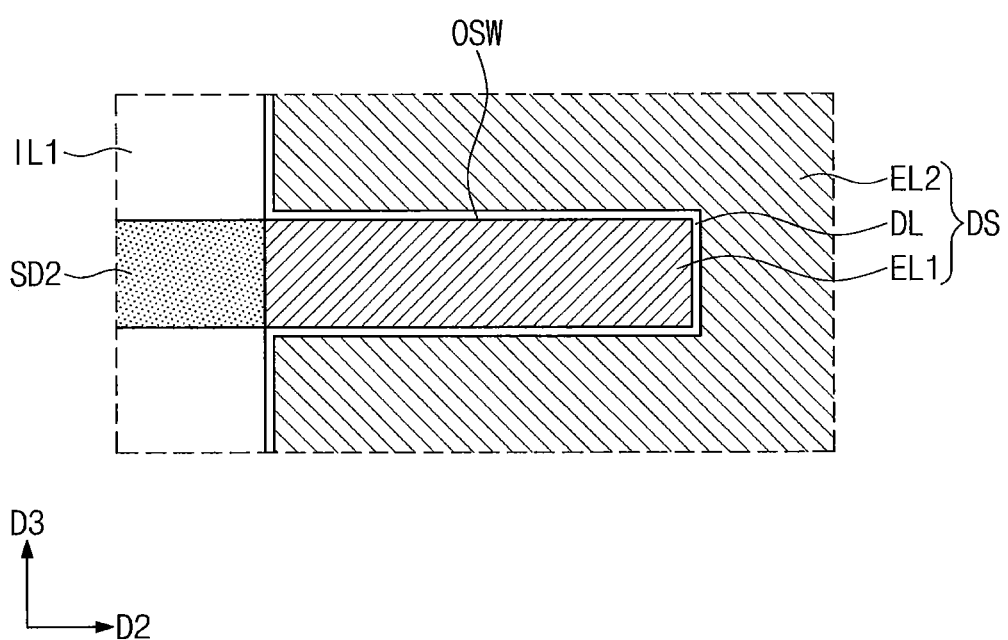

FIGS. 4A to 4C illustrate cross-sectional views showing examples of a data storage element according to some embodiments of the inventive concepts. For example, FIGS. 4A to 4C illustrate cross-sectional views showing a variety of examples of capacitors.

Referring to FIGS. 2, 3, and 4A, the data storage element DS may include a first electrode EL1, a dielectric layer DL, and a second electrode EL2. The first electrode EL1 may be connected to the second impurity region SD2 of the semiconductor pattern SP.

The first electrode EL1 may include a first part P1 in contact with the second impurity region SD2 and a second part P2 extending in the second direction D2 from first part P1. The first electrode EL1 may have a cylindrical shape, though the inventive concepts are not limited thereto. The first and second parts P1 and P2 of the first electrode EL1 may have substantially the same thickness. A first insulation layer IL1 may cover the second impurity region SD2 and the second part P2 of the first electrode EL1.

The first electrode EL1 may include, for example, one or more of metal, metal nitride, and metal silicide. For example, the first electrode EL1 may include a high melting point metal layer such as cobalt, titanium, nickel, tungsten, and/or molybdenum. The first electrode EL1 may include, for example, a metal nitride layer such as a titanium nitride layer, a titanium silicon nitride layer, a titanium aluminum nitride layer, a tantalum nitride layer, a tantalum silicon nitride layer, a tantalum aluminum nitride layer, and/or a tungsten nitride layer. The first electrode EL1 may include, for example, a noble metal layer including at least one selected from the group consisting of platinum (Pt), ruthenium (Ru), and iridium (Ir). The first electrode EL1 may include, for example, a conductive noble metal oxide layer such as PtO, RuO$_2$, and/or IrO$_2$. The first electrode EL1 may include, for example, a conductive oxide layer such as SRO(SrRuO$_3$), BSRO((Ba,Sr)RuO$_3$), and CRO(CaRuO$_3$), and/or LSCo.

The dielectric layer DL may be interposed between the first electrode EL1 and the second electrode EL2. The dielectric layer DL may cover, and, in some embodiments, directly contact, an inner sidewall ISW of the first electrode EL1. The dielectric layer DL may have a substantially uniform thickness on the inner sidewall ISW of the first electrode EL1. For example, the dielectric layer DL may include one or more of a metal oxide such as hafnium oxide, zirconium oxide, aluminum oxide, lanthanum oxide, tantalum oxide, and/or titanium oxide, and a perovskite structured dielectric such as SrTiO$_3$(STO), (Ba,Sr)TiO$_3$(BST), BaTiO$_3$, PZT, and/or PLZT.

The second electrode EL2 may be provided on the dielectric layer DL. The second electrode EL2 may be within, and in some embodiments, fill an inner portion (e.g., an internal cylinder) of the first electrode EL1. The second electrode EL2 may include, for example, one or more of impurity-doped silicon, metal, metal nitride, and metal silicide. A detailed description of a constituent material of the second electrode EL2 may be similar to that discussed with respect to the first electrode EL1.

Referring to FIGS. 2, 3, and 4B, FIG. 4B shows an example of a capacitor shaped differently from that illustrated in FIG. 4A. The first insulation layer IL1 may be on portions of the second impurity region SD2, but not on portions of the first electrode EL1. In some embodiments, the dielectric layer DL may cover the inner and outer sidewalls ISW and OSW of the first electrode EL1. The second electrode EL2 may be provided on the outer sidewall OSW of the first electrode EL1, while filling an inner portion of the first electrode EL1.

Referring to FIGS. 2, 3, and 4C, FIG. 4C shows an example of a capacitor shaped differently from that illustrated in FIG. 4A. The first electrode EL1 may have a pillar shape. For example, the first electrode EL1 may have a solid internal structure. The first electrode EL1 may have a pillar shape whose internal structure is composed of (e.g., completely filled with) a conductive material. The dielectric layer DL may be on the outer sidewall OSW of the first electrode EL1. The second electrode EL2 may be provided on the outer sidewall OSW of the first electrode EL1.

A three-dimensional semiconductor memory device according to some embodiments of the inventive concepts may include the memory cell transistors MCT and the data storage elements DS that are three-dimensionally stacked on the substrate 100. This configuration may result in increased integration of the memory device, compared to a conventional memory device including memory cell transistors and data storage elements that are two-dimensionally arranged on a substrate. A three-dimensional semiconductor memory device according to some embodiments of the inventive concepts may be applicable to cryogenic computing performed at a temperature below 100 K. The memory cell transistors of the inventive concepts may be achieved as junction-less transistors.

FIGS. 5 to 9 illustrate perspective views showing examples of a unit cell of the three-dimensional semiconductor memory device shown in FIG. 2. In the embodiments that follow, a detailed description of technical features repetitive to those discussed above with reference to FIGS. 1, 2, and 3 will be omitted, and a difference thereof will be discussed in detail.

Figure 5:
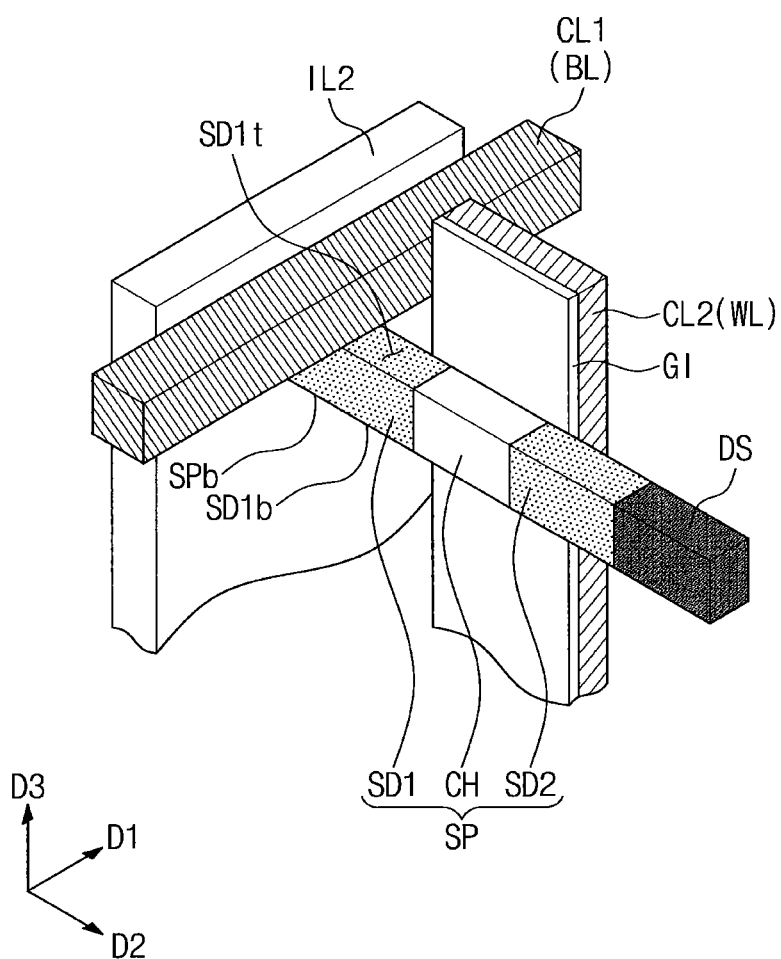
FIGS. 5 to 9 illustrate perspective views showing examples of a unit cell of the three-dimensional semiconductor memory device shown in FIG. 2.

Referring to FIGS. 1, 2, and 5, the common source line CSL may not be provided, and instead a second insulation layer IL2 may be provided. The first impurity region SD1 may occupy not only upper but also lower portions of the semiconductor pattern SP. For example, the bottom surface SD1b of the first impurity region SD1 may be coplanar with the bottom surface SPb of the semiconductor pattern SP. In some embodiments, the first impurity region SD1 of the semiconductor pattern SP may be in direct contact with the second insulation layer IL2. The absence of the common source line CLS discussed above may enable the memory cell transistor MCT to have a floating body.

Figure 6:
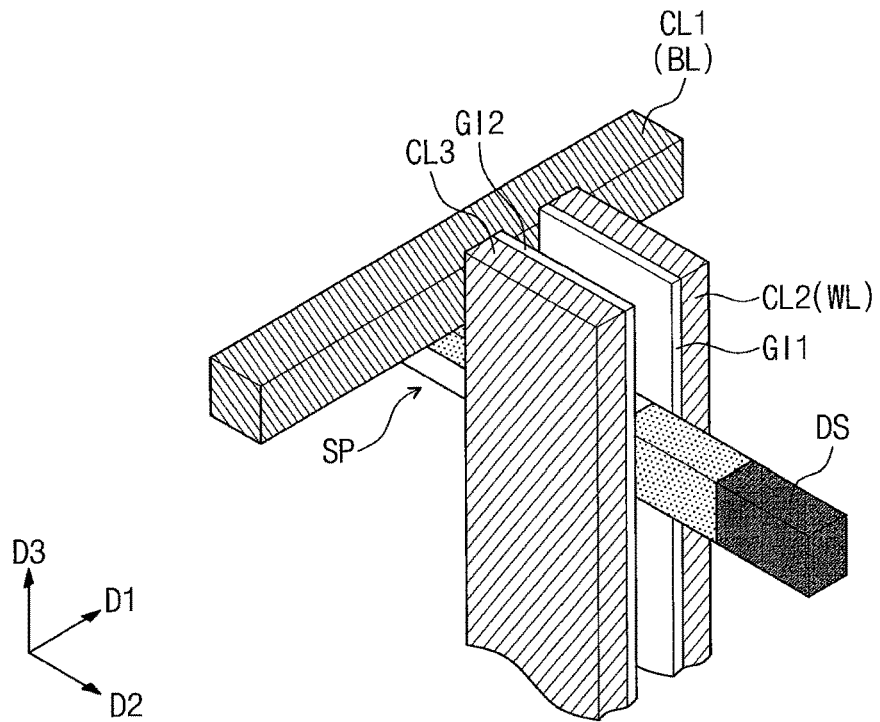

Referring to FIGS. 1, 2, and 6, the second conductive line CL2 may be provided on one side of the semiconductor pattern SP, and a third conductive line CL3 may be provided on an opposite side of the semiconductor pattern SP. The third conductive line CL3 may extend parallel to the second conductive line CL2 in the third direction D3. For example, a pair of vertical conductive lines CL2 and CL3 may be adjacent to each other on opposite sides of each of the semiconductor patterns SP that are vertically stacked.

A first gate dielectric layer GI1 may be interposed between the second conductive line CL2 and the semiconductor pattern SP, and a second gate dielectric layer GI2 may be interposed between the third conductive line CL3 and the semiconductor pattern SP. For example, the third conductive line CL3 may be a back gate of the memory cell transistor MCT. For another example, the third conductive line CL3 may constitute one word line WL together with the second conductive line CL2. When the word line WL is composed of two conductive lines CL2 and CL3, opposite sides of the channel region CH may be covered with the two conductive lines CL2 and CL3, and thus the memory cell transistor MCT may increase in electrical characteristics.

Figure 7:
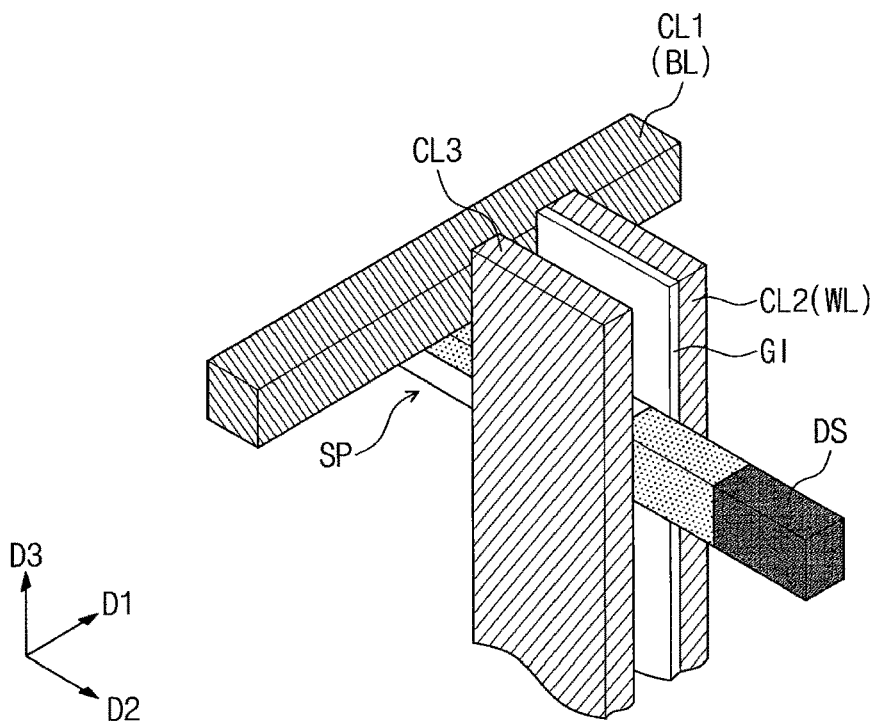

Referring to FIGS. 1, 2, and 7, the third conductive line CL3 may be provided as discussed above with reference to FIG. 6. No gate dielectric layer may be provided between the third conductive line CL3 and the semiconductor pattern SP. For example, the third conductive line CL3 may be in direct contact with the semiconductor pattern SP. The third conductive line CL3 may be electrically connected to the semiconductor pattern SP. In this case, the third conductive line CL3 may serve as a body contact of the memory cell transistor MCT.

Figure 8:
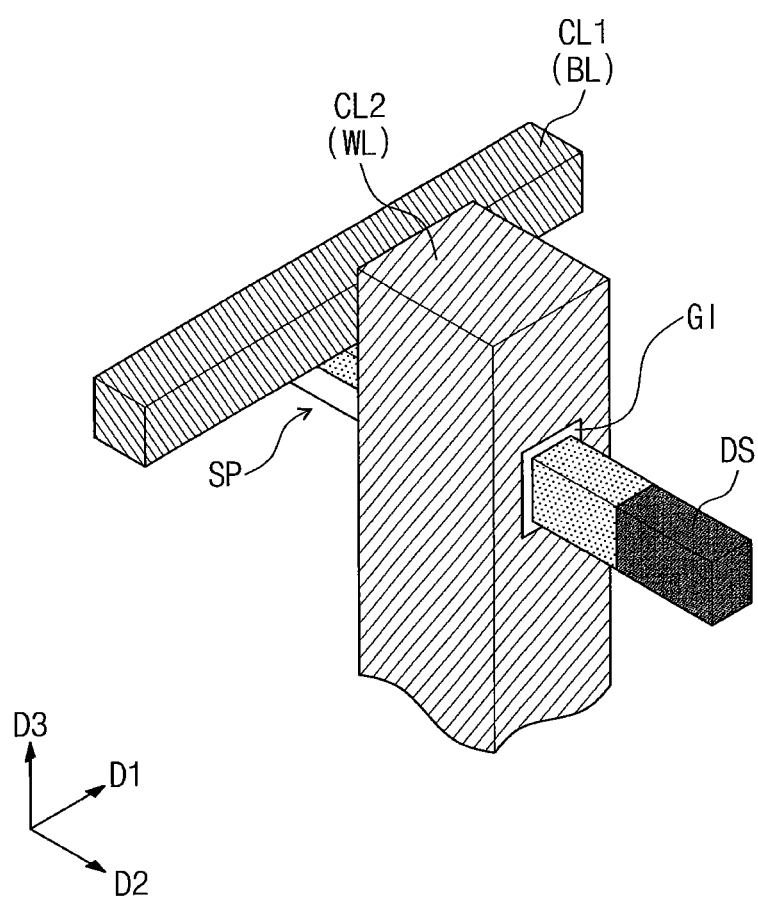

Referring to FIGS. 1, 2, and 8, the second conductive line CL2 may vertically extend while surrounding portions of the channel region CH of the semiconductor pattern SP. The second conductive line CL2 may be on a top surface, a bottom surface, and opposite sidewalls of the channel region CH. The gate dielectric layer GI may be interposed between the second conductive line CL2 and the channel region CH. For example, the memory cell transistor MCT may be a gate-all-around transistor.

Figure 9:
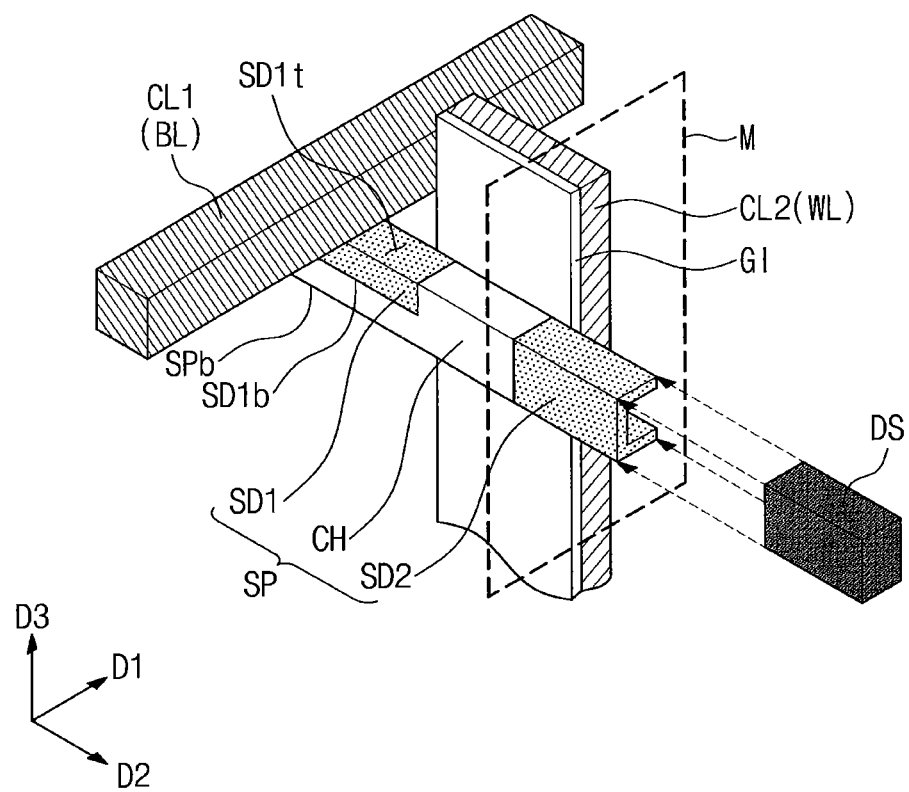
Figure 10A:
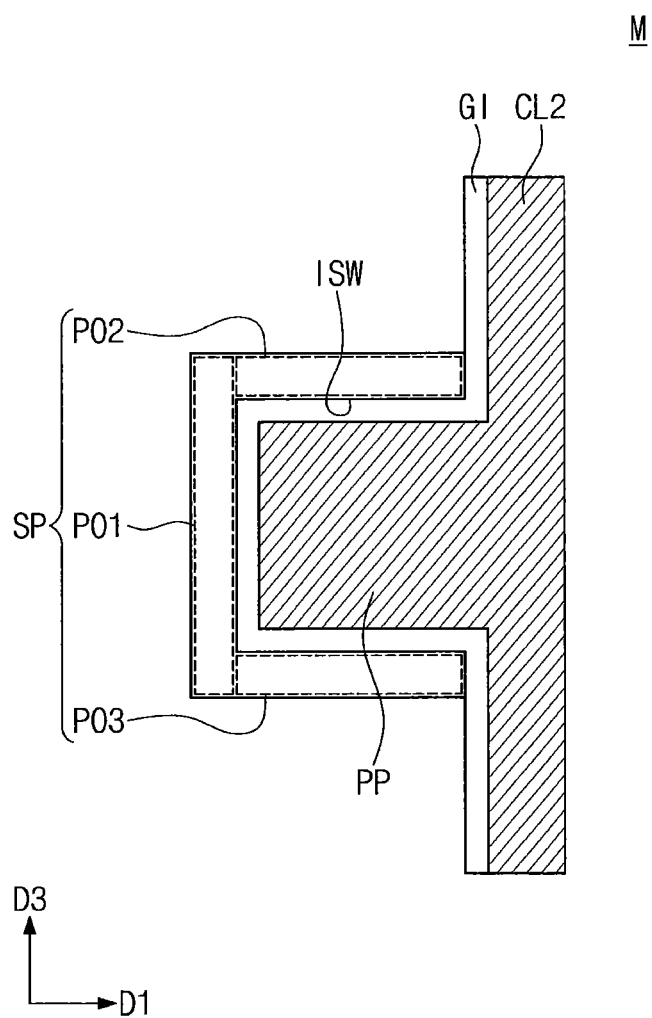
FIGS. 10A and 10B illustrate cross-sectional views showing examples of section M shown in FIG. 9.
Figure 10B:
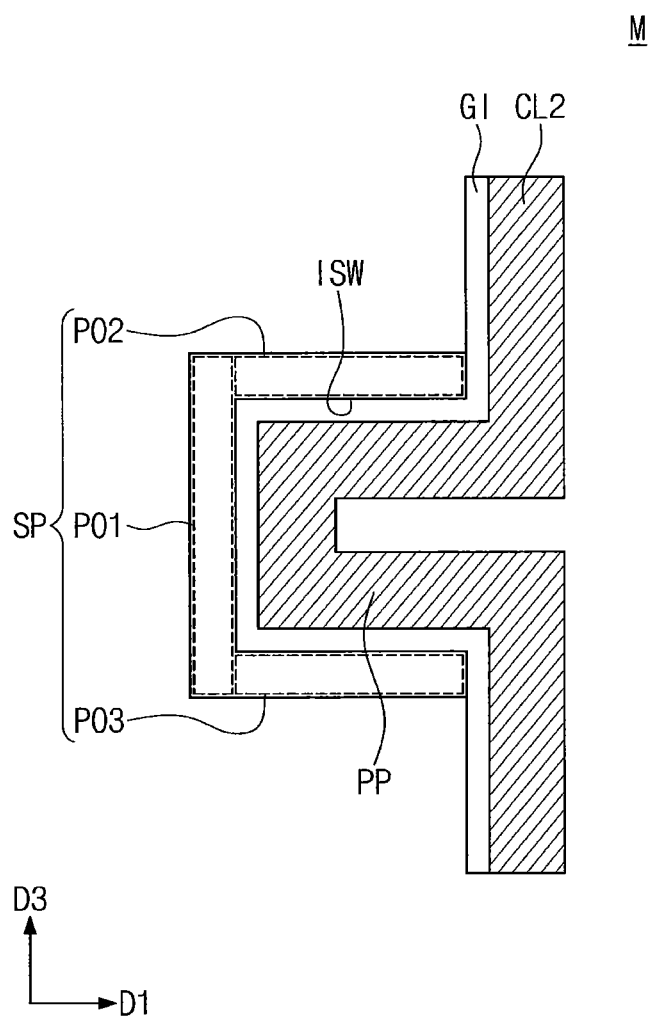

FIGS. 10A and 10B illustrate cross-sectional views showing examples of section M shown in FIG. 9. Referring to FIGS. 1, 2, 9, and 10A, the semiconductor pattern SP may have a U-shaped cross-section. For example, the semiconductor pattern SP may include a first part PO1 extending in the third direction D3, a second part PO2 extending in the first direction D1 from an upper portion of the first part PO1, and a third part PO3 extending in the first direction D1 from a lower portion of the first part PO1. The first, second, and third parts PO1, PO2, and PO3 may define an inner sidewall ISW of the semiconductor pattern SP.

The gate dielectric layer GI may be on, and, in some embodiments, directly contact, the inner sidewall ISW of the semiconductor pattern SP. The second conductive line CL2 may be provided on the gate dielectric layer GI. The second conductive lines CL2 may include a protrusion part PP. The first, second, and third parts PO1, PO2, and PO3 may define an interior region of the semiconductor pattern SP, and the protrusion part PP of the second conductive line CL2 may be within, and, in some embodiments, fill, the interior region of the semiconductor pattern SP.

The channel region CH of the memory cell transistor MCT may include the first to third parts PO1 to PO3 of the semiconductor pattern SP that are adjacent to the second conductive line CL2. In this configuration, a channel may decrease in thickness and increase in area facing a gate, such that the memory cell transistor MCT may increase in electrical characteristics.

Referring to FIGS. 1, 2, 9, and 10B, unlike that illustrated in FIG. 10A, the second conductive line CL2 may not completely fill the interior region of the semiconductor pattern SP. In other words, a portion of the interior region of the semiconductor patter SP may include an area not occupied by the second conductive line CL2. In some embodiments, as illustrated in FIG. 8, the second conductive line CL2 may completely surround the channel region CH. Although not shown, the second conductive line CL2 may cover the inner sidewall ISW and an outer sidewall of the semiconductor pattern SP. For example, the memory cell transistor MCT may be achieved as a gate-all-around transistor.

Figure 11:
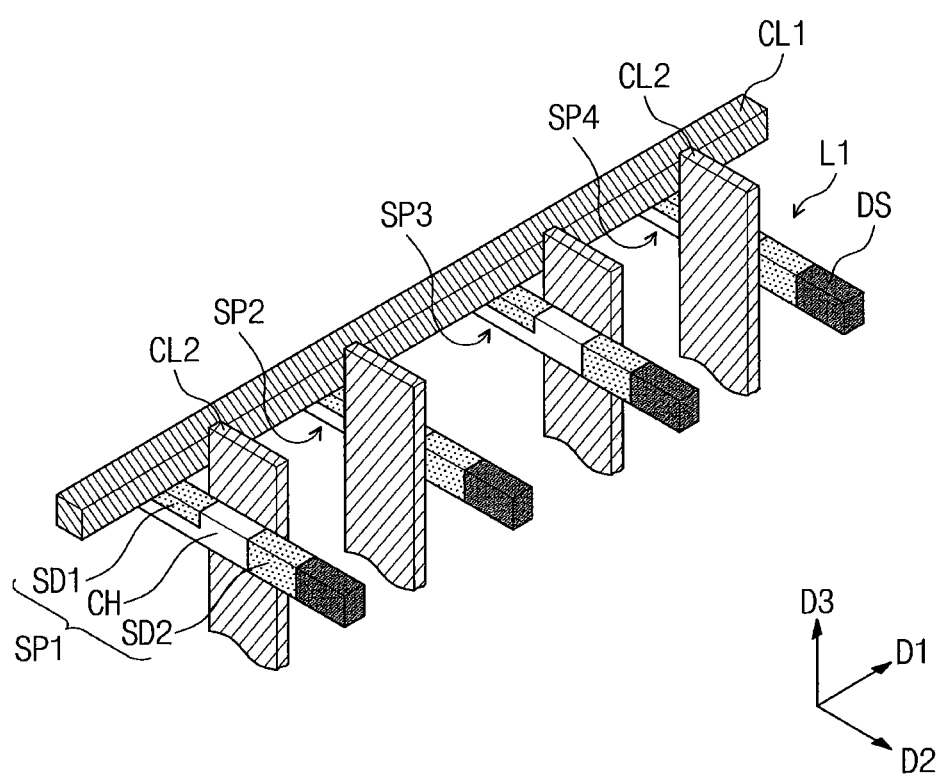
FIG. 11 illustrates a perspective view showing a three-dimensional semiconductor memory device according to some embodiments of the inventive concepts.

FIG. 11 illustrates a perspective view showing a three-dimensional semiconductor memory device according to some embodiments of the inventive concepts. For example, FIG. 11 illustrates a first layer of a three-dimensional semiconductor memory device. In the embodiment that follows, a detailed description of technical features repetitive to those discussed above with reference to FIGS. 1, 2, and 3 will be omitted, and a difference thereof will be discussed in detail.

Referring to FIGS. 2 and 11, the semiconductor patterns SP of the first layer L1 of the stack structure SS may include first, second, third, and fourth semiconductor patterns SP1, SP2, SP3, and SP4. The first to fourth semiconductor patterns SP1 to SP4 may be arranged spaced apart from each other in the first direction D1. A pair of the second conductive lines CL2 may be provided between the first semiconductor pattern SP1 and the second semiconductor pattern SP2. Another pair of the second conductive lines CL2 may be provided between the third semiconductor pattern SP3 and the fourth semiconductor pattern SP4. In contrast, no second conductive line CL2 may be provided between the second semiconductor pattern SP2 and the third semiconductor pattern SP3.

The first semiconductor pattern SP1 and its nearest adjacent second conductive line CL2 may constitute a first structure. The second semiconductor pattern SP2 and its nearest adjacent second conductive line CL2 may constitute a second structure. The first structure and the second structure may be mirror-symmetric to each other about an imaginary plane that runs therebetween. In some embodiments, two objects are "mirror-symmetric" or have "mirror symmetry" if the two objects are symmetric about the imaginary plane that divides the two objects into two mutual mirror images.

The third semiconductor pattern SP3 and its nearest adjacent second conductive line CL2 may constitute a third structure. The fourth semiconductor pattern SP4 and its nearest adjacent second conductive line CL2 may constitute a fourth structure. The third structure and the fourth structure may be mirror-symmetric to each other about an imaginary plane that runs therebetween. The second structure and the third structure may also be mirror-symmetric to each other about an imaginary plane that runs therebetween. The first structure and the fourth structure may also be mirror-symmetric to each other about an imaginary plane that runs therebetween.

Figure 12:
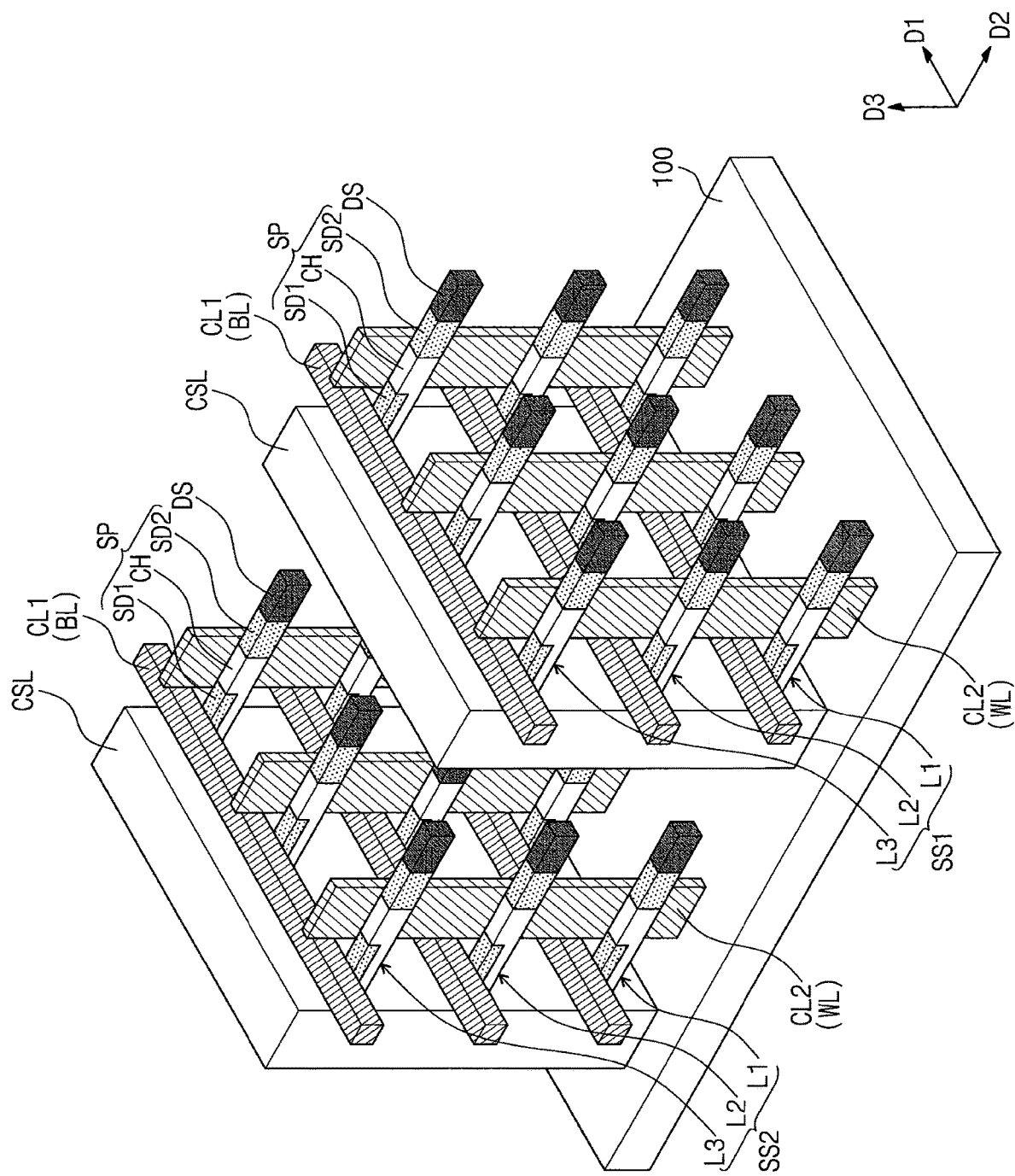
FIGS. 12 and 13 illustrate perspective views showing a three-dimensional semiconductor memory device according to some embodiments of the present inventive concept.
Figure 13:
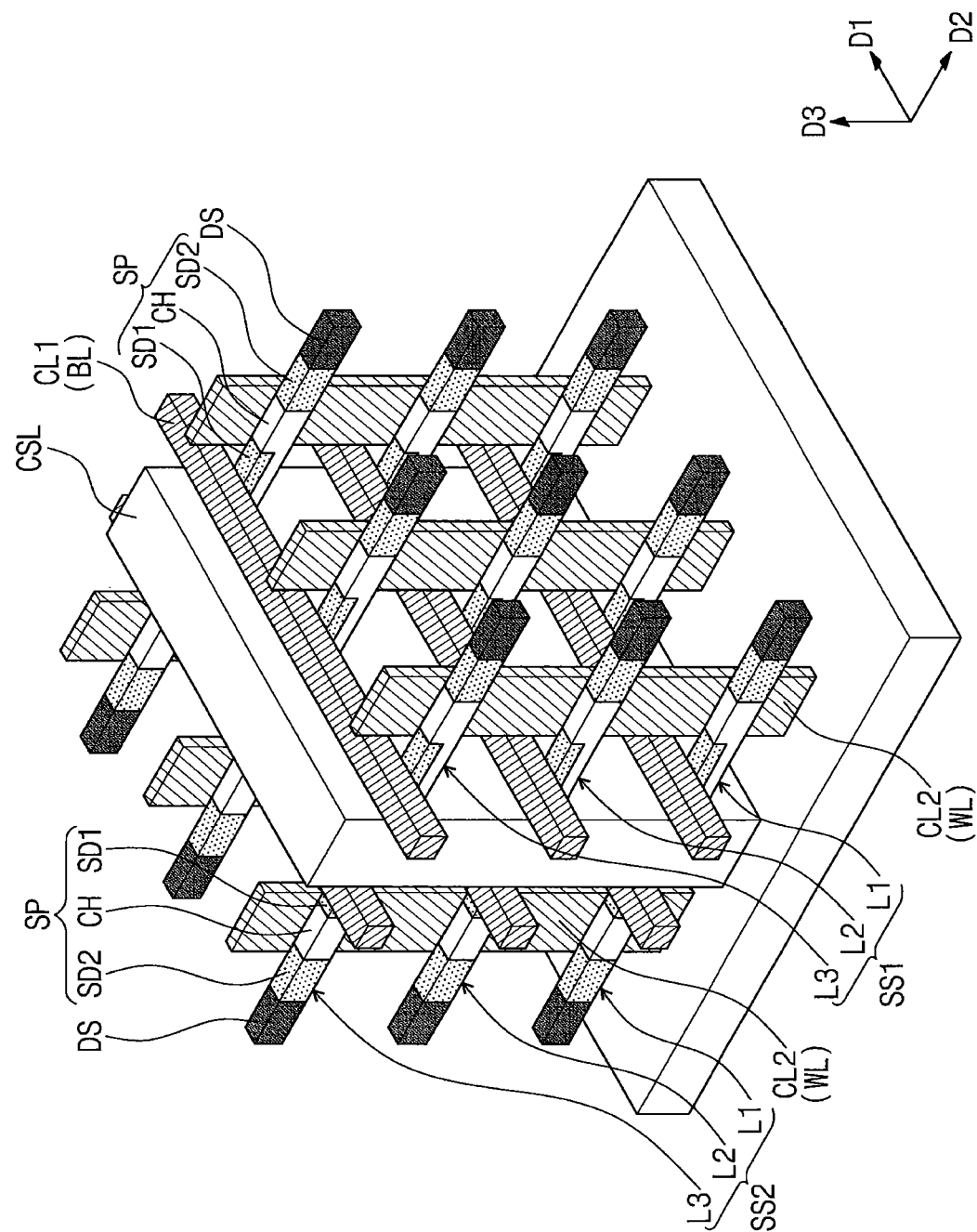

FIGS. 12 and 13 illustrate perspective views showing a three-dimensional semiconductor memory device according to some embodiments of the inventive concepts. In the embodiments that follow, a detailed description of technical features repetitive to those discussed above with reference to FIGS. 1, 2, and 3 will be omitted, and a difference thereof will be discussed in detail.

Referring to FIG. 12, two of a plurality of the sub cell arrays SCA discussed above with reference to FIG. 1 may be provided on the substrate 100. For example, a first stack structure SS1 and a second stack structure SS2 may be provided on the substrate 100. The first stack structure SS1 may constitute a first sub cell array, and the second stack structure SS2 may constitute a second sub cell array. The first structure SS1 and the second stack structure SS2 may be arranged along the second direction D2. The first stack structure SS1 and the second stack structure SS2 may have substantially the same structural features. For example, the first stack structure SS1 and the second stack structure SS2 may not be mirror-symmetric to each other.

Referring to FIG. 13, the first stack structure SS1 constituting the first sub cell array and the second stack structure SS2 constituting the second sub cell array may be provided on the substrate 100. One common source line CSL may be interposed between the first stack structure SS1 and the second stack structure SS2. The semiconductor patterns SP of the first stack structure SS1 and the semiconductor patterns SP of the second stack structure SS2 may all be connected to the common source line CSL.

The first stack structure SS1 and the second stack structure SS2 may be mirror-symmetric to each other about an imaginary plane that runs therebetween. The imaginary plane may extend in the first direction D1. For example, the first stack structure SS1 and the second stack structure SS2 may be mirror-symmetric to each other about the common source line CSL.

Figure 14:
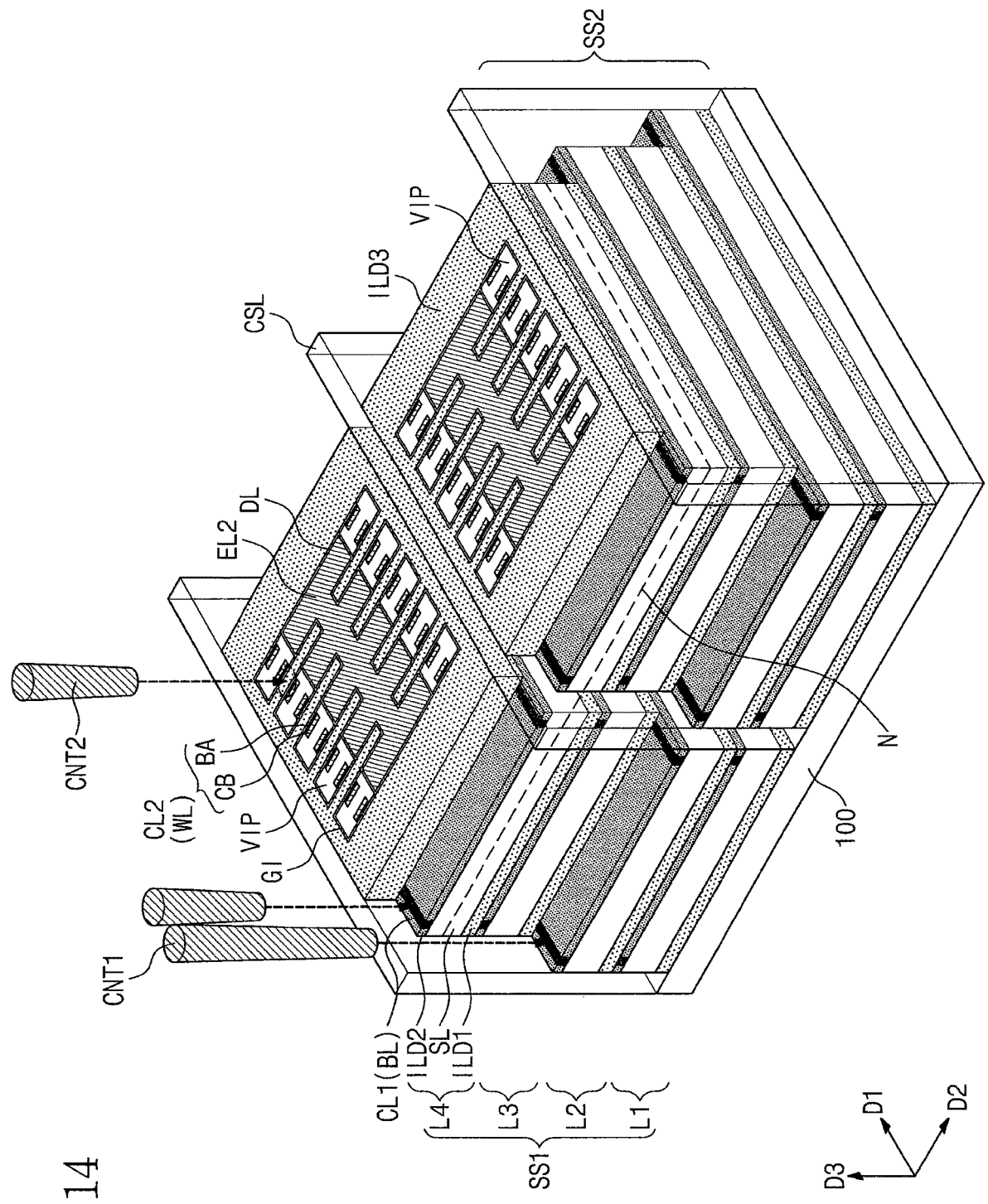
FIG. 14 illustrates a perspective view showing a three-dimensional semiconductor memory device according to some embodiments of the inventive concepts.
Figure 15:
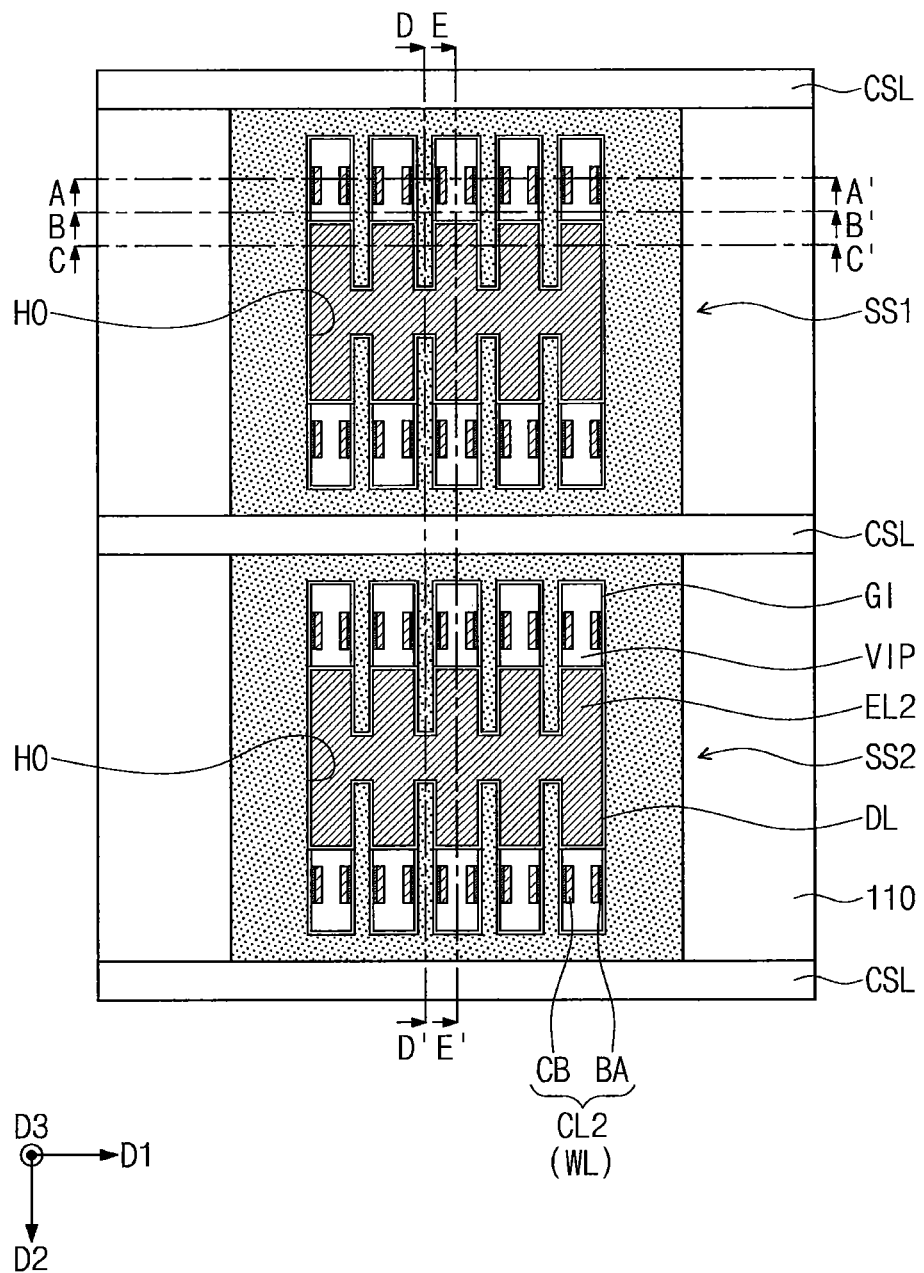
FIG. 15 illustrates a plan view showing the three-dimensional semiconductor memory device of FIG. 14.
Figure 16A:
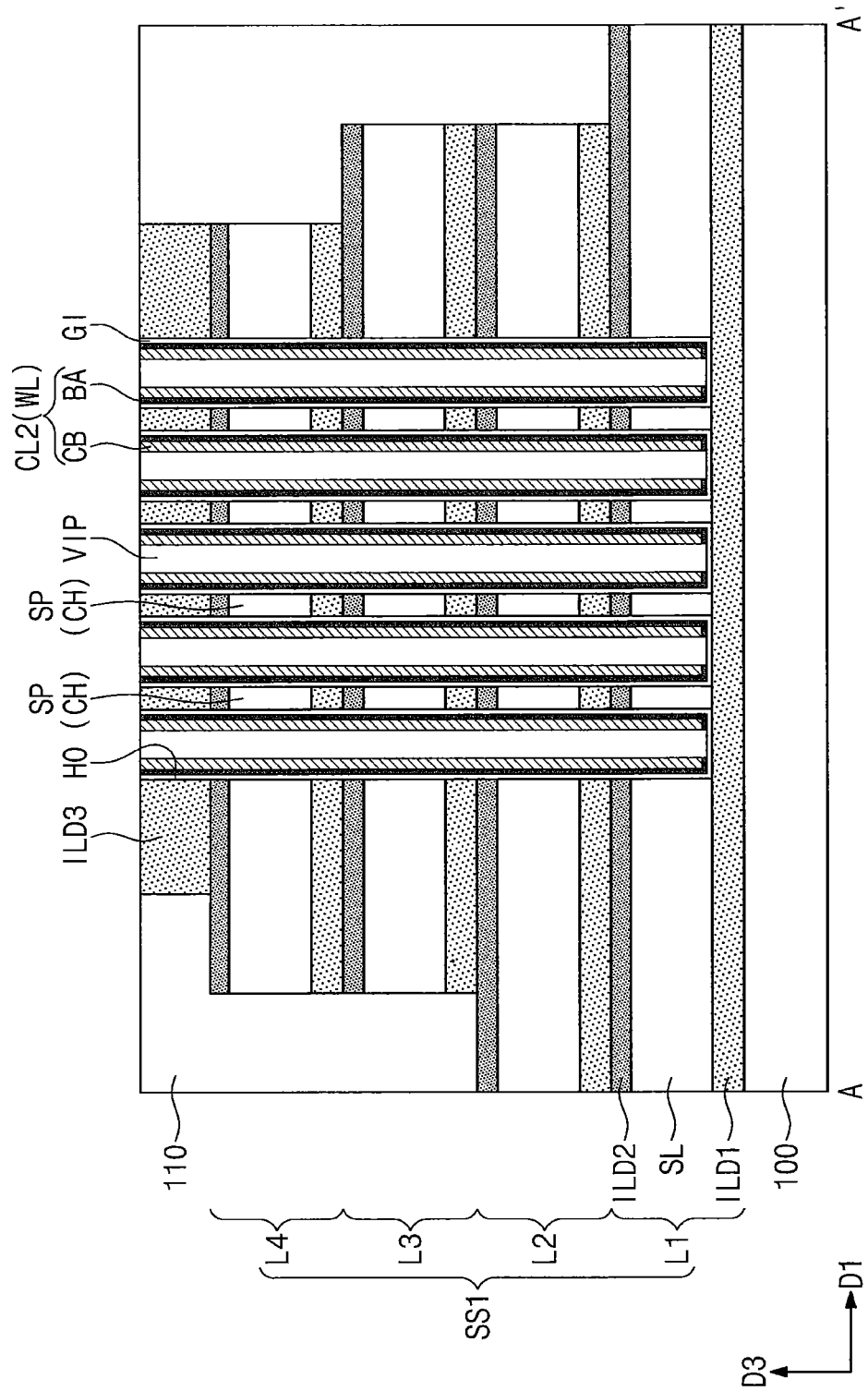
FIGS. 16A to 16E illustrate cross-sectional views respectively taken along lines A-A', B-B', C-C', D-D', and E-E' of FIG. 15.
Figure 16B:
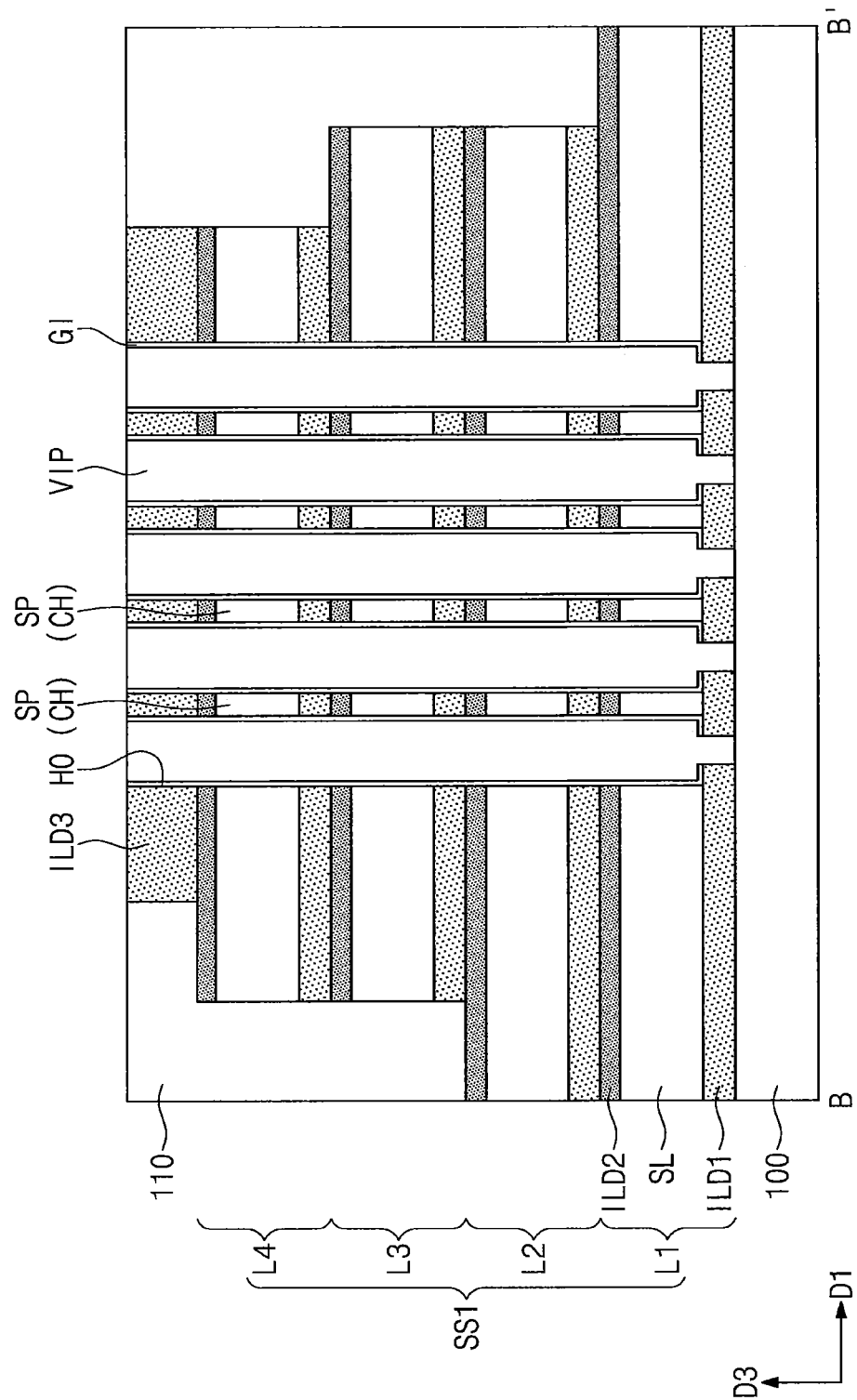
Figure 16C:
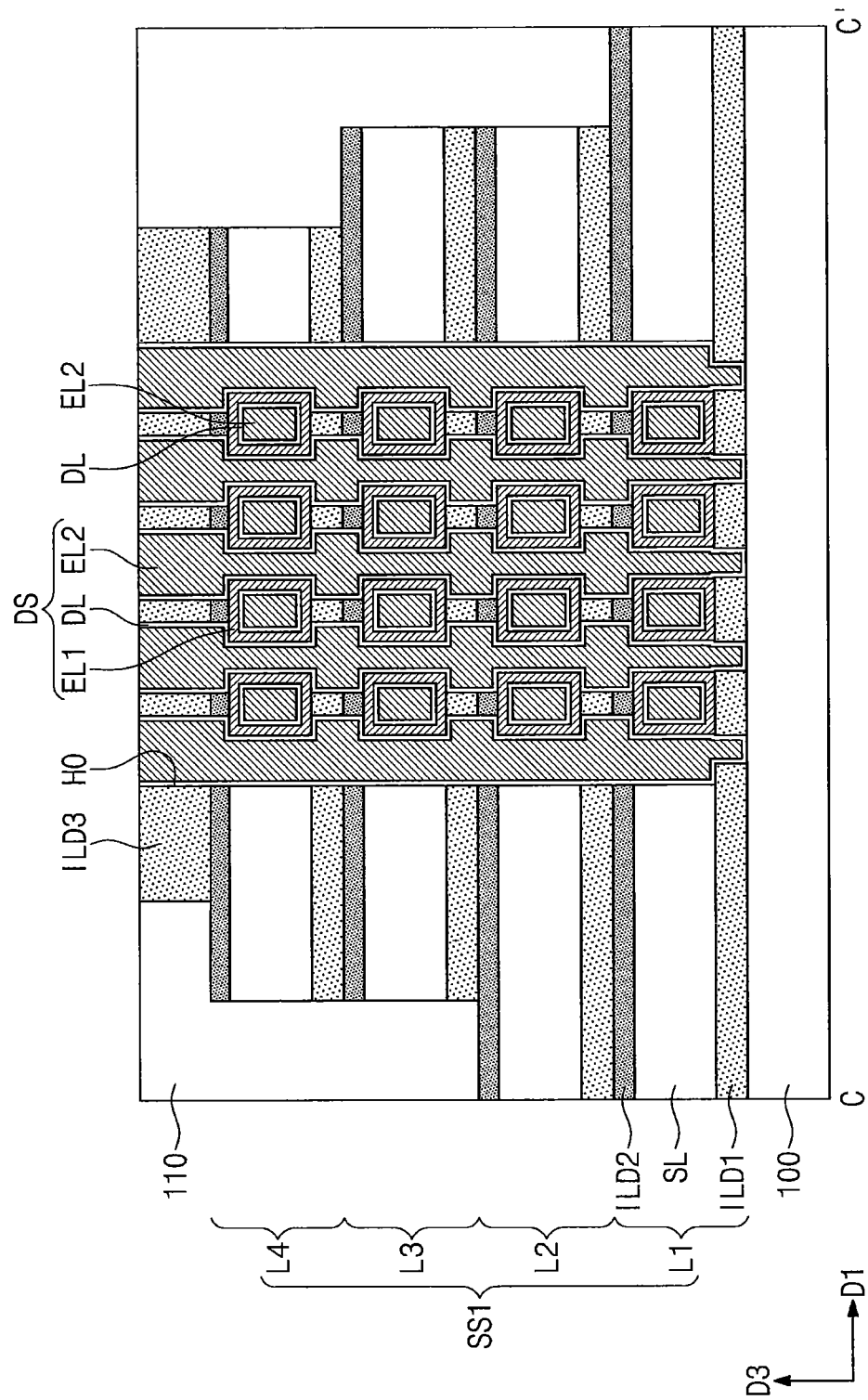
Figure 16D:
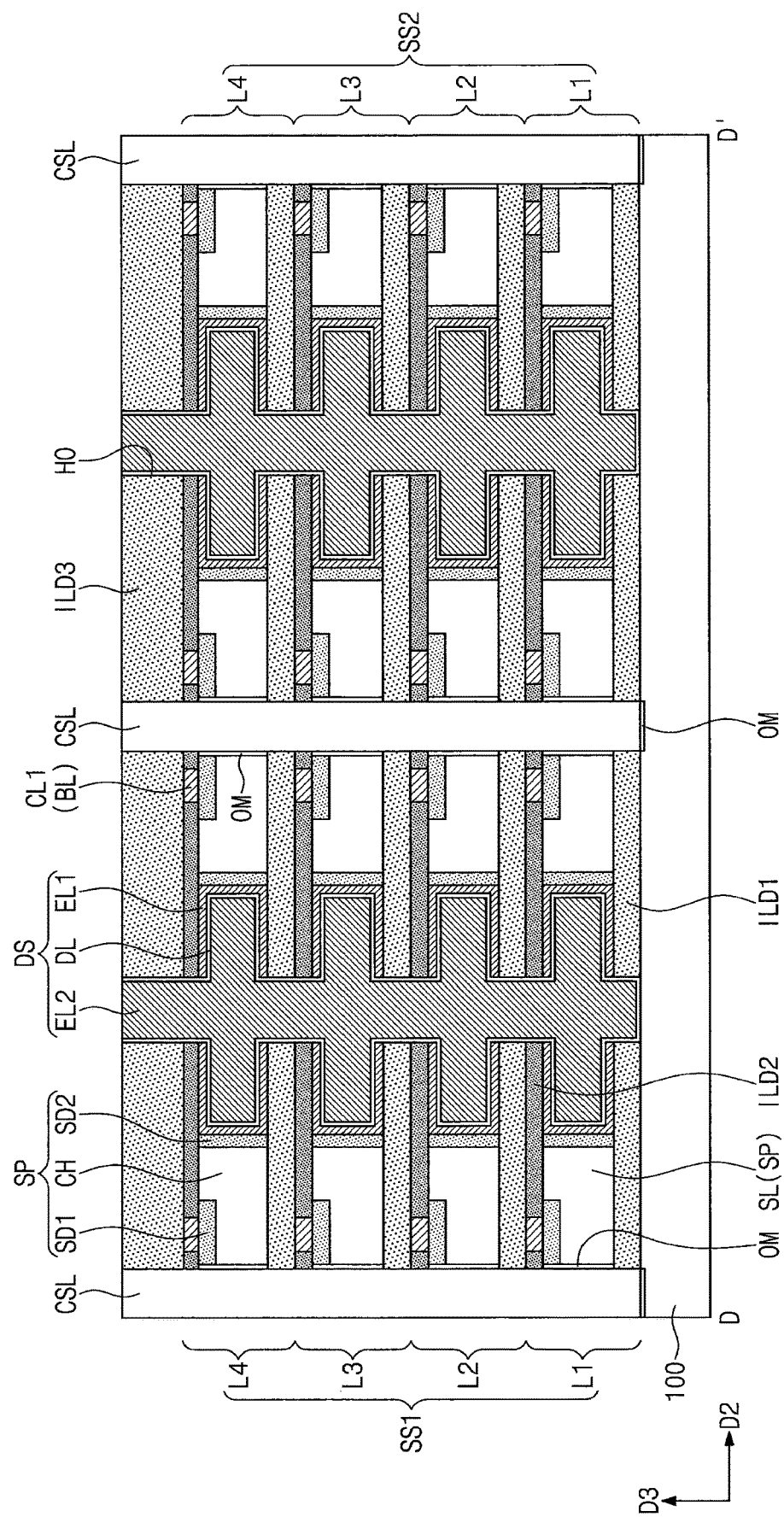
Figure 16E:
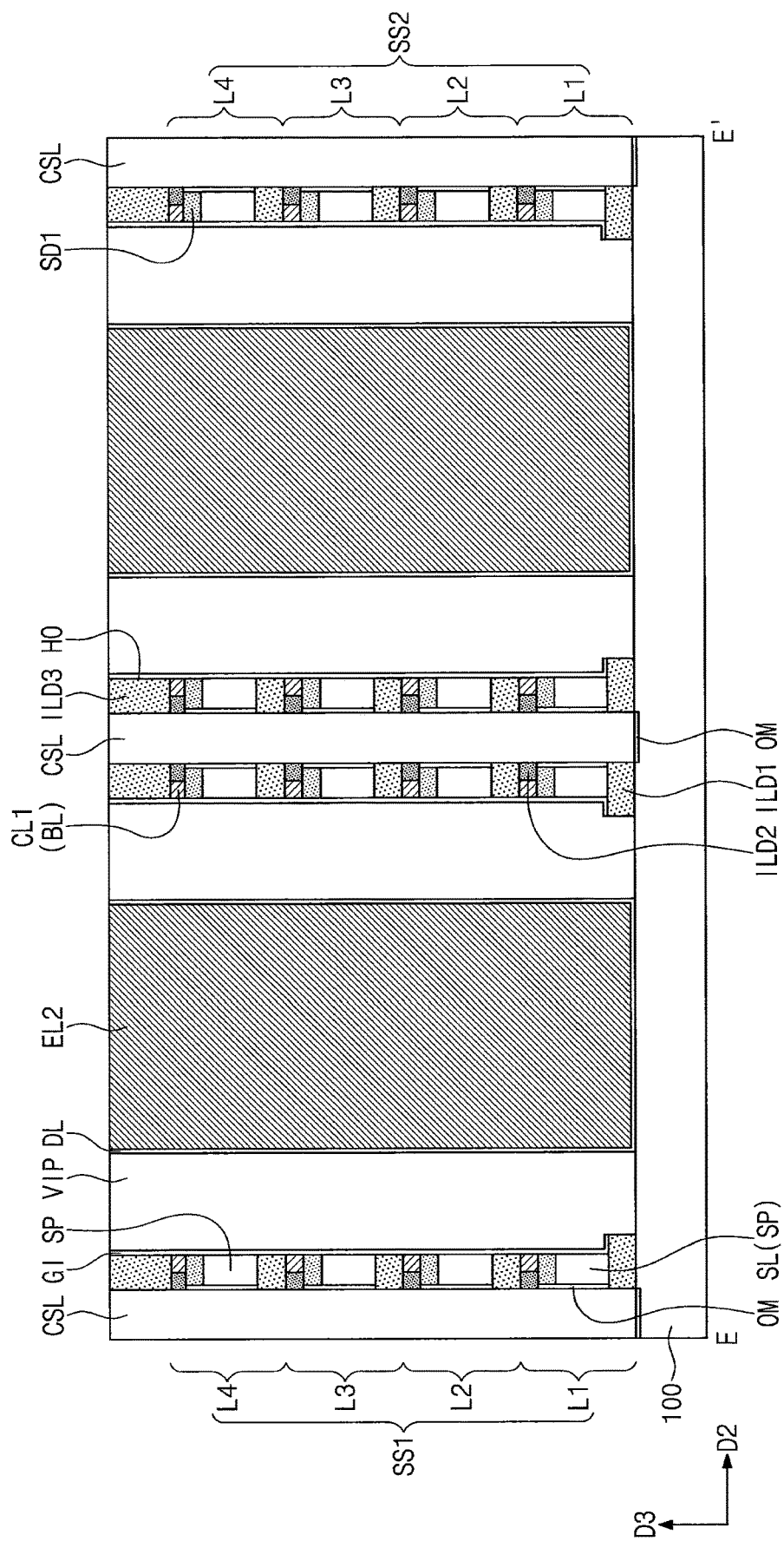
Figure 17:
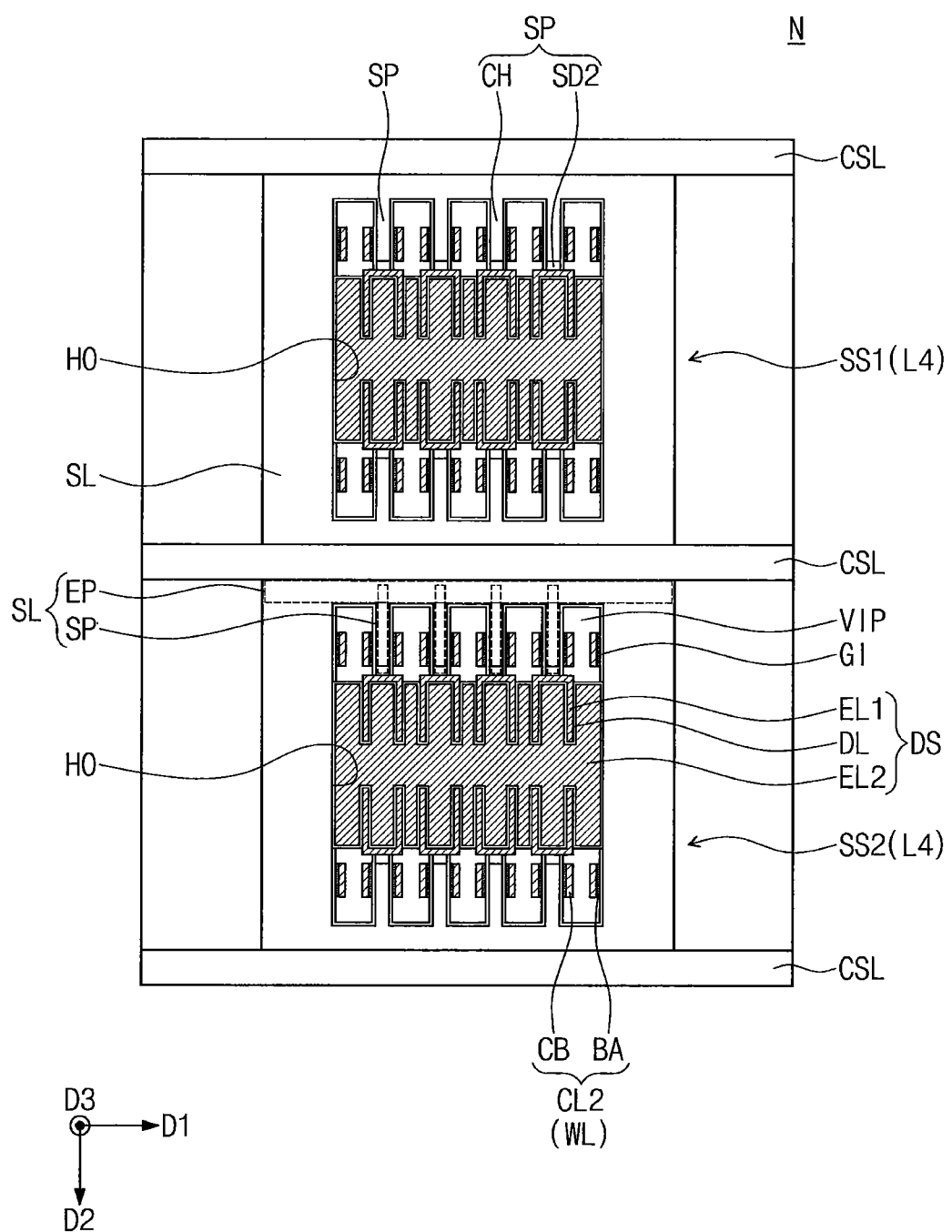
FIG. 17 illustrates a plan view showing a horizontal cross-section taken along section N of FIG. 14.

FIG. 14 illustrates a perspective view showing a three-dimensional semiconductor memory device according to some embodiments of the inventive concepts. FIG. 15 illustrates a plan view showing the three-dimensional semiconductor memory device of FIG. 14. FIGS. 16A to 16E illustrate cross-sectional views respectively taken along lines A-A', B-B', C-C', D-D', and E-E' of FIG. 15. FIG. 17 illustrates a plan view showing a horizontal cross-section taken along section N of FIG. 14. In the embodiment that follows, a detailed description of technical features repetitive to those formerly discussed with reference to FIGS. 1, 2, and 3 will be omitted, and a difference thereof will be discussed in detail.

Referring to FIGS. 14, 15, 16A to 16E, and 17, a plurality of stack structures SS1 and SS2 may be provided on a substrate 100. The stack structures SS1 and SS2 may include a first stack structure SS1 and a second stack structure SS2. The first and second stack structures SS1 and SS2 may extend in a first direction D1. The first and second stack structures SS1 and SS2 may be arranged spaced apart from each other in a second direction D2.

Each of the first and second stack structures SS1 and SS2 may be provided with common source lines CSL on opposing sides. One common source line CSL may be interposed between the first and second stack structures SS1 and SS2. The common source lines CSL may extend in the first direction D1 along the first and second stack structures SS1 and SS2. An oxidation material OM may be interposed between the common source line CSL and the substrate 100 and between the common source line CSL and a semiconductor pattern SP which will be discussed below.

Each of the first and second stack structures SS1 and SS2 may include first, second, third, and fourth layers L1, L2, L3, and L4 that are sequentially stacked on the substrate 100. Each of the first to fourth layers L1 to L4 may include a first dielectric layer ILD1, a semiconductor layer SL, and a second dielectric layer ILD2. The first dielectric layer ILD1, the semiconductor layer SL, and the second dielectric layer ILD2 may be sequentially stacked. The first dielectric layer ILD1 and the second dielectric layer ILD2 may vertically separate the semiconductor layer SL therebetween from other semiconductor layers SL.

Each of the first to fourth layers L1 to L4 may further include a first conductive line CL1 extending in the first direction D1. For example, each of the first to fourth layers L1 to L4 may include two first conductive lines CL1 spaced apart from each other in the second direction D2. The first conductive line CL1 may be located at the same level as that of the second dielectric layer ILD2. The second dielectric layer ILD2 may cover sidewalls of the first conductive line CL1. The first conductive line CL1 may be disposed on a top surface of the semiconductor layer SL. The first conductive line CL1 may be disposed adjacent to the common source line CSL. The first conductive lines CL1 may correspond to the bit lines BL discussed above with reference to FIG. 1.

The semiconductor layer SL may include a semiconductor material, for example, silicon, germanium, silicon-germanium, and/or indium gallium zinc oxide (IGZO). The first dielectric layer ILD1 and the second dielectric layer ILD2 may include different insulating materials from each other. The first dielectric layer ILD1 and the second dielectric layer ILD2 may include, for example, a silicon oxide layer, a silicon nitride layer, a silicon oxynitride layer, a carbon-containing silicon oxide layer, a carbon-containing silicon nitride layer, and/or a carbon-containing silicon oxynitride layer. For example, the first dielectric layer ILD1 may include a carbon-containing silicon oxide layer (e.g., SiOC), and the second dielectric layer ILD2 may include a silicon nitride layer (e.g., SiN).

Each of the first to fourth layers L1 to L4 may have a first end and a second end opposite to the first end in a direction in which the first to fourth layers L1 to L4 extend (e.g., the first direction D1). Each of the first and second stack structures SS1 and SS2 may be configured such that the first end of each of the second and third layers L2 and L3 may protrude more in the first direction D1 than the first end of the fourth layer L4. The first end of the second layer L2 and the first end of the third layer L3 may be vertically aligned with each other. The first end of the first layer L1 may protrude more in the first direction D1 than the first end of each of the second and third layers L2 and L3. The second end of each of the first and second layers L1 and L2 may protrude more in an opposite direction to the first direction D1 than the second end of each of the third and fourth layers L3 and L4. The second end of the first layer L1 and the second end of the second layer L2 may be vertically aligned with each other. The second end of the third layer L3 and the second end of the fourth layer L4 may be vertically aligned with each other.

A hole HO may be provided to penetrate each of the first and second stack structures SS1 and SS2. Each of the semiconductor layers SL may include semiconductor patterns SP defined by the hole HO. For example, each of the semiconductor layers SL may include an extension part EP extending in the first direction D1 and the semiconductor patterns SP extending in the second direction D2 from the extension part EP (see FIG. 17). The hole HO may be positioned between the semiconductor patterns SP.

Each of the semiconductor patterns SP may include a channel region CH, a first impurity region SD1, and a second impurity region SD2. The channel region CH may be interposed between the first and second impurity regions SD1 and SD2. The extension part EP of each of the semiconductor layers SL may be electrically connected to the common source line CSL. The first conductive line CL1 may be disposed on the extension part EP of the semiconductor layer SL. The first conductive line CL1 may be disposed on the first impurity regions SD1 of the semiconductor patterns SP. In some embodiments, the semiconductor patterns SP of various layers (e.g., first to fourth layers L1 to L4) may vertically overlap one other.

Second conductive lines CL2 may be provided to extend in a vertical direction (e.g., a third direction D3) in the holes HO penetrating the stack structures SS1 and SS2. For example, the second conductive lines CL2 may penetrate the first and second stack structures SS1 and SS2. A pair of the second conductive lines CL2 may be provided on opposite sides of each of the semiconductor patterns SP. For example, a pair of the second conductive lines CL2 may constitute one word line WL. In some embodiments, one of a pair of the second conductive lines CL2 may be a word line WL, and the other of a pair of the second conductive lines CL2 may be a back gate.

Each of the second conductive lines CL2 may include a barrier pattern BA and a conductive body CB. The conductive body CB may have a linear shape extending in the third direction D3. The barrier pattern BA may be on, and, in some embodiments, cover, one sidewall and a bottom surface of the conductive body CB. The conductive body CB may include metal (e.g., tungsten, titanium, tantalum, etc.), and the barrier pattern BA may include conductive metal nitride (e.g., titanium nitride, tantalum nitride, etc.). The barrier pattern BA may inhibit and/or prevent a metallic material in the conductive body CB from diffusing into the semiconductor pattern SP.

A gate dielectric layer GI may be provided on an inner sidewall of each of the first and second stack structures SS1 and SS2 that is exposed to the hole HO. Accordingly, the gate dielectric layer GI may be interposed between each of the semiconductor patterns SP and each of the second conductive lines CL2. The barrier pattern BA of each of the second conductive lines CL2 may be in direct contact with the gate dielectric layer GI.

Each of the holes HO may be provided therein with vertical insulation patterns VIP on and, in some embodiments, covering, the second conductive lines CL2. The vertical insulation pattern VIP may be interposed between a pair of the second conductive lines CL2 adjacent to each other. The vertical insulation pattern VIP may be interposed between a pair of the semiconductor patterns SP adjacent to each other. In some embodiments, the vertical insulation pattern VIP may have a pillar shape extending in the third direction D3. For example, the vertical insulation patterns VIP may include one or more of a silicon oxide layer, a silicon nitride layer, and a silicon oxynitride layer.

Each of the holes HO may be provided therein with data storage elements DS. The data storage elements DS may be provided in a remaining portion of the hole HO. The remaining portion of the hole HO may indicate a space not occupied by the gate dielectric layer GI, the second conductive lines CL2, and the vertical insulation patterns VIP.

Each of the data storage elements DS may include a first electrode EL1, a dielectric layer DL, and a second electrode EL2. The data storage elements DS in one of the stack structures SS1 and SS2 may share one dielectric layer DL and one second electrode EL2. For example, in one of the stack structures SS1 and SS2, a plurality of the first electrodes EL1 may be provided, and one dielectric layer DL may cover surfaces of the plurality of first electrodes EL1. One dielectric layer DL may be provided thereon with one second electrode EL2.

The data storage elements DS may be connected to corresponding second impurity regions SD2 of the semiconductor patterns SP. For example, the first electrodes EL1 may be connected to corresponding second impurity regions SD2 of the semiconductor patterns SP. The data storage elements DS according to the some embodiments may be configured substantially identical or similar to the capacitor discussed above with reference to FIG. 4A or 4B. In some embodiments, a top surface of the second electrode EL2 may be exposed to the hole HO. In some embodiments, the top surface of the second electrode EL2 may be coplanar with a top surface of the hole HO.

An interlayer dielectric layer 110 may be provided to be on and/or cover the first and second stack structures SS1 and SS2. For example, the interlayer dielectric layer 110 may include one or more of a silicon oxide layer, a silicon nitride layer, and/or a silicon oxynitride layer. A third dielectric layer ILD3 may be provided on each of the first and second stack structures SS1 and SS2. In some embodiments, the interlayer dielectric layer 110, the third dielectric layers ILD3, the second conductive lines CL2, the second electrodes EL2, and the common source lines CSL may have their top surfaces coplanar with each other.

At least one first contact CNT1 may be provided to penetrate the interlayer dielectric layer 110 to come into connection with at least one first conductive line CL1. At least one second contact CNT2 may be provided to penetrate the interlayer dielectric layer 110 to come into connection with at least one second conductive line CL2. The first contact CNT1 may be disposed on the first conductive line CL1 exposed at an end (e.g., first or second end) of one of the stack structures SS1 and SS2. The second contact CNT2 may be disposed on the second conductive line CL2 exposed at a top surface of one of the stack structures SS1 and SS2.

In some embodiments, the first stack structure SS1 and the second stack structure SS2 may be mirror-symmetric to each other about an imaginary plane that runs therebetween. The imaginary plane may extend in the first direction D1. For example, the first stack structure SS1 and the second stack structure SS2 may be mirror-symmetric to each other about the common source line CSL.

Figure 31A:
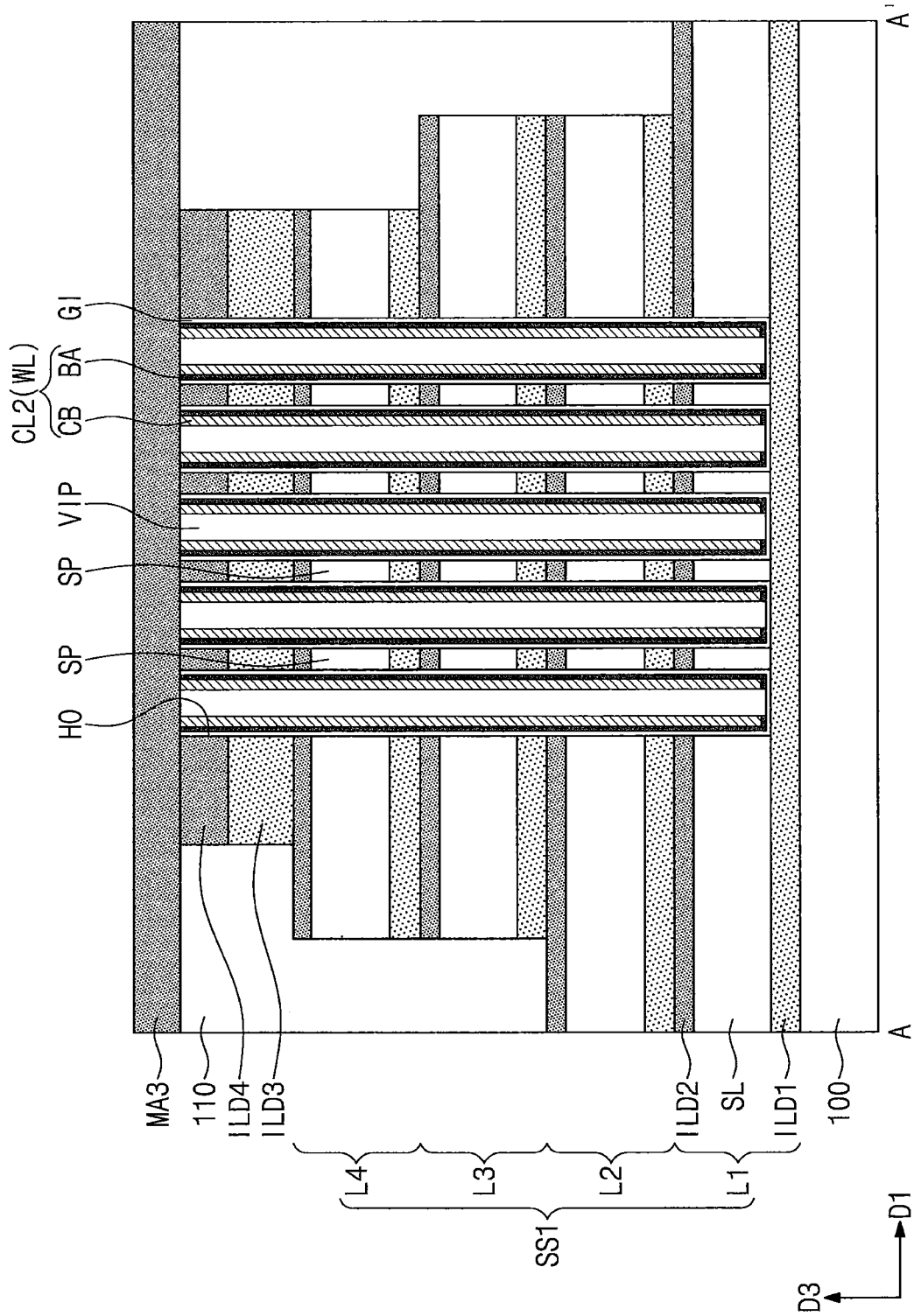
Figure 31B:
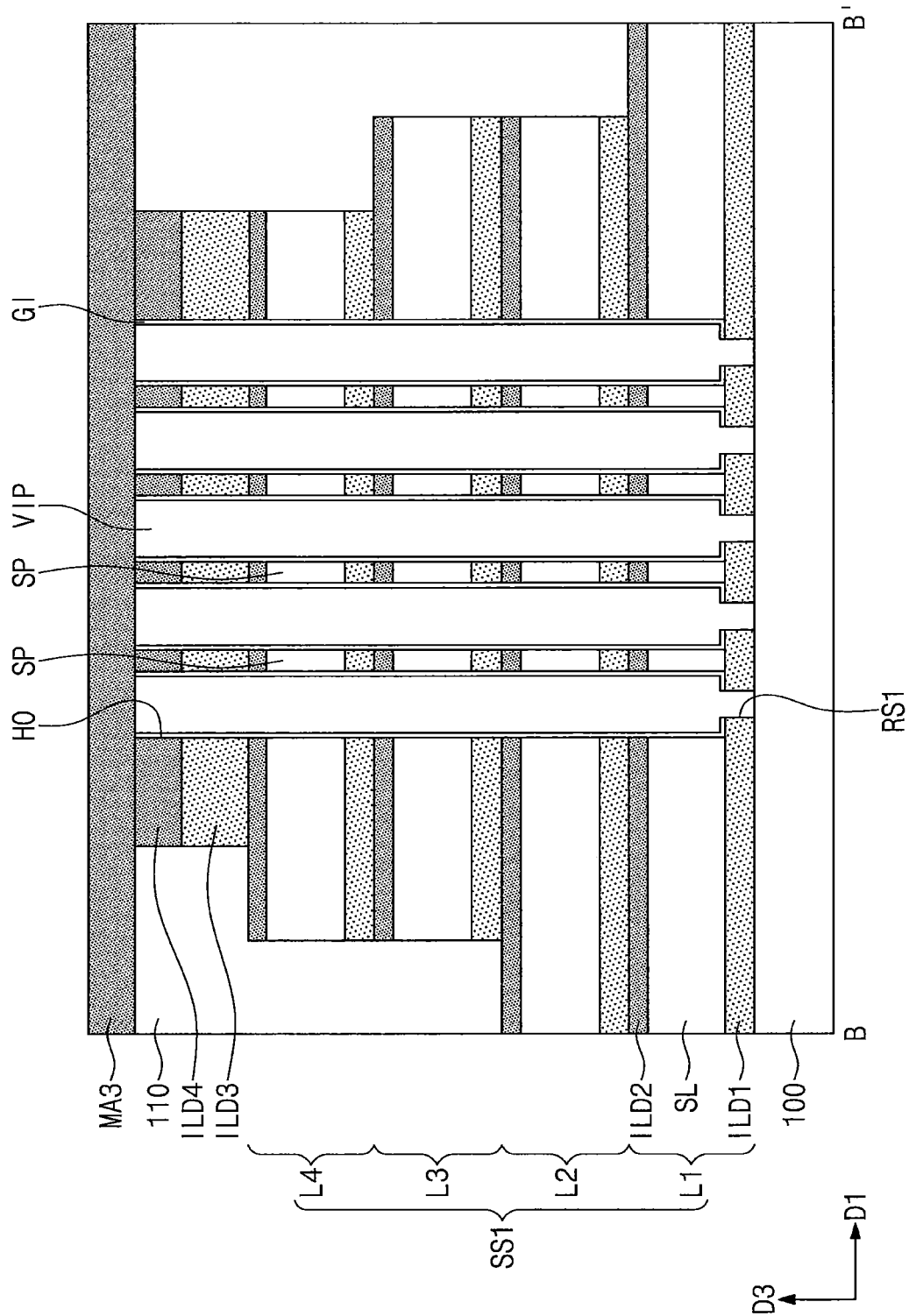
Figure 31C:
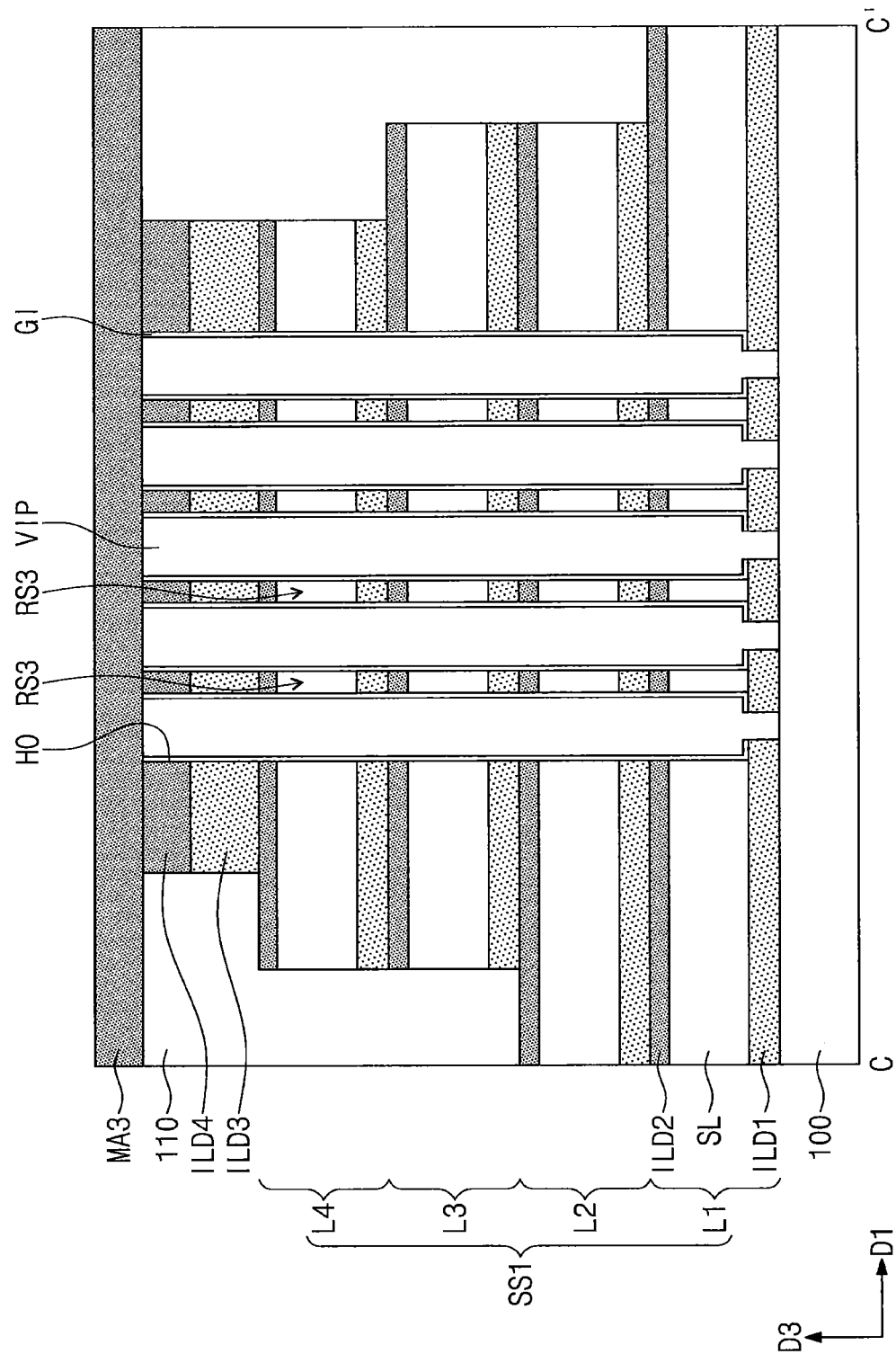
Figure 31D:
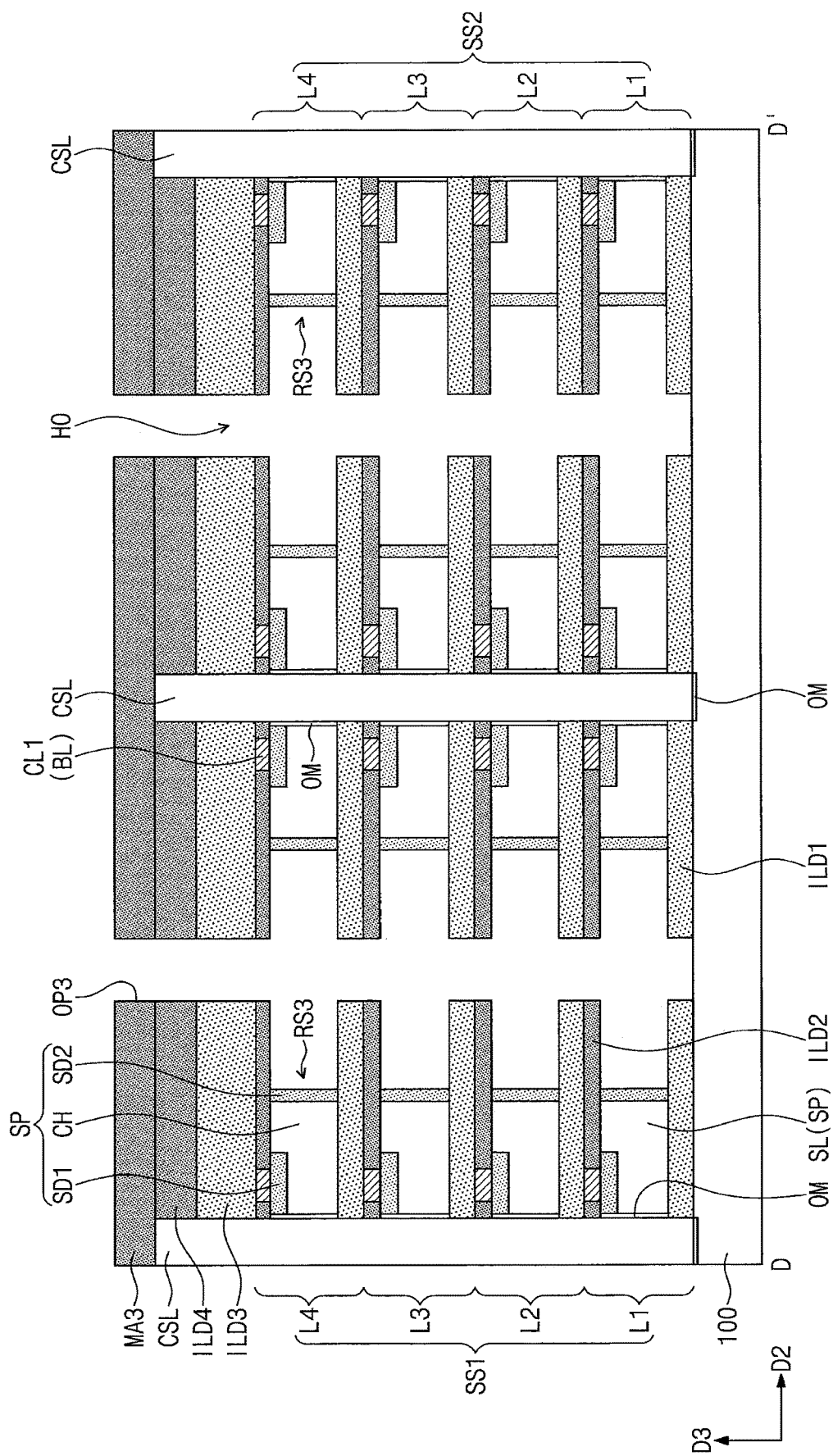
Figure 31E:
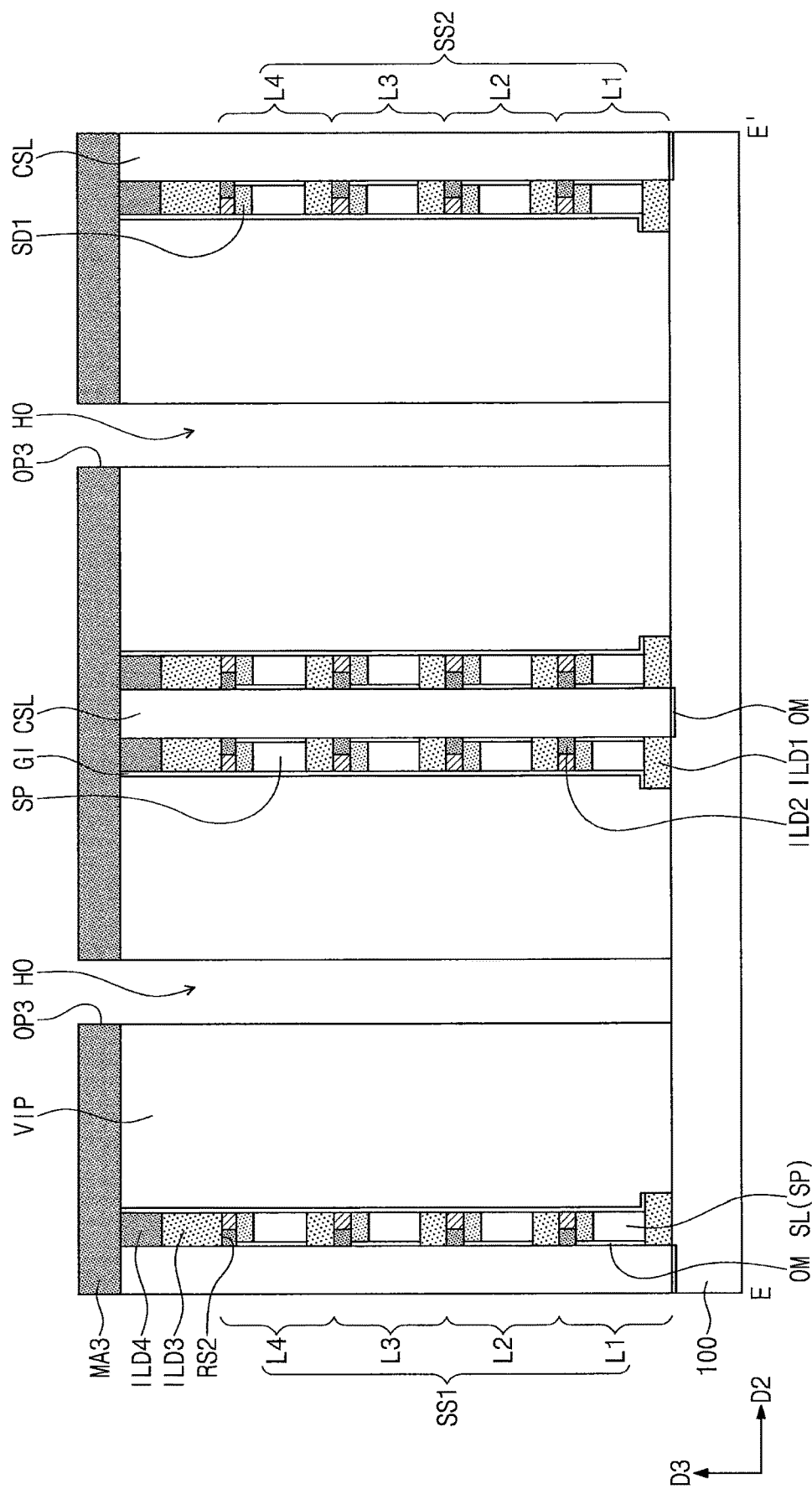
FIGS. 31E, 33E, and 35E illustrate cross-sectional views taken along line E-E' of FIGS. 30, 32, and 34, respectively.
Figure 32:
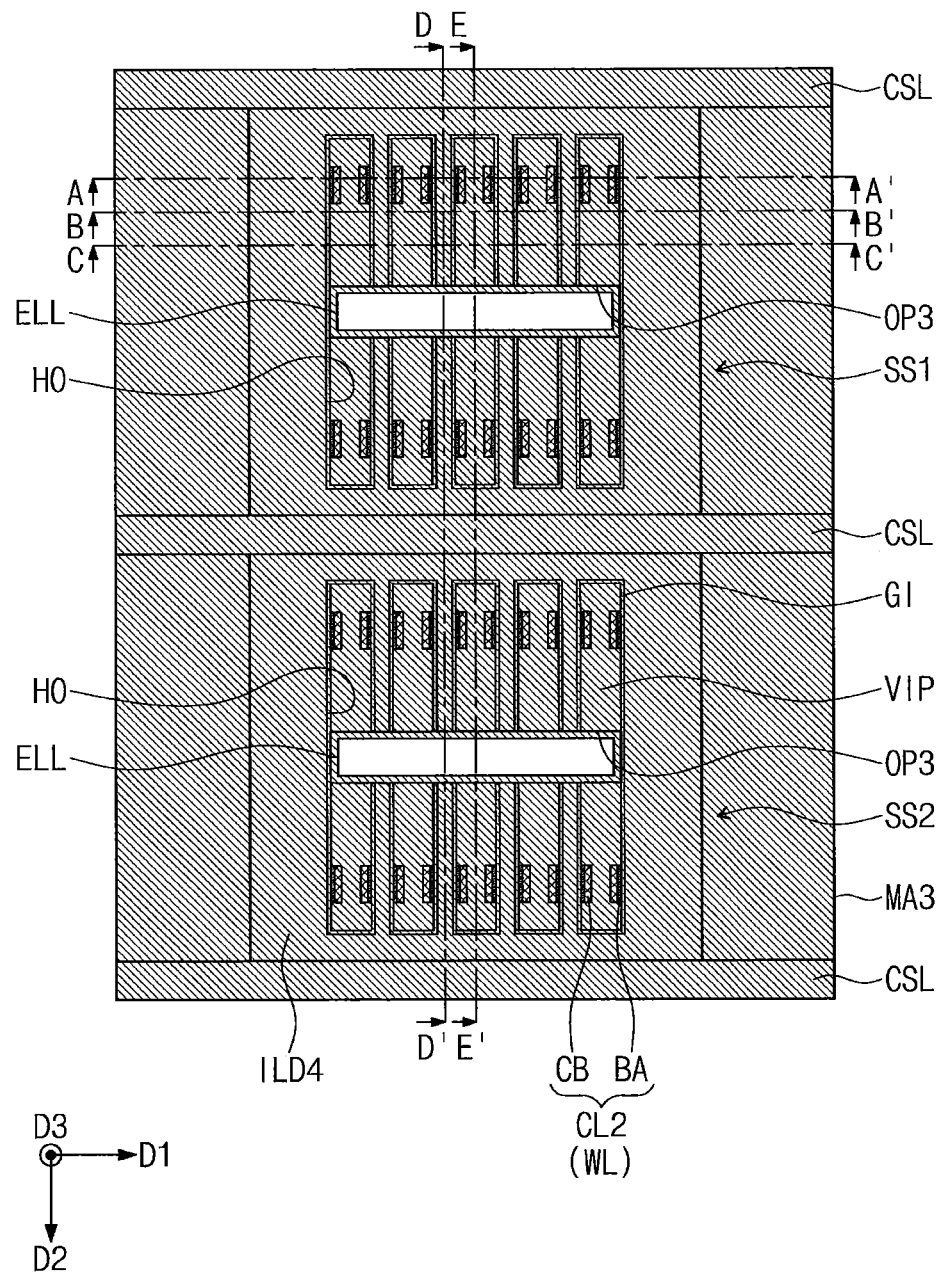
Figure 33B:
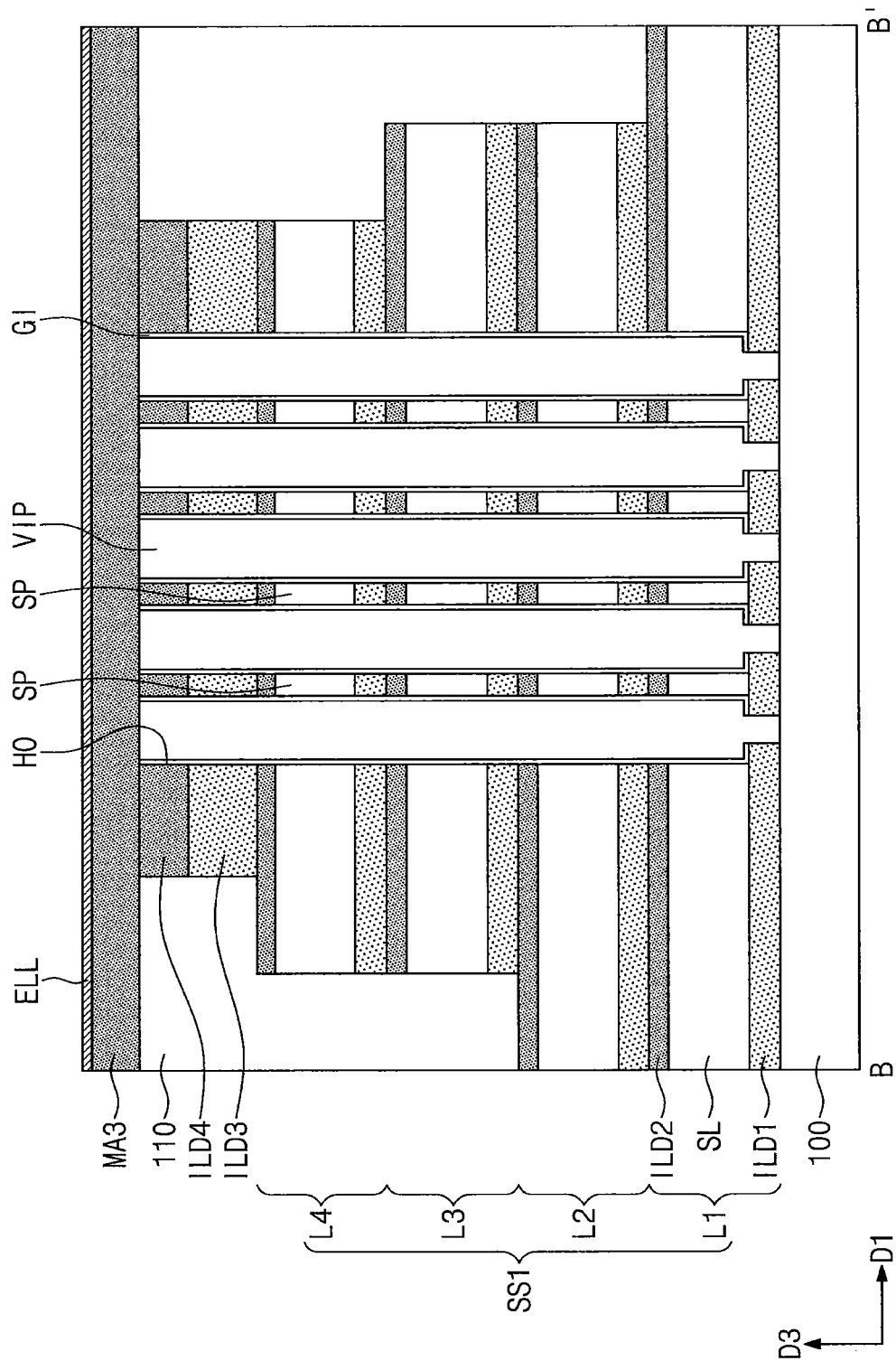
Figure 33C:
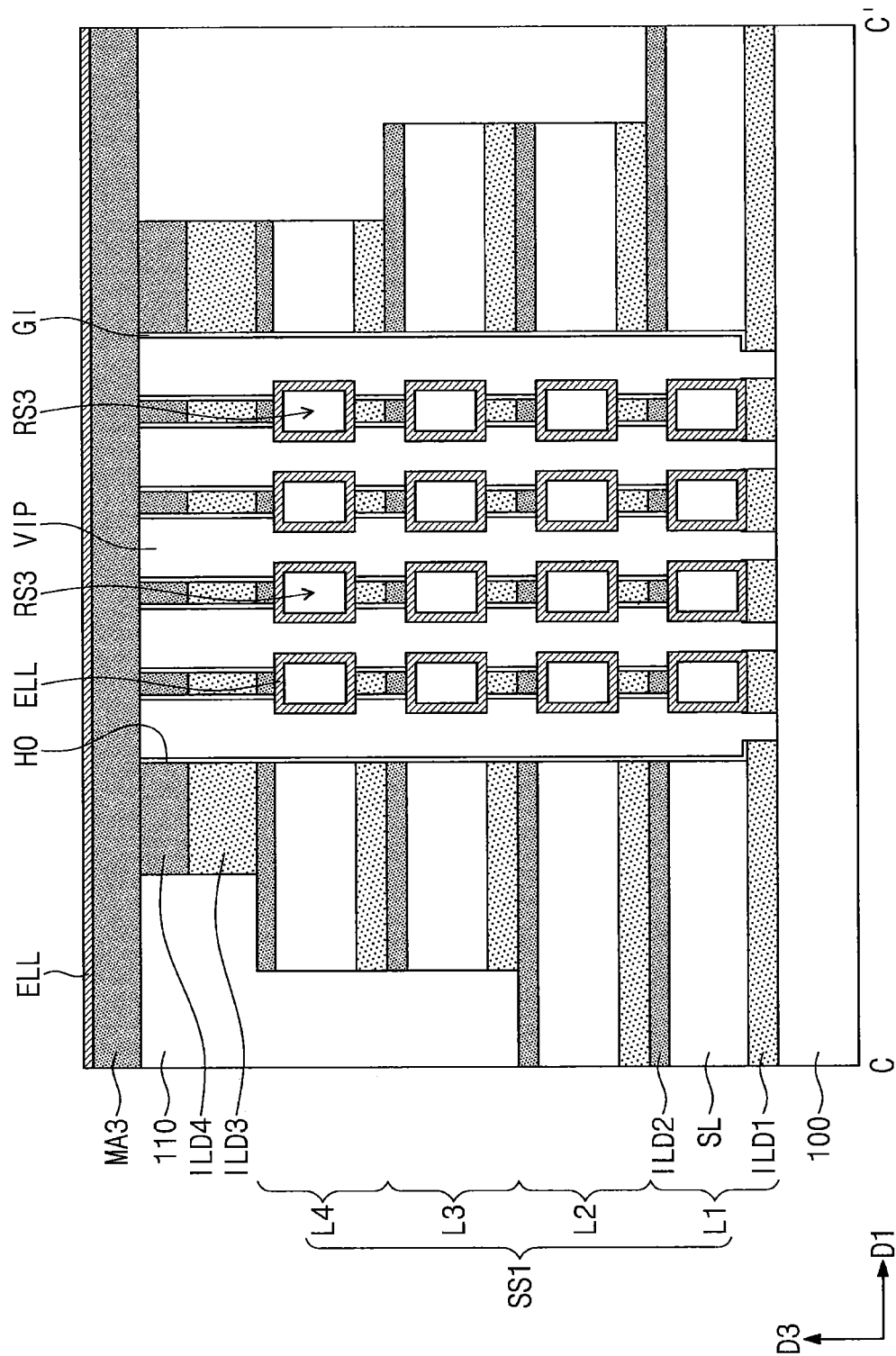
Figure 33D:
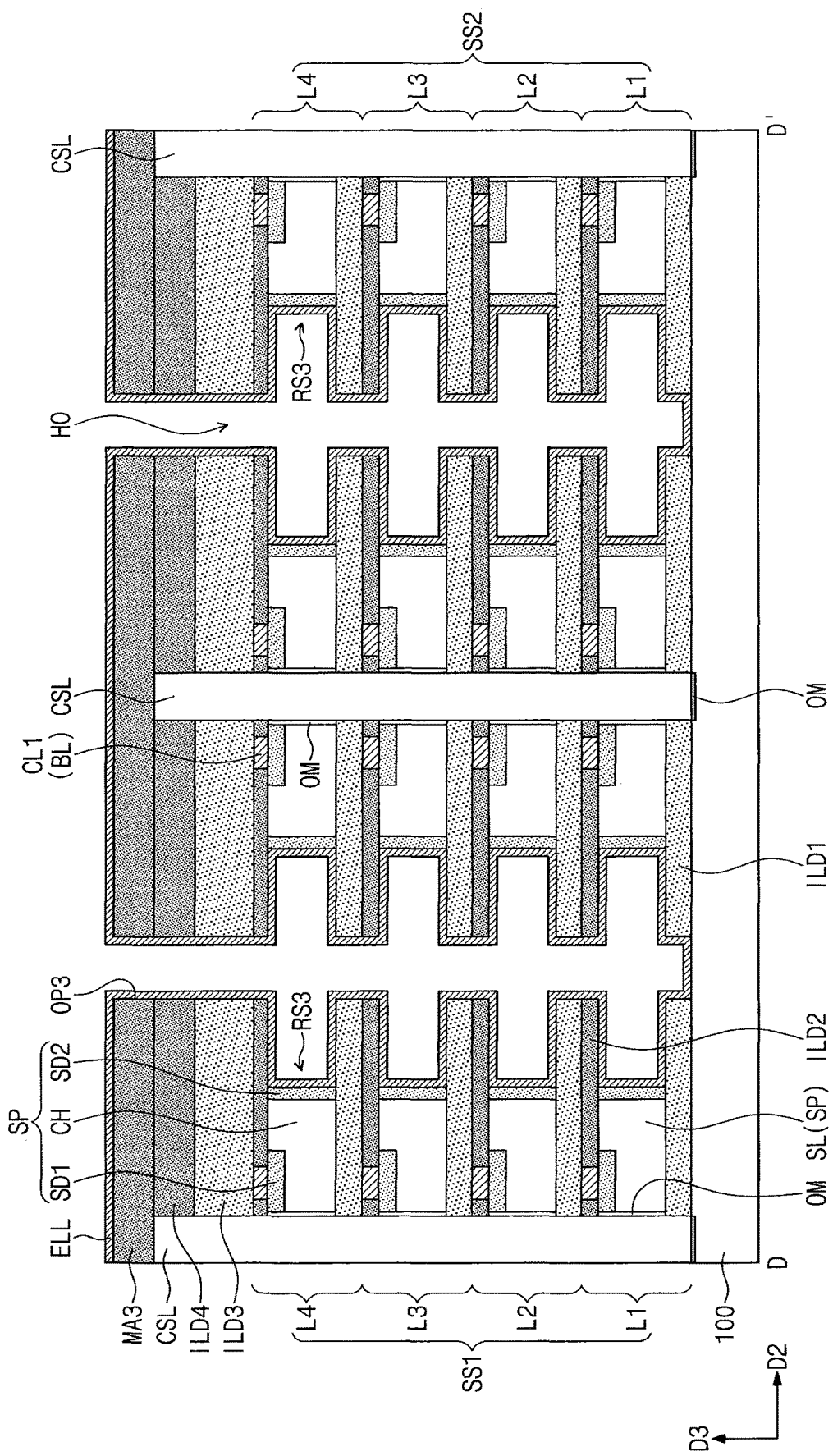
Figure 33E:
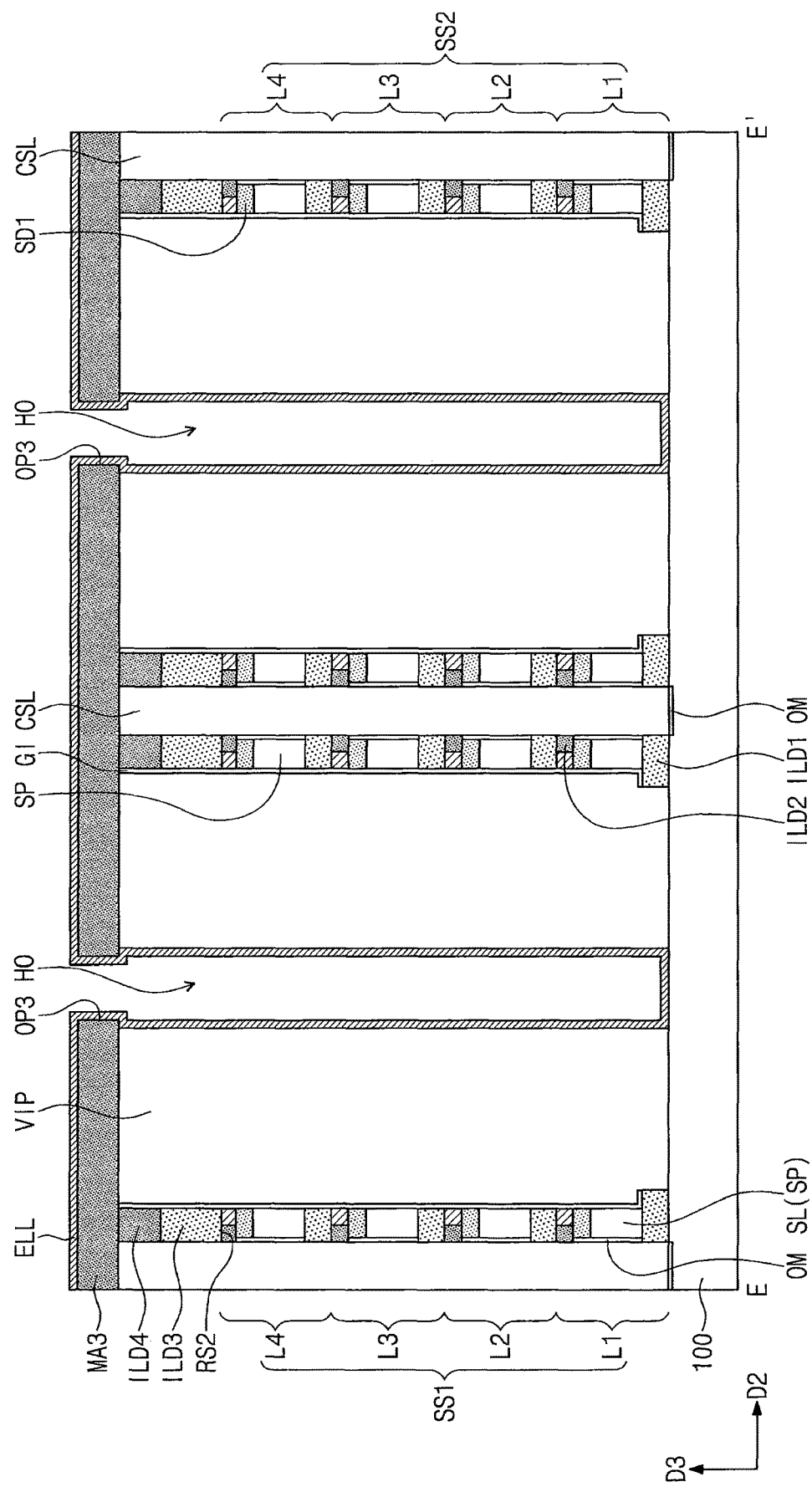
Figure 34:
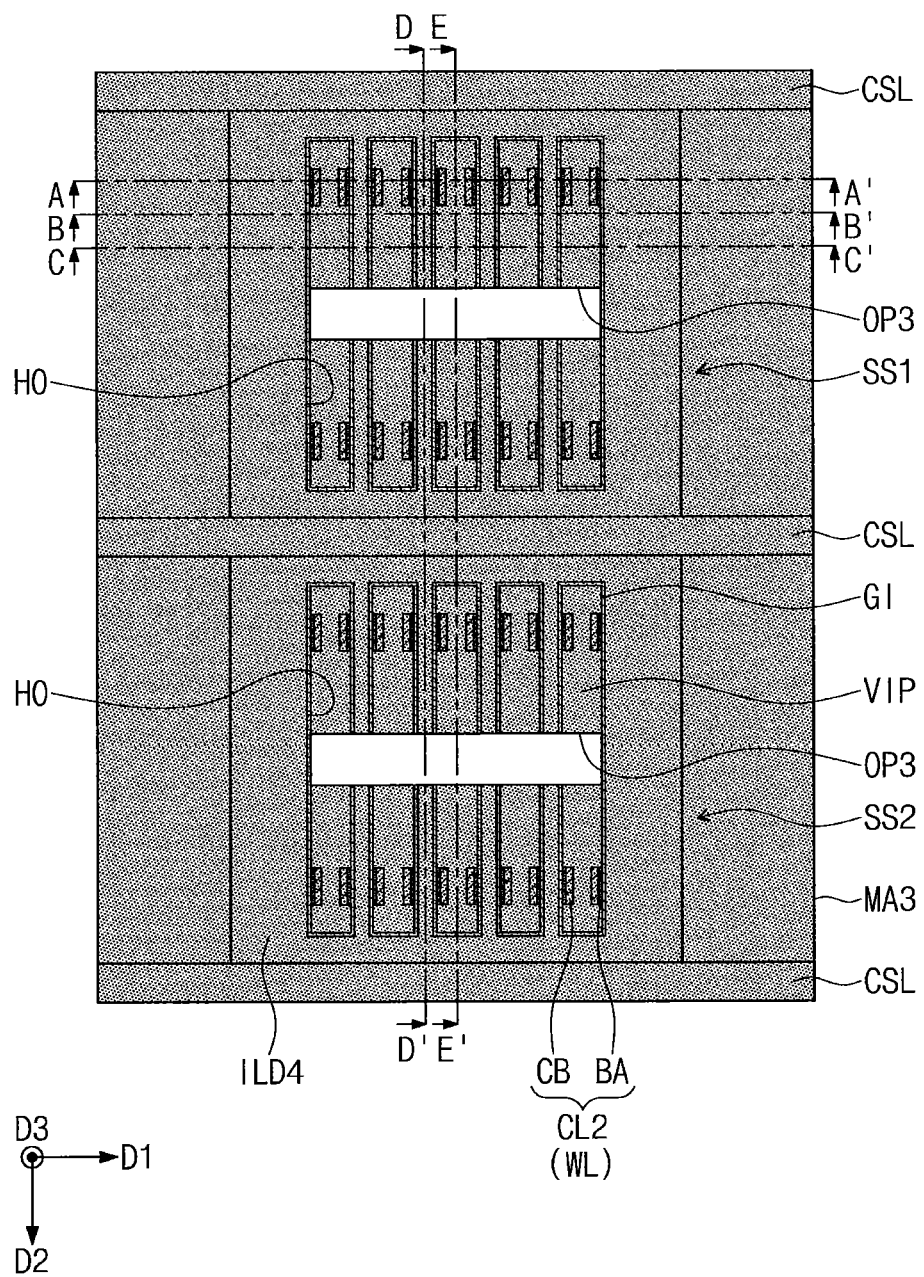
Figure 35A:
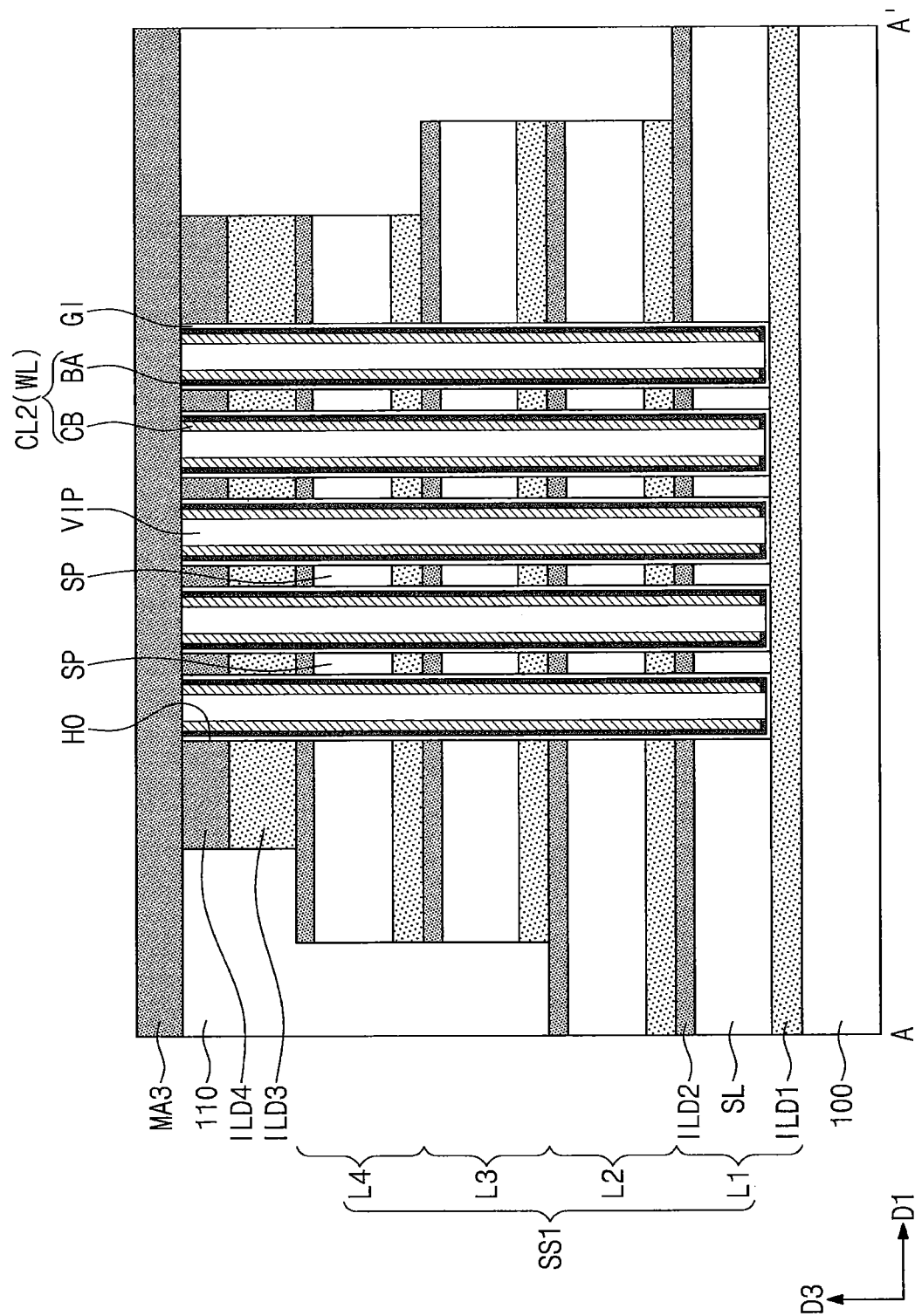
Figure 35B:
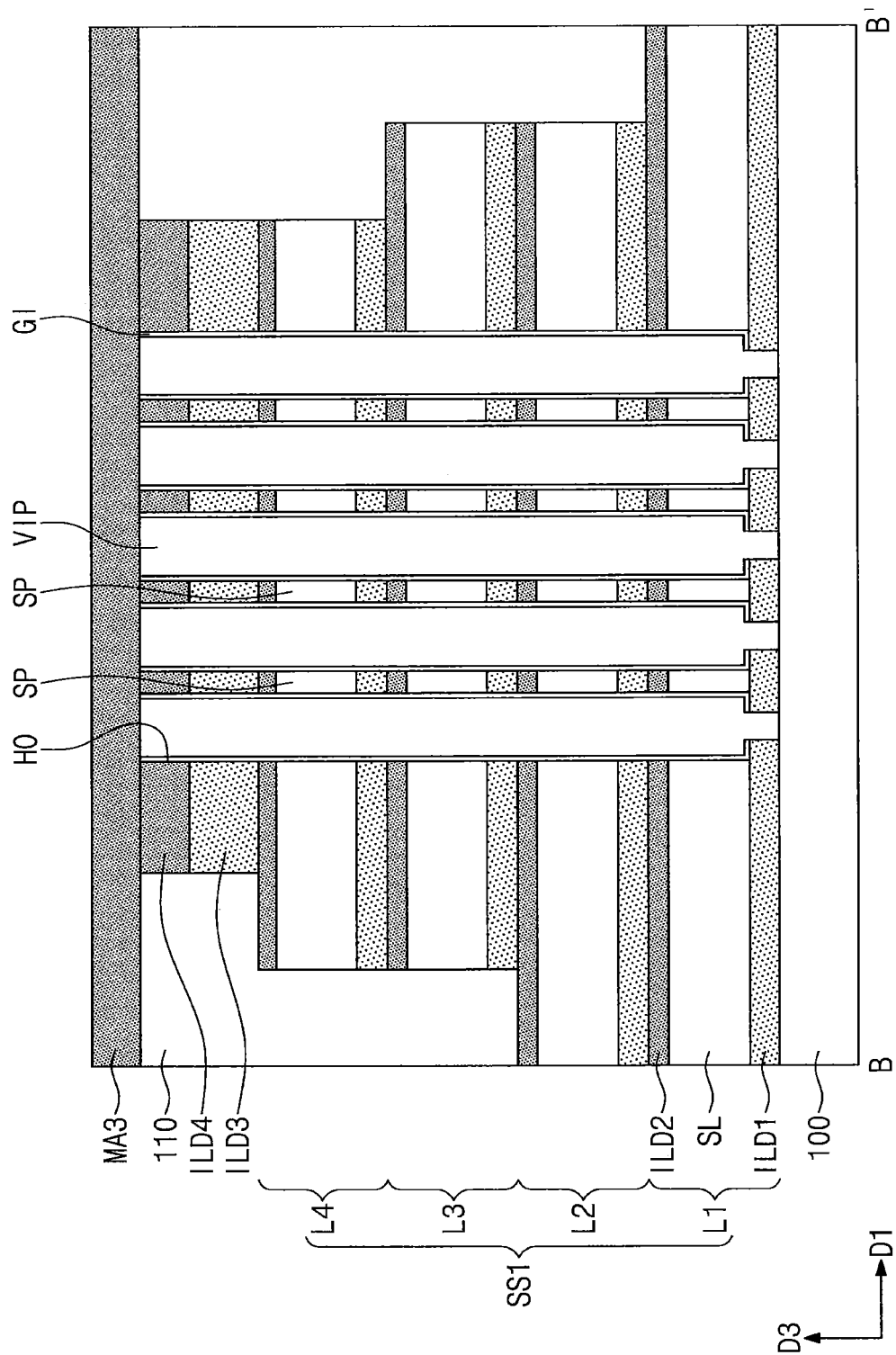
Figure 35C:
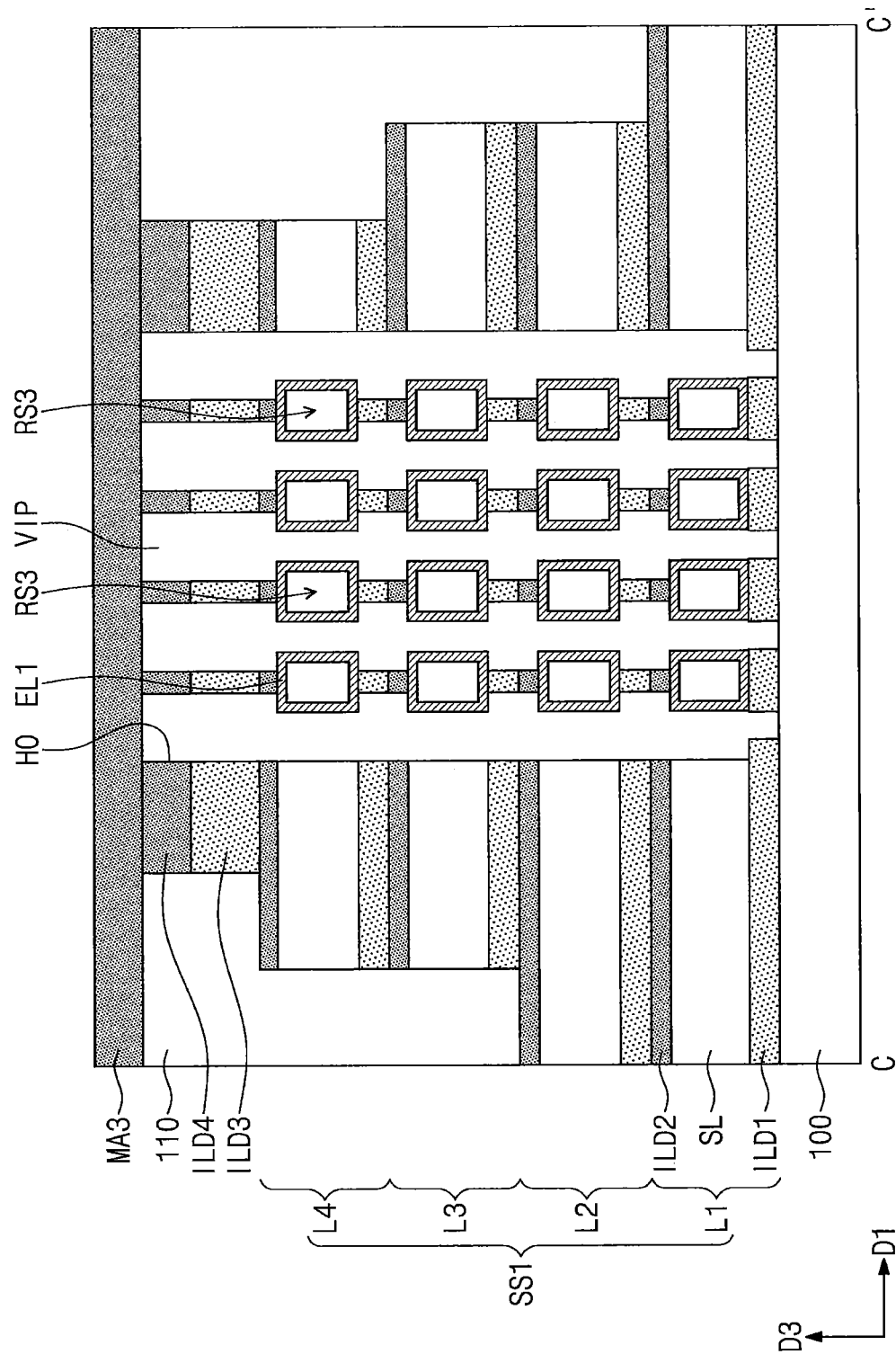
Figure 35D:
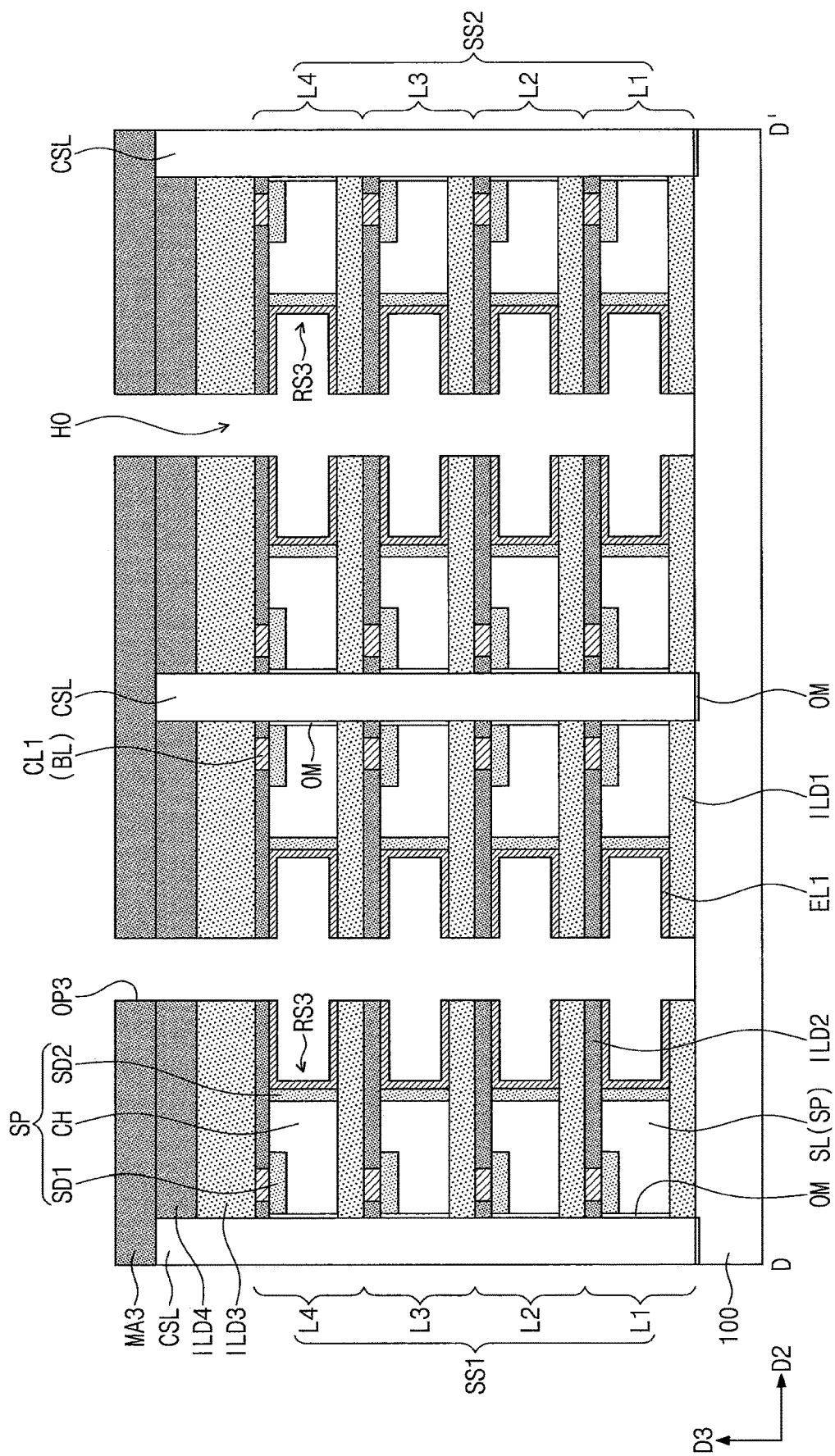
Figure 35E:
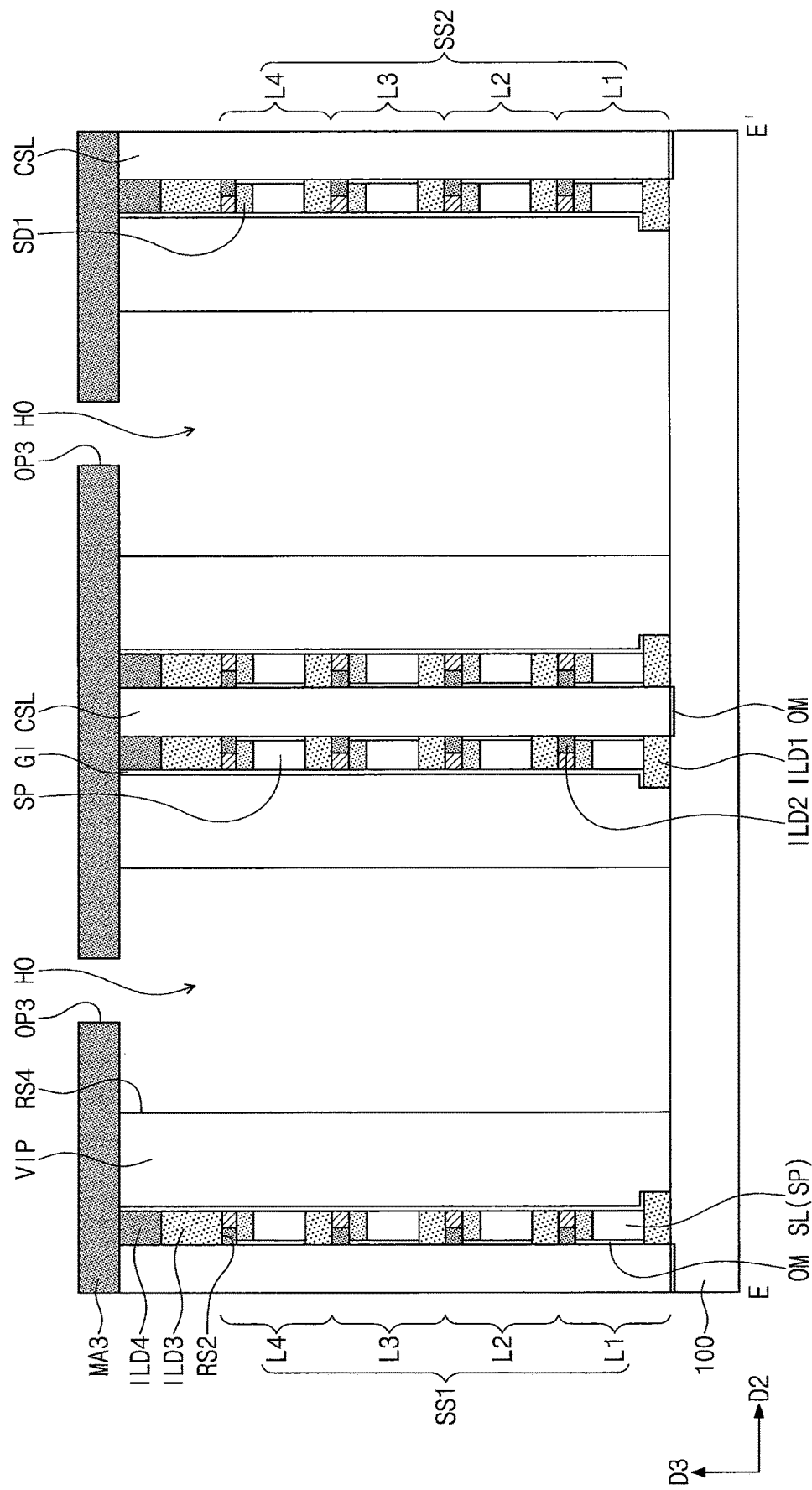

FIGS. 18, 20, 22, 24, 26, 28, 30, 32, and 34 illustrate plan views showing a method of manufacturing three-dimensional semiconductor memory devices according to some embodiments of the inventive concepts. FIGS. 19, 21, 23A, 25A, 27A, 29A, 31A, 33A, and 35A illustrate cross-sectional views taken along line A-A' of FIGS. 18, 20, 22, 24, 26, 28, 30, 32, and 34, respectively. FIGS. 23B, 25B, 27B, 29B, 31B, 33B, and 35B illustrate cross-sectional views taken along line B-B' of FIGS. 22, 24, 26, 28, 30, 32, and 34, respectively. FIGS. 27C, 29C, 31C, 33C, 35C illustrate cross-sectional views taken along line C-C' of FIGS. 26, 28, 30, 32, and 34, respectively. FIGS. 27D, 29D, 31D, 33D, and 35D illustrate cross-sectional views taken along line D-D' of FIGS. 26, 28, 30, 32, and 34, respectively. FIGS. 31E, 33E, and 35E illustrate cross-sectional views taken along line E-E' of FIGS. 30, 32, and 34, respectively.

Figure 18:
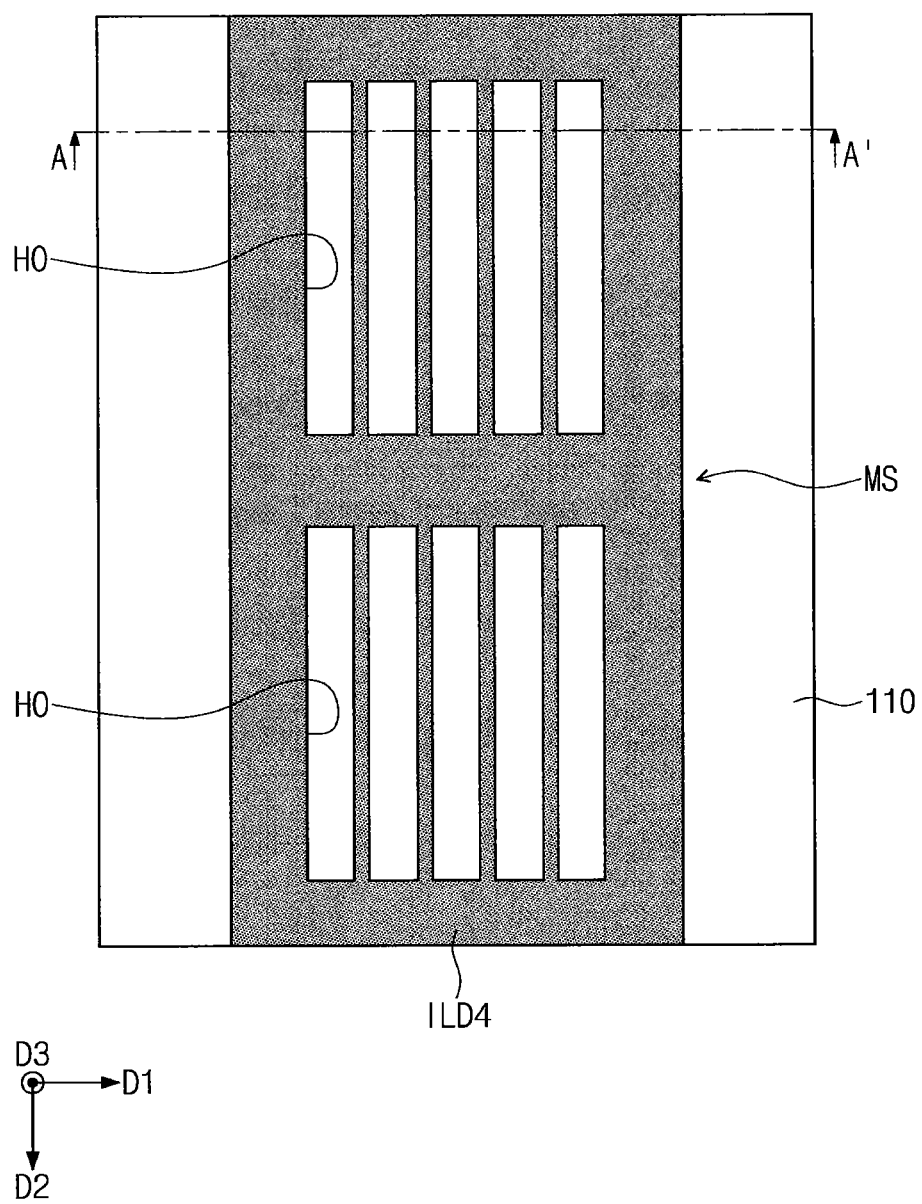
FIGS. 18, 20, 22, 24, 26, 28, 30, 32, and 34 illustrate plan views showing a method of manufacturing three-dimensional semiconductor memory devices according to some embodiments of the inventive concepts.
Figure 19:
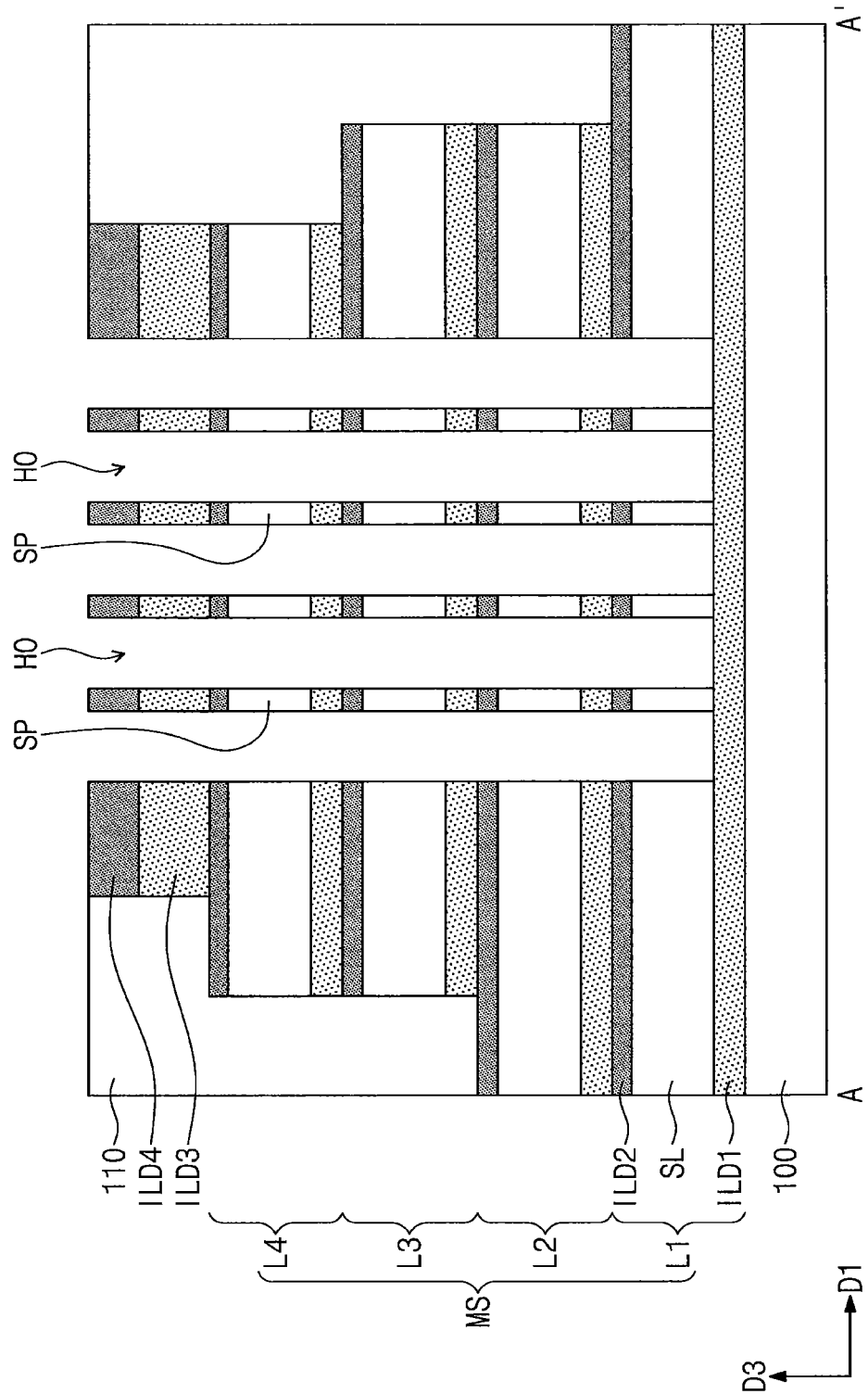

Referring to FIGS. 18 and 19, a mold structure MS may be formed on a substrate 100. The formation of the mold structure MS may include forming first, second, third, and fourth layers L1, L2, L3, and L4 that are sequentially stacked. The mold structure MS may be formed to have stepwise structures at its opposite ends.

Each of the first to fourth layers L1 to L4 may include a first dielectric layer ILD1, a semiconductor layer SL, and a second dielectric layer ILD2. The first dielectric layer ILD1, the semiconductor layer SL, and the second dielectric layer ILD2 may be sequentially formed. The semiconductor layer SL may include a semiconductor material, for example, silicon, germanium, silicon-germanium, and/or indium gallium zinc oxide (IGZO). The first dielectric layer ILD1 and the second dielectric layer ILD2 may include different insulating materials from each other. One of the first and second dielectric layers ILD1 and ILD2 may have an etch selectivity to the other of the first and second dielectric layers ILD1 and ILD2. The first dielectric layer ILD1 and the second dielectric layer ILD2 may be formed of a silicon oxide layer, a silicon nitride layer, a silicon oxynitride layer, a carbon-containing silicon oxide layer, a carbon-containing silicon nitride layer, and/or a carbon-containing silicon oxynitride layer. For example, the first dielectric layer ILD1 may be formed of a carbon-containing silicon oxide layer (e.g., SiOC), and the second dielectric layer ILD2 may be formed of a silicon nitride layer (e.g., SiN).

A third dielectric layer ILD3 and a fourth dielectric layer ILD4 may be formed on the mold structure MS. One of the third and fourth dielectric layers ILD3 and ILD4 may have an etch selectivity to the other of the third and fourth dielectric layers ILD3 and ILD4. An interlayer dielectric layer 110 may be formed to be on and/or cover the mold structure MS. A top surface of the interlayer dielectric layer 110 may be coplanar with a top surface of the fourth dielectric layer ILD4. The interlayer dielectric layer 110 may be formed, for example, using one or more of a silicon oxide layer, a silicon nitride layer, and a silicon oxynitride layer.

The mold structure MS may be patterned to form holes HO penetrating the mold structure MS. The holes HO may not penetrate the first dielectric layer ILD1 provided at the bottom of the mold structure MS. The first dielectric layer ILD1 at the bottom of the mold structure MS may not allow the holes HO to expose a top surface of the substrate 100.

Each of the holes HO may extend in a second direction D2. In some embodiments, each of the holes HO may have a linear and/or bar shape, though the inventive concepts are not limited thereto. The holes HO may be arranged spaced apart from each other along a first direction D1. Each of the semiconductor layer SL may have semiconductor patterns SP defined by the holes HO. For example, the semiconductor pattern SP may be defined between a pair of the holes HO adjacent to each other.

Figure 20:
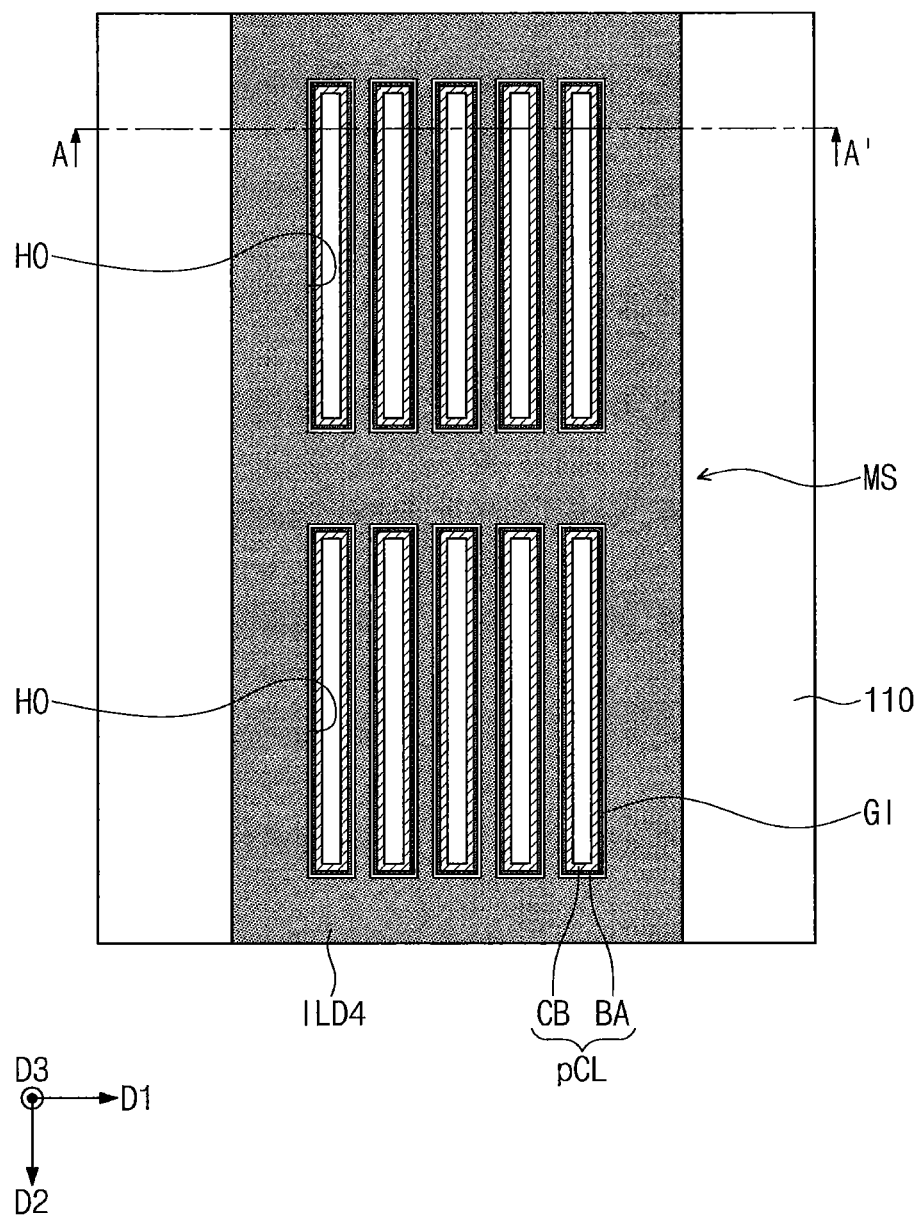
Figure 21:
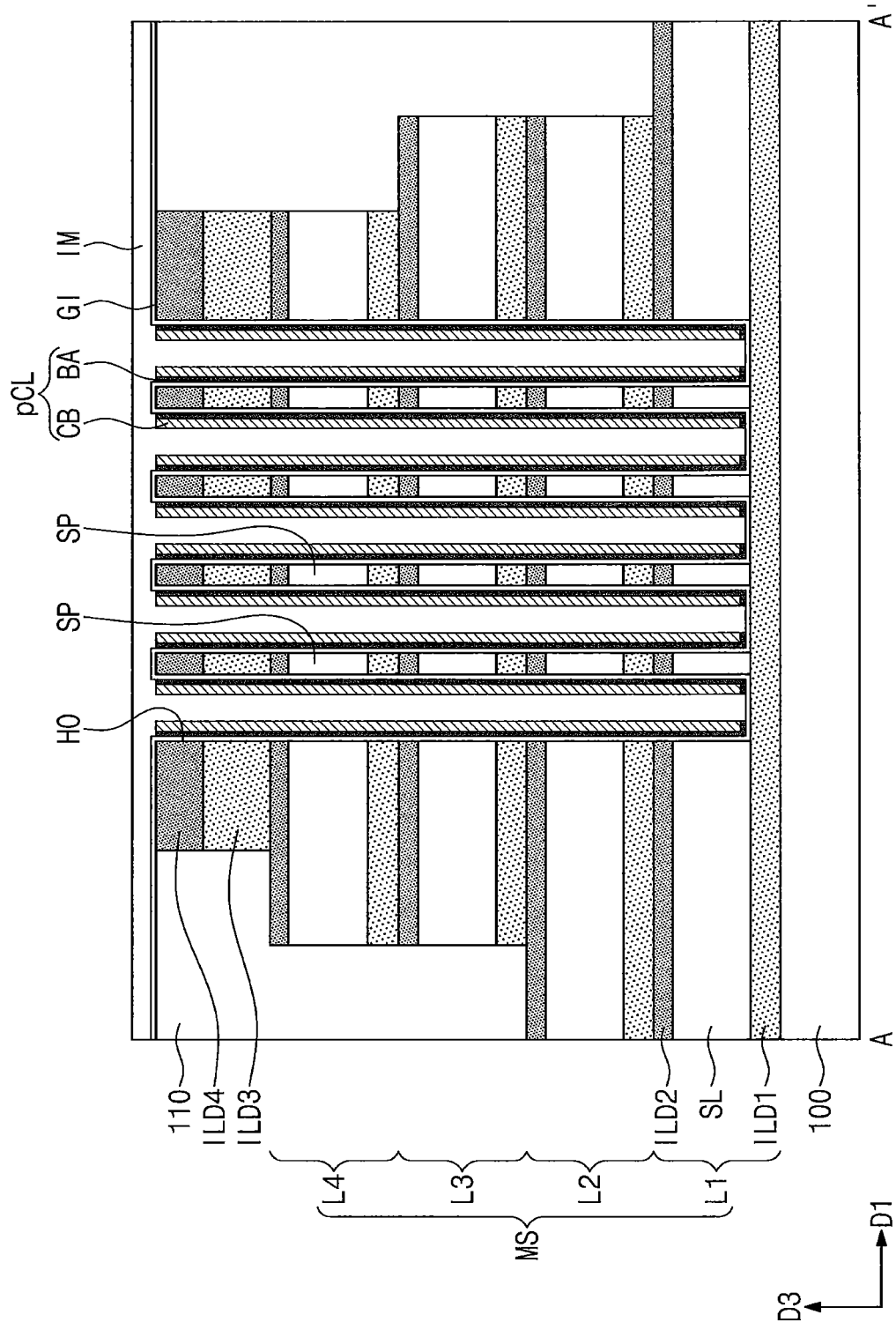

Referring to FIGS. 20 and 21, a gate dielectric layer GI may be conformally formed on an inner sidewall, which is exposed to the holes HO, of the mold structure MS. For example, a high-k dielectric material may be used to conformally form the gate dielectric layer GI.

Preliminary conductive lines pCL may be formed to partially fill the holes HO. The preliminary conductive lines pCL may be formed on the inner sidewall, which is exposed to the holes HO, of the mold structure MS. The formation of the preliminary conductive lines pCL may include conformally forming a barrier layer on the gate dielectric layer GI, conformally forming a conductive layer on the barrier layer, and anisotropically etching the barrier layer and the conductive layer to form a barrier pattern BA and a conductive body CB. The barrier layer may be formed using conductive metal nitride (e.g., titanium nitride, tantalum nitride, etc.), and the conductive layer may be formed using metal (e.g., tungsten, titanium, tantalum, etc.).

After the preliminary conductive lines pCL are formed, an insulating material IM may be deposited. The insulating material IM may be formed to be within and, in some embodiments, to completely fill, the holes HO. The insulating material IM may include, for example, one or more of silicon oxide, silicon nitride, and silicon oxynitride.

Figure 22:
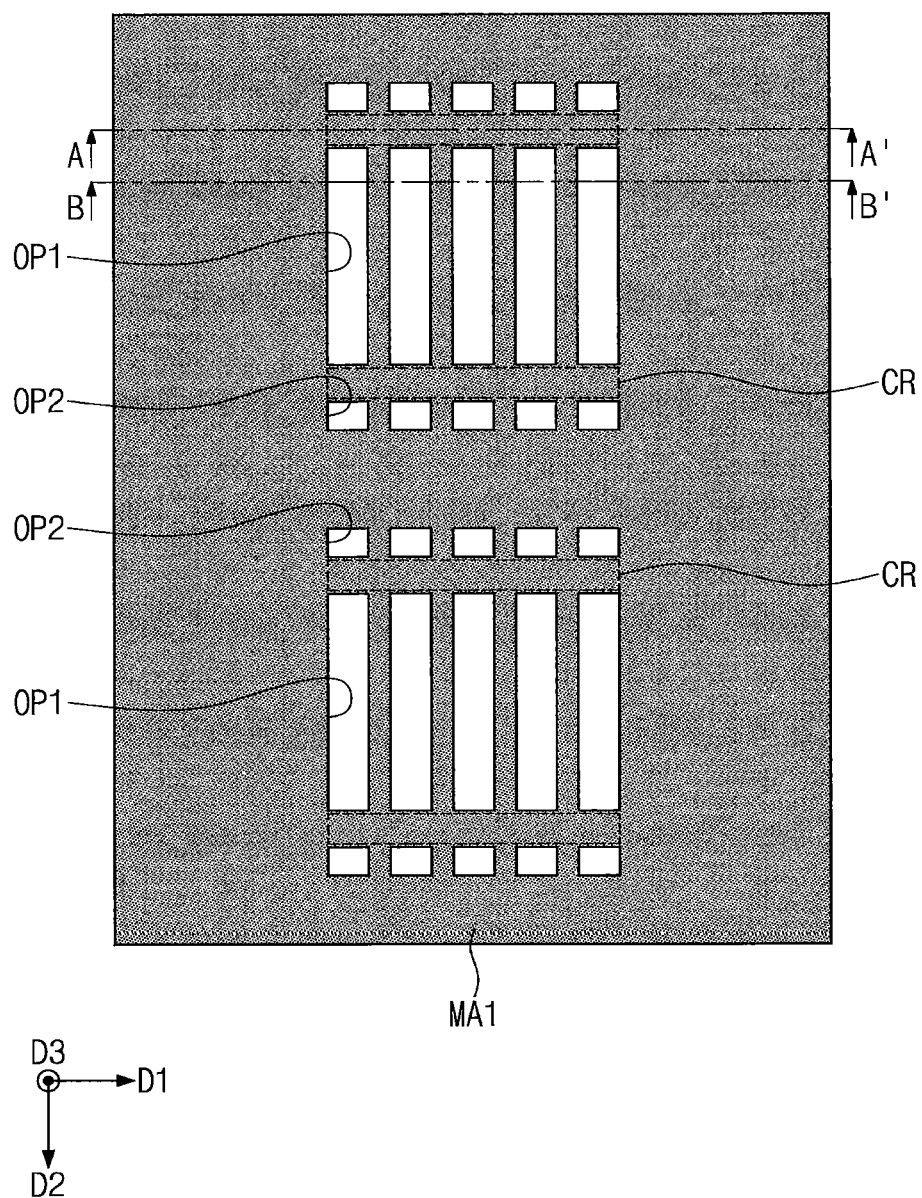
Figure 23A:
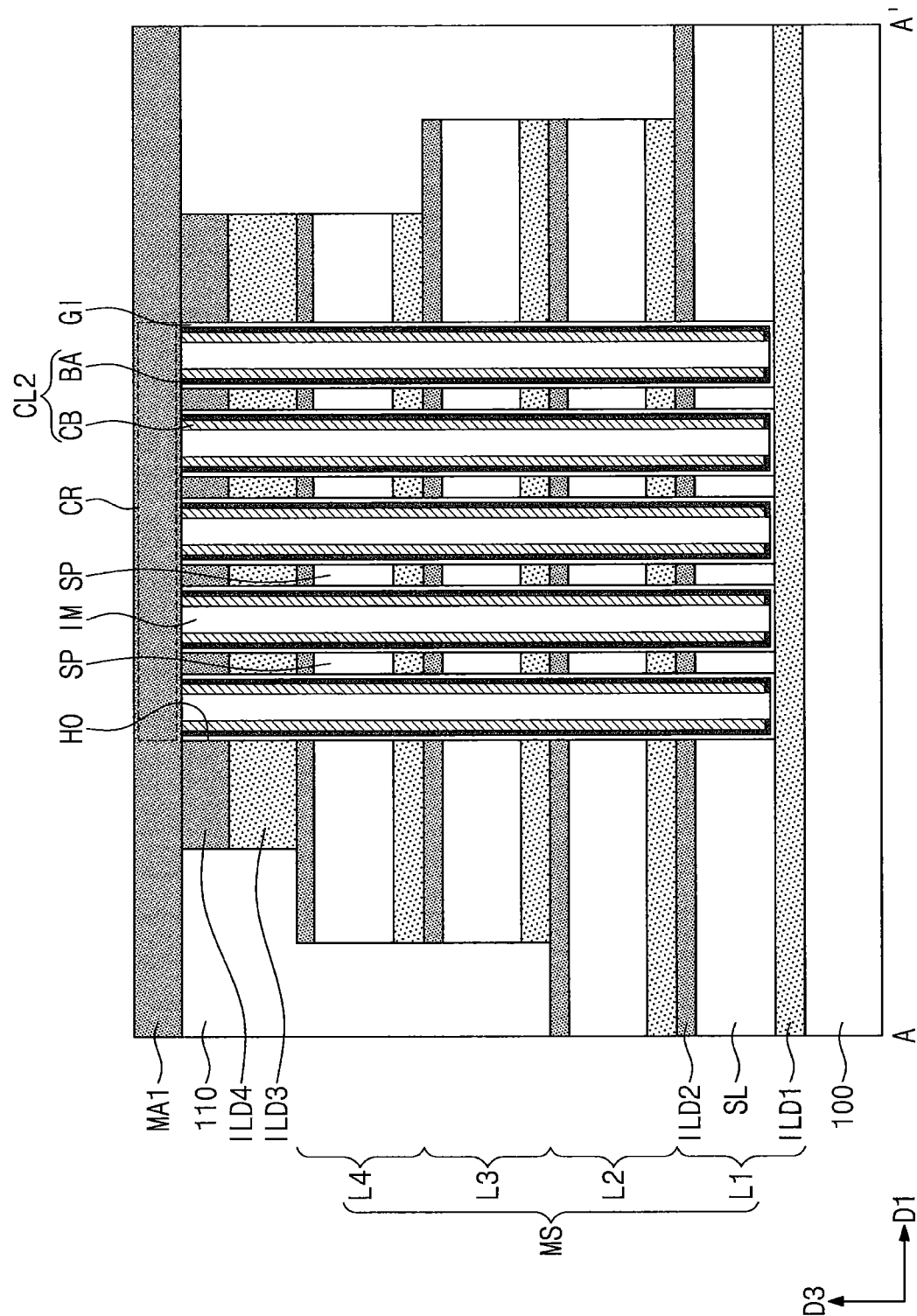

Referring to FIGS. 22, 23A, and 23B, a planarization process may be performed on the insulating material IM and the gate dielectric layer GI until the top surfaces of the interlayer dielectric layer 110 and the fourth dielectric layer ILD4 are exposed.

A first mask pattern MA1 including first openings OP1 and second openings OP2 may be formed on the interlayer dielectric layer 110 and the fourth dielectric layer ILD4. When viewed in plan, the first openings OP1 and the second openings OP2 may overlap the holes HO. Each of the first openings OP1 may extend in the second direction D2. In some embodiments, each of the first openings OP1 may have a linear and/or bar shape, though the inventive concepts are not limited thereto. The first openings OP1 may be arranged spaced apart from each other along the first direction D1. The second openings OP2 may be arranged spaced apart from each other along the first direction D1. Each of the second openings OP2 may be spaced apart from its adjacent first opening OP1 in the second direction D2 or in a direction opposite to the second direction D2.

The first mask pattern MA1 may include closed regions CR. Each of the closed regions CR may be a portion between the first opening OP1 and the second opening OP2 adjacent to each other. Each of the closed regions CR may extend in the first direction D1. The closed regions CR may define positions where second conductive lines CL2 are formed as discussed below.

A removal process may be performed on the insulating material IM exposed to the first and second openings OP1 and OP2. The insulating material IM may be removed by an anisotropic etching process. Accordingly, the insulating material IM may not be completely removed but may remain below the closed portions CR of the first mask pattern MA1. During the removal of the insulating material IM, the anisotropic etching process may etch the first dielectric layer ILD1, which is exposed to the holes HO, provided at the bottom of the mold structure MS. As such, first recessions RS1 may be formed to partially expose the top surface of the substrate 100.

The preliminary conductive lines pCL exposed to the first and second openings OP1 and OP2 may be removed to form second conductive lines CL2. The preliminary conductive lines pCL may be removed by an anisotropic etching process. Accordingly, the preliminary conductive lines pCL may not be completely removed but may remain below the closed portions CR of the first mask pattern MA1. The remaining preliminary conductive lines pCL may constitute the second conductive lines CL2. The anisotropic etching process may form the second conductive lines CL2 spaced apart from each other. Each of the second conductive lines CL2 may have a linear shape extending in a vertical direction, or in a third direction D3. The remaining insulating material IM may be interposed between a pair of the second conductive lines CL2 adjacent to each other.

Figure 24:
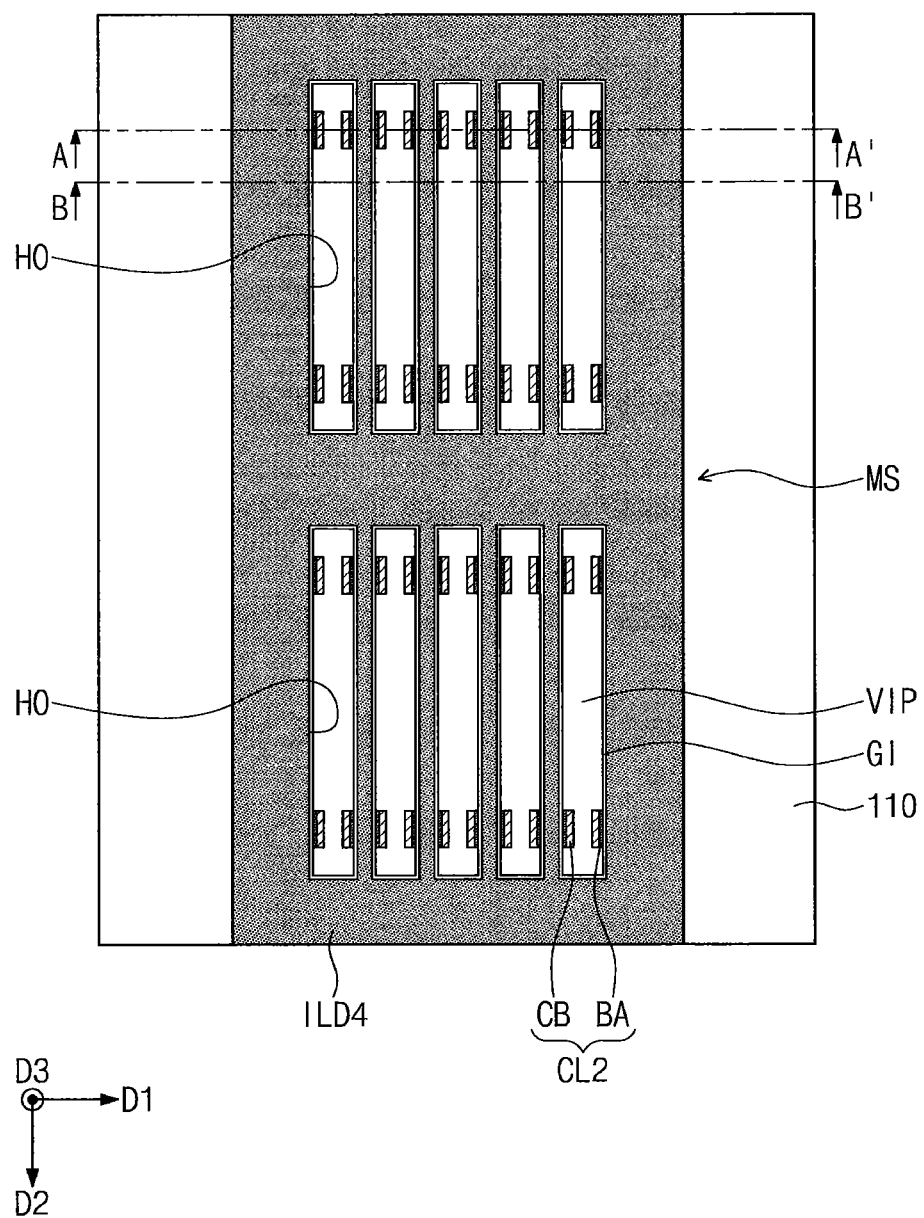
Figure 25A:
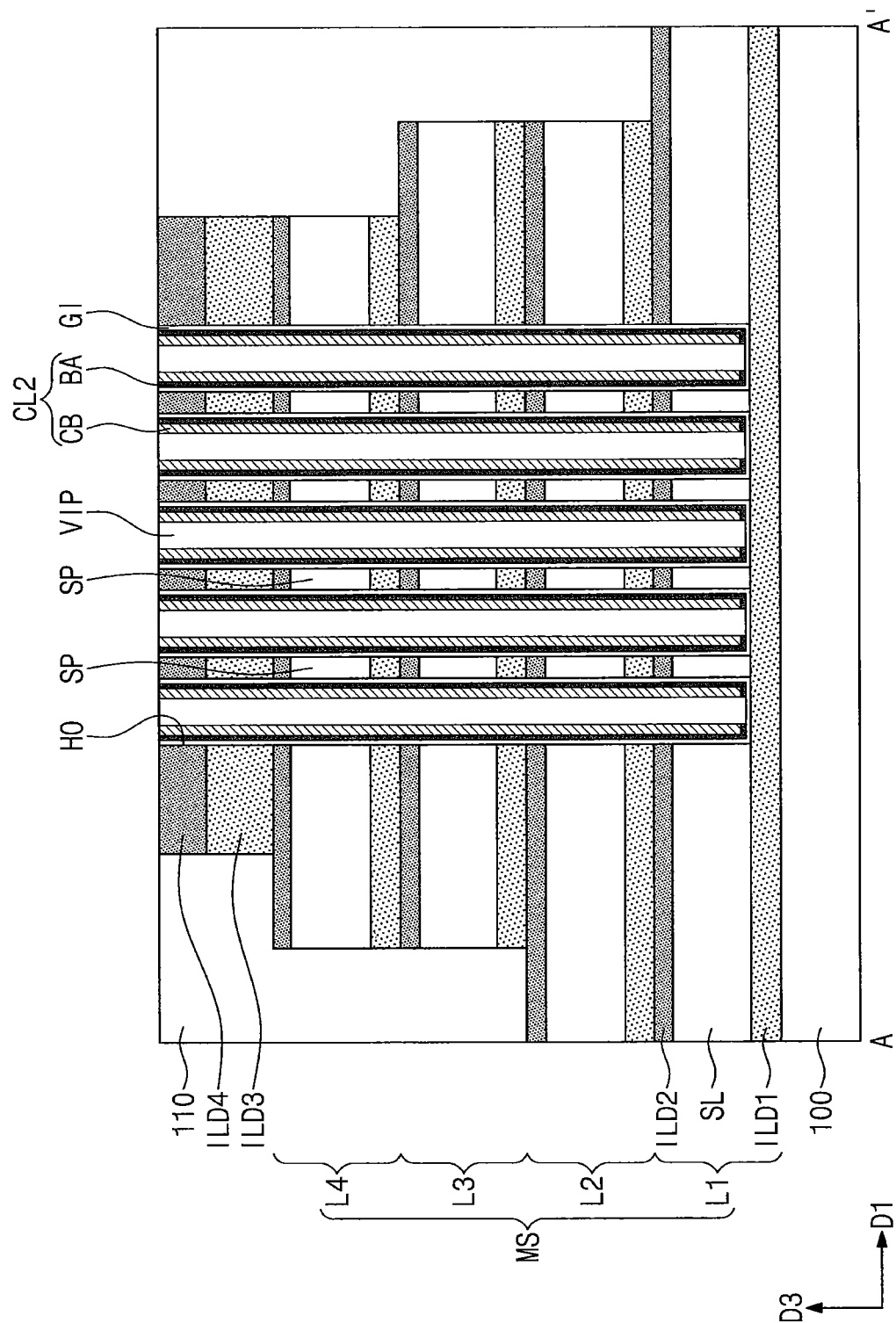
Figure 25B:
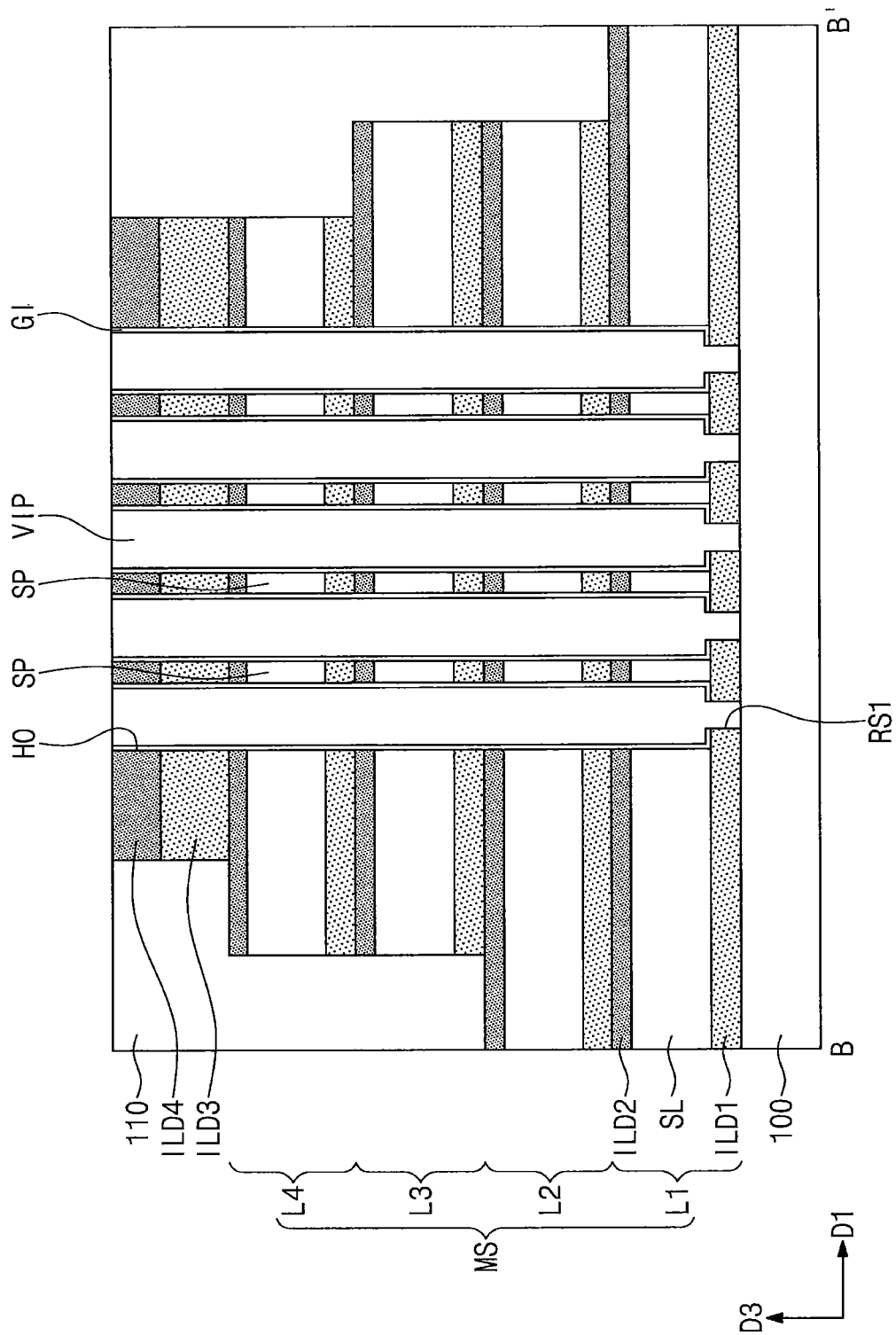
Figure 26:
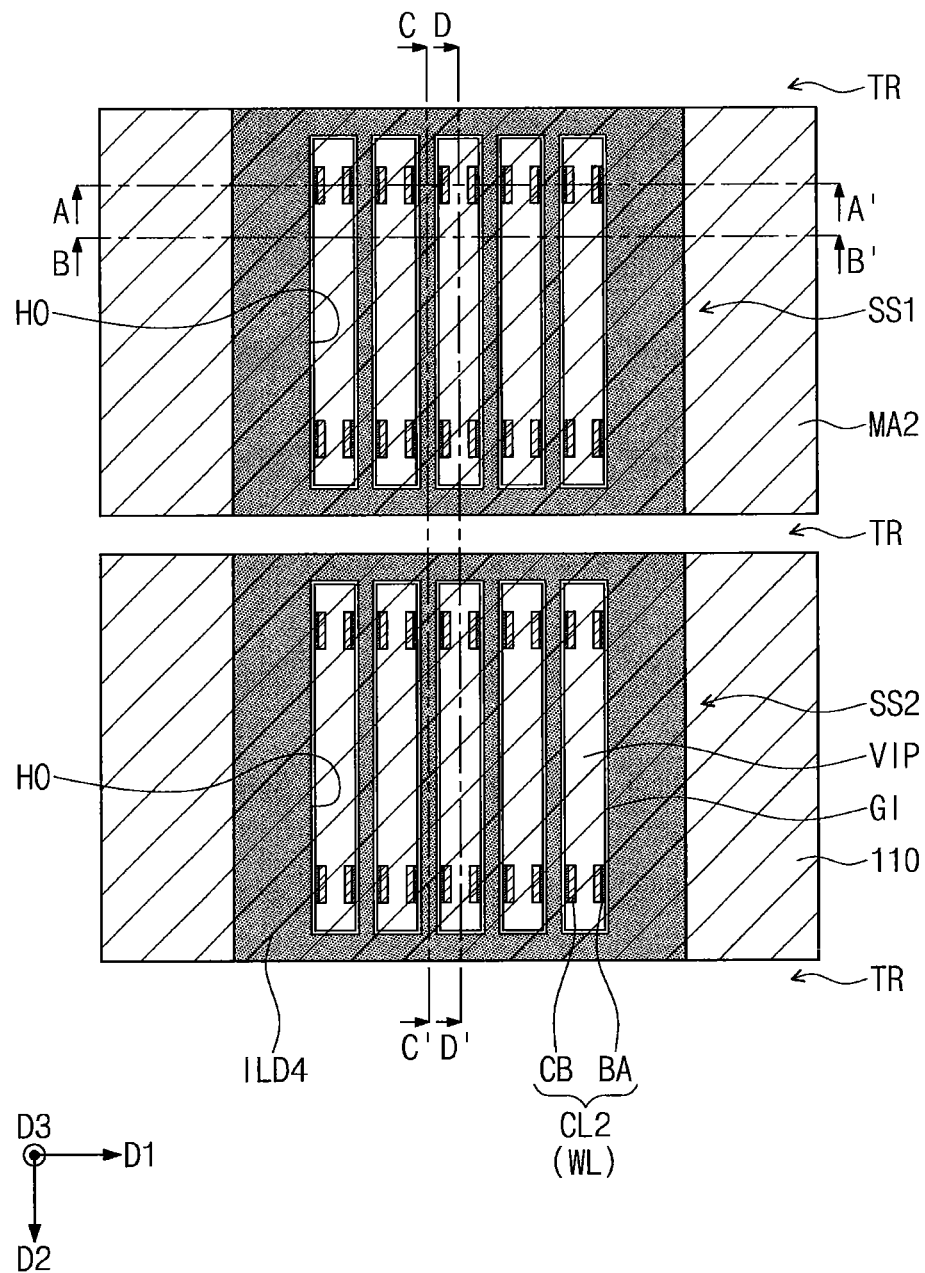
Figure 27A:
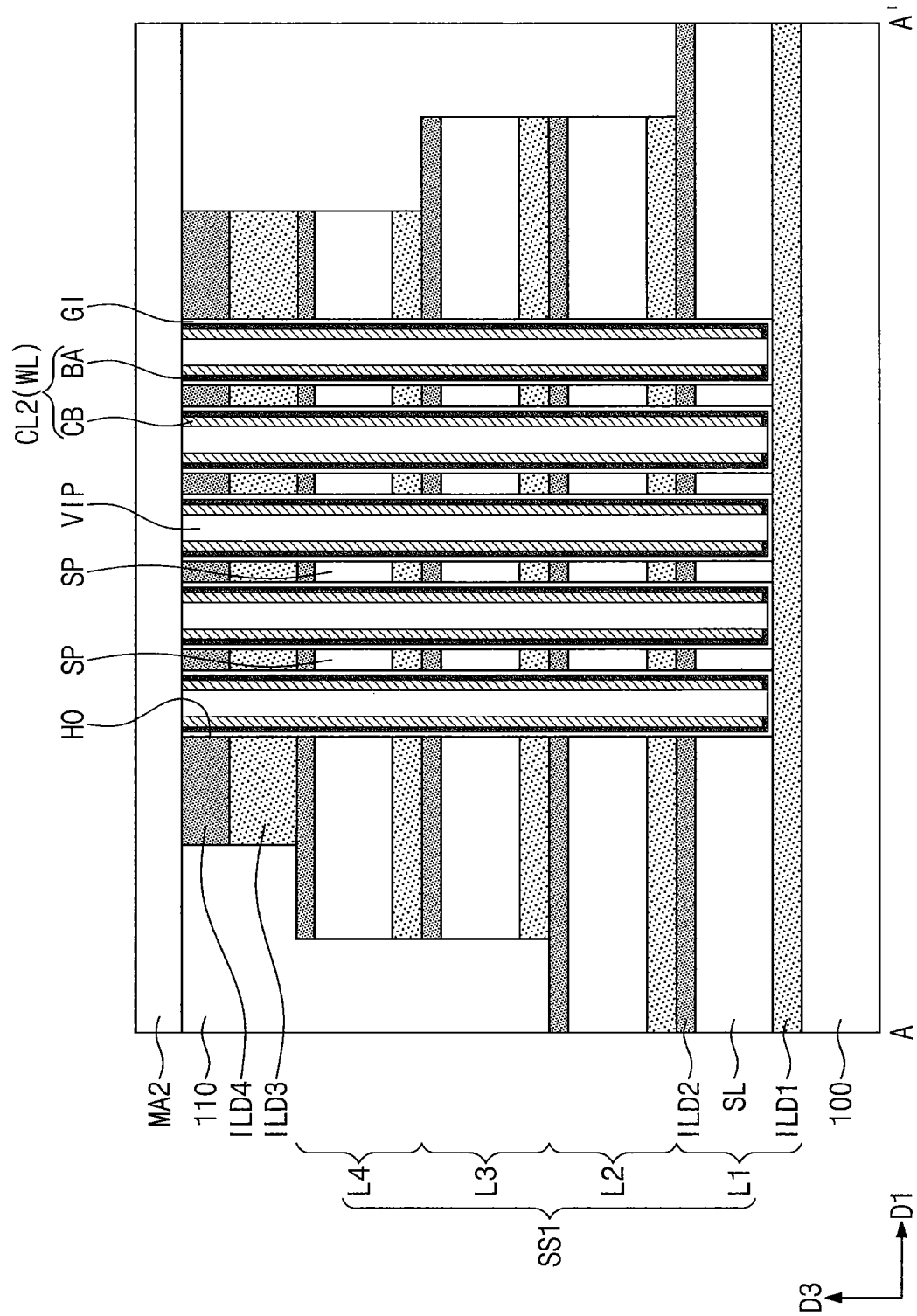
Figure 27C:
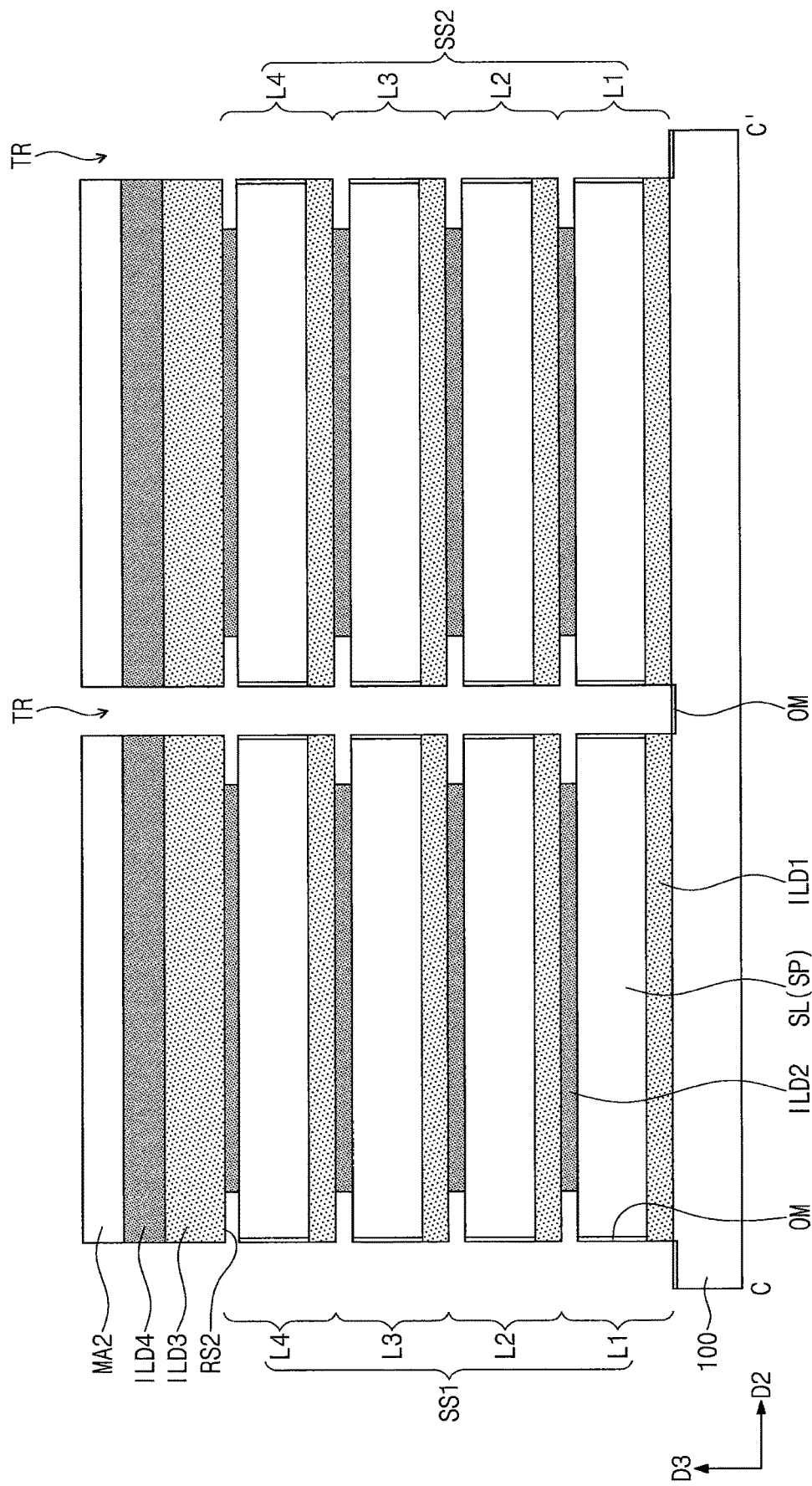
FIGS. 27C, 29C, 31C, 33C, 35C illustrate cross-sectional views taken along line C-C' of FIGS. 26, 28, 30, 32, and 34, respectively.
Figure 27D:
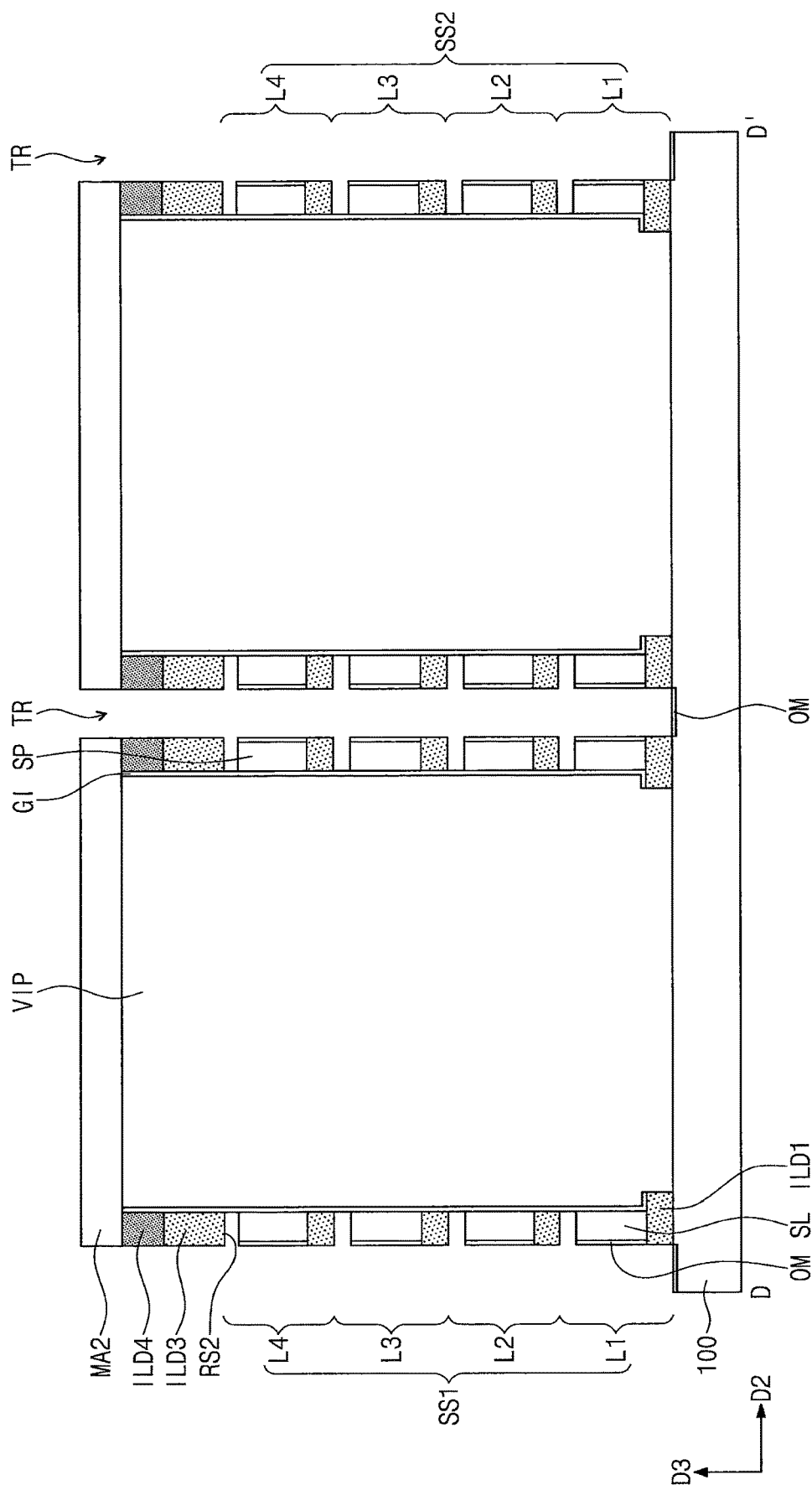
FIGS. 27D, 29D, 31D, 33D, and 35D illustrate cross-sectional views taken along line D-D' of FIGS. 26, 28, 30, 32, and 34, respectively.
Figure 28:
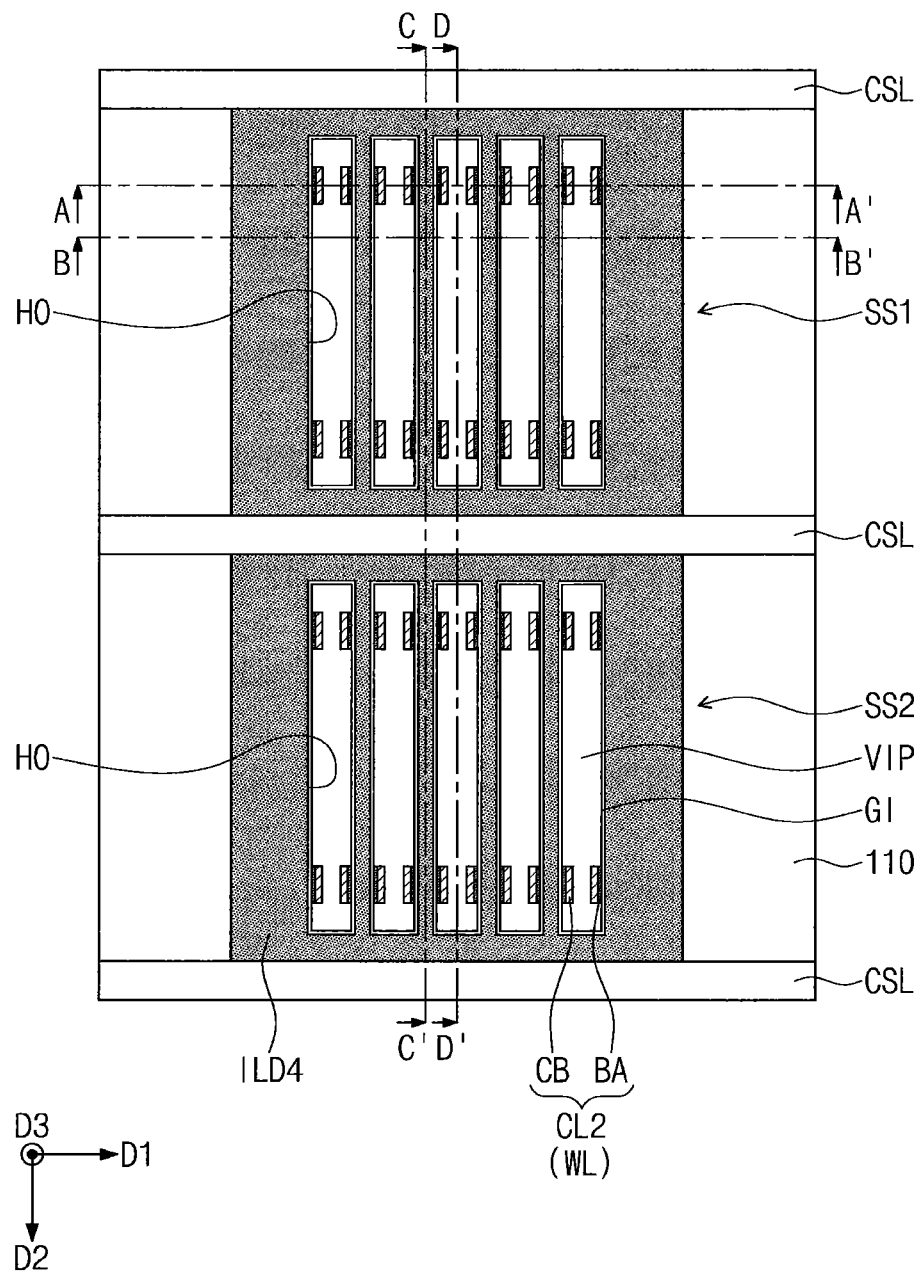
Figure 29A:
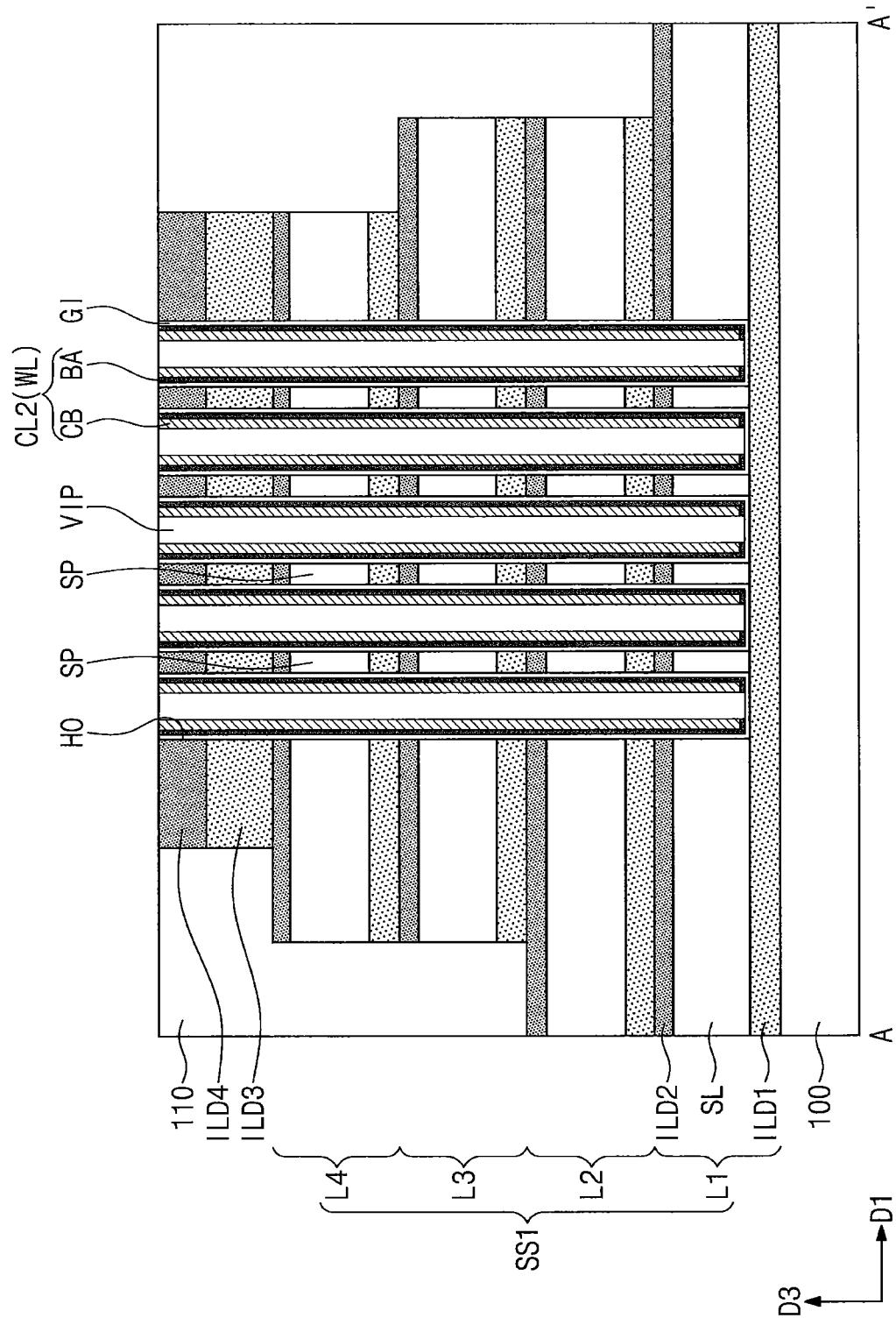
Figure 29B:
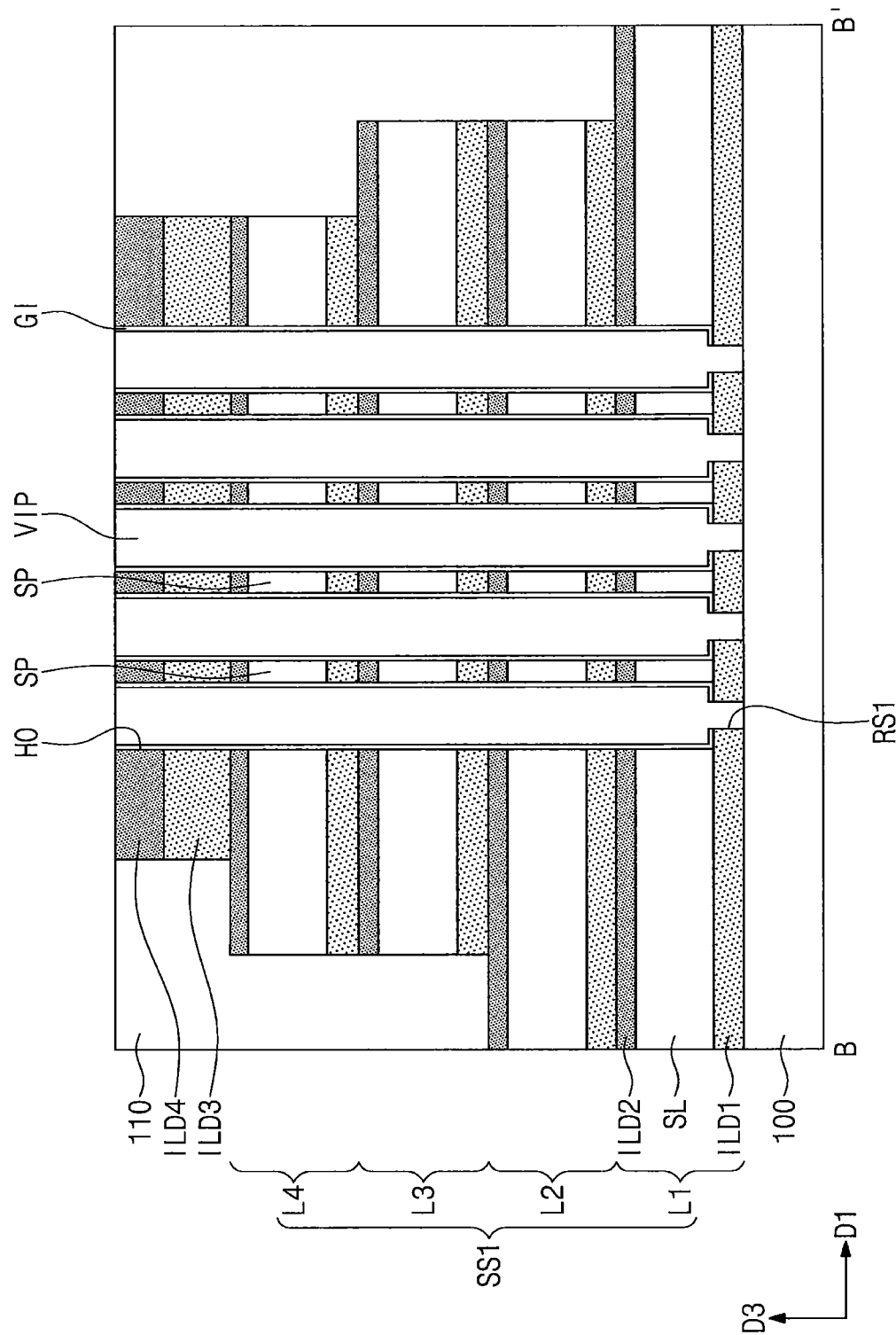
Figure 29C:
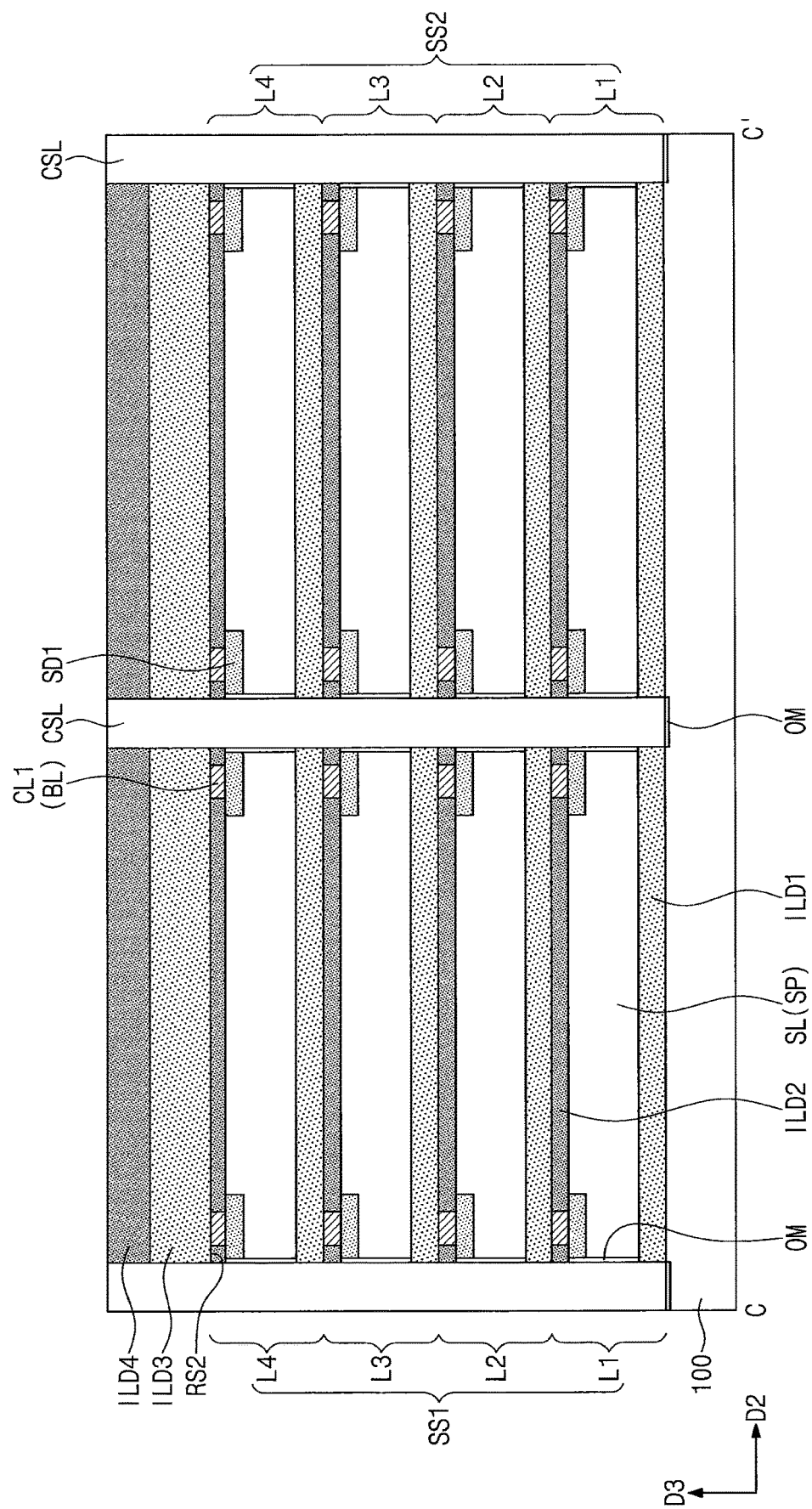
Figure 29D:
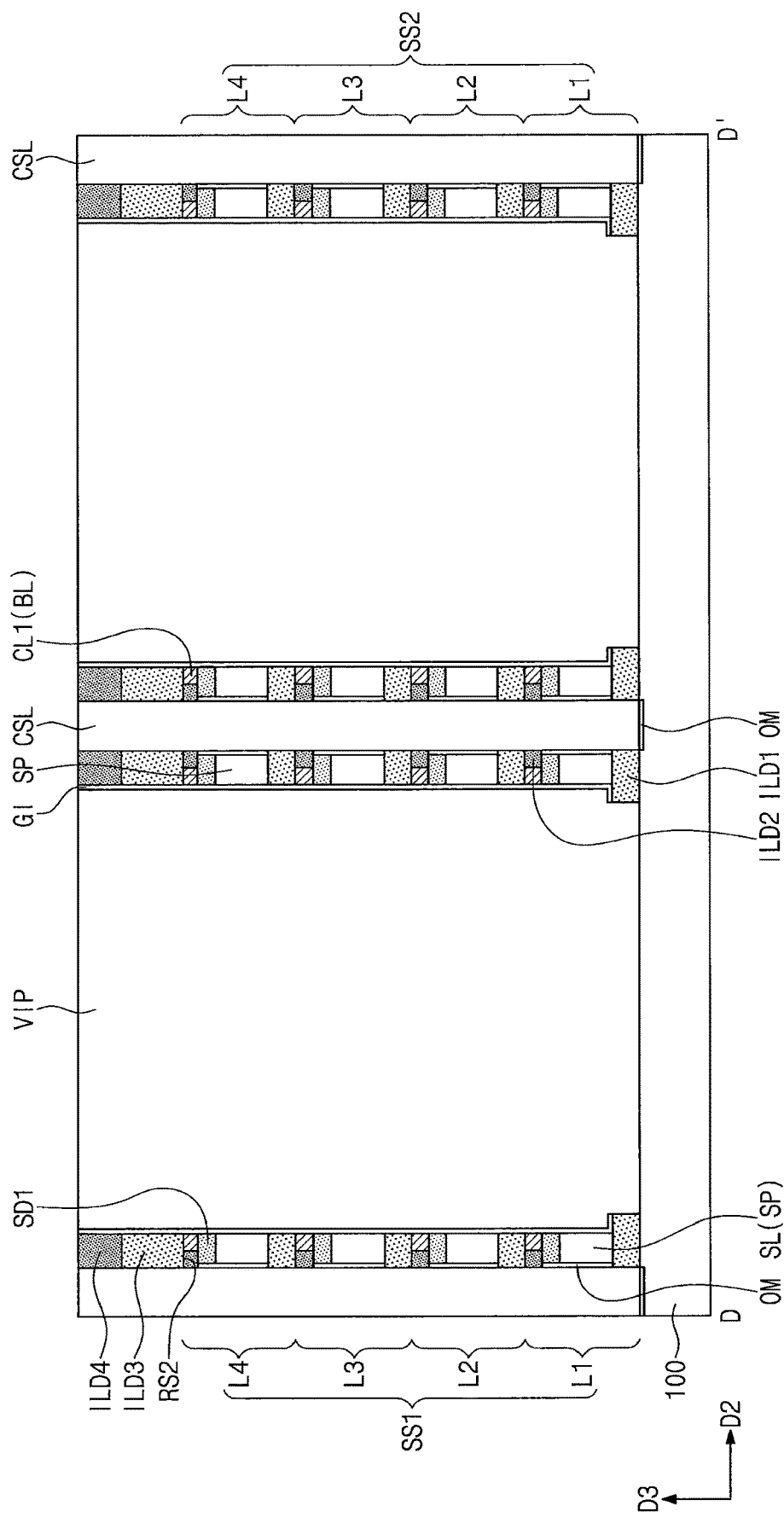
Figure 30:
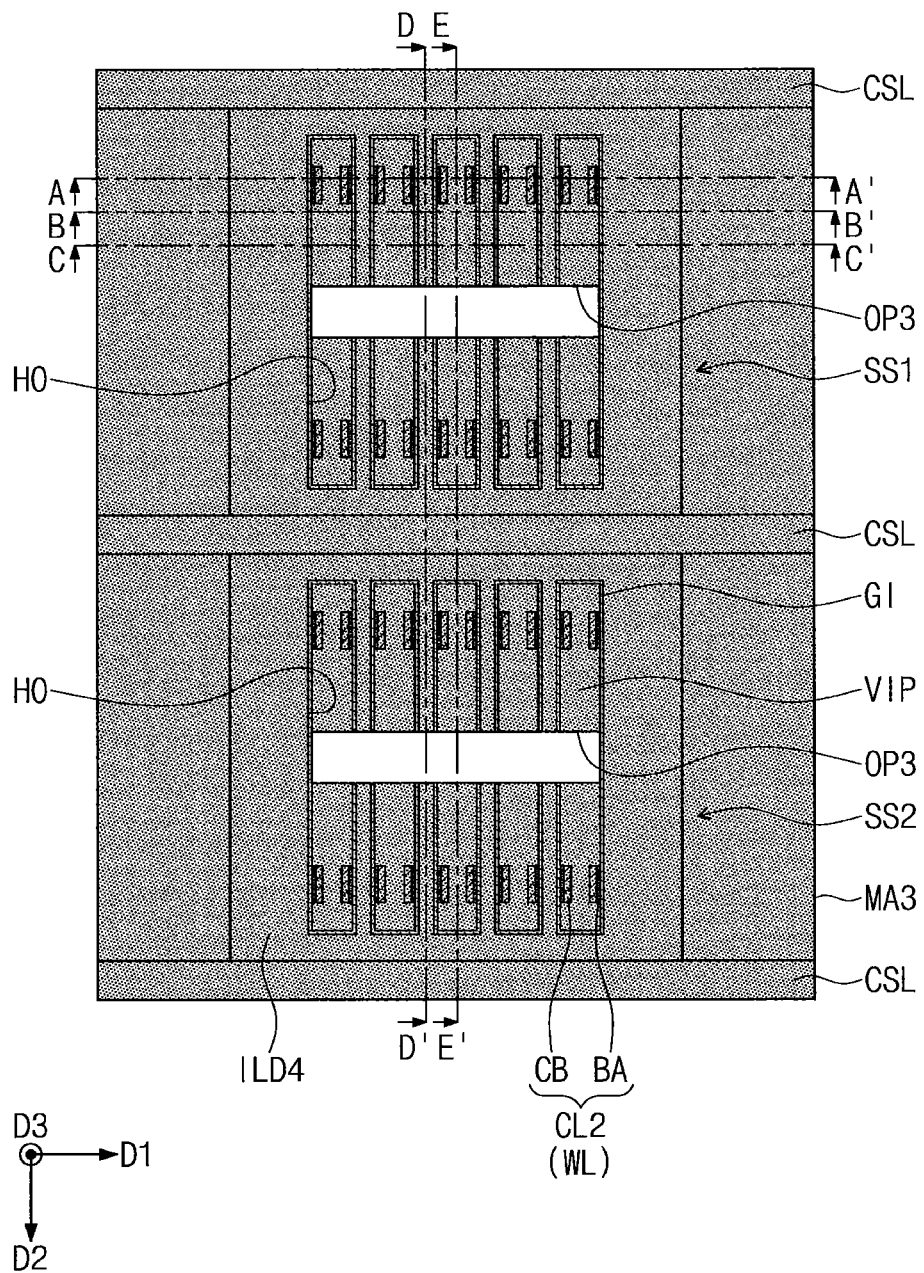

Referring to FIGS. 24, 25A, and 25B, the first mask pattern MA1 may be removed. An insulating material may be additionally deposited in an empty space of each of the holes HO, such that a vertical insulation pattern VIP may be formed to fill each of the holes HO. A planarization process may be performed to remove the insulating material deposited on the interlayer dielectric layer 110 and the fourth dielectric layer ILD4. For example, the additionally deposited insulating material may include the same material as that of the remaining insulating material IM. In some embodiments, the additionally deposited insulating material may include a different material from that of the remaining insulating material IM, but the inventive concepts are not limited thereto.

The vertical insulation pattern VIP may be interposed between a pair of the semiconductor patterns SP adjacent to each other. The vertical insulation pattern VIP may be interposed between a pair of the second conductive lines CL2 adjacent to each other.

Referring to FIGS. 26 and 27A to 27D, a second mask pattern MA2 may be formed on the mold structure MS. The second mask pattern MA2 may include linear openings extending along the first direction D1.

The second mask pattern MA2 may be used as an etching mask to pattern the mold structure MS, which may form a plurality of stack structures SS1 and SS2. For example, the mold structure MS may be patterned to form a first stack structure SS1 and a second stack structure SS2. The patterning process may result in defining trenches TR between the stack structures SS1 and SS2. Each of the trenches TR may partially expose the top surface of the substrate 100. When viewed in plan, each of the trenches TR may have a linear shape extending in the first direction D1.

The trenches TR may expose sidewalls of the first and second stack structures SS1 and SS2. An oxidation process may be performed on the exposed top surface of the substrate 100 and the exposed sidewalls of the first and second stack structures SS1 and SS2, which may form oxidation materials OM. For example, the oxidation materials OM may be partially formed on the semiconductor patterns SP and the substrate 100 that are exposed to the trenches TR.

The second dielectric layers ILD2 exposed to the trenches TR may be etched to form second recessions RS2. The second dielectric layers ILD2 may be etched by an isotropic etching process using an etchant that can selectively etch the second dielectric layers ILD2. The isotropic etching process may cause each of the second dielectric layers ILD2 to have a reduced width in the second direction D2. Each of the second recessions RS2 may be defined by a bottom surface of the first dielectric layer ILD1, a sidewall of the second dielectric layer ILD2, and a top surface of the semiconductor pattern SP. In some embodiments, the second recessions RS2 may also be defined, in part, by a portion of the gate dielectric layer GI on the vertical insulation pattern VIP (see FIG. 27D).

Referring to FIGS. 28 and 29A to 29D, the semiconductor patterns SP may have upper portions exposed to the trenches TR and the second recessions RS2 (see, e.g., FIG. 27C), and impurities may be doped into the exposed upper portions of the semiconductor patterns SP, thereby forming first impurity regions SD1.

First conductive lines CL1 may be formed in the second recessions RS2. The first conductive lines CL1 may be formed to partially fill corresponding second recession RS2. The first conductive lines CL1 may be formed on top surfaces of the first impurity regions SD1. Each of the first conductive lines CL1 may have a linear shape extending in the first direction D1. For example, the formation of the first conductive lines CL1 may include forming a conductive layer (e.g., metal) to fill the second recessions RS2, and performing an isotropic etching process to selectively etch the conductive layer.

An insulating material may be deposited to be within and, in some embodiments, completely fill the remaining portions of second recessions RS2. The deposited insulating material may constitute the second dielectric layer ILD2. The second dielectric layer ILD2 may be on and/or cover opposite sidewalls of the first conductive line CL1.

Common source lines CSL may be formed to be within and, in some embodiments, fill the trenches TR. The common source line CSL may be interposed between the first and second stack structures SS1 and SS2. Each of the common source lines CSL may have a linear shape extending in the first direction D1.

Referring to FIGS. 30 and 31A to 31E, a third mask pattern MA3 having third openings OP3 may be formed on the first and second stack structures SS1 and SS2. Each of the third openings OP3 may extend in the first direction D1. In some embodiments, each of the third openings OP3 may have a linear and/or bar shape, though the inventive concepts are not limited thereto. When viewed in plan, the third openings OP3 may run across the holes HO penetrating the stack structures SS1 and SS2.

The third mask pattern MA3 may be used as an etching mask to etch the first and second stack structures SS1 and SS2. The etching process may result in a plurality of holes HO penetrating one of the stack structures SS1 and SS2 being brought together into a single hole HO. The hole HO formed by the etching process may expose sidewalls of the semiconductor patterns SP. The hole HO formed by the etching process may expose sidewalls of the vertical insulation patterns VIP.

The semiconductor patterns SP exposed to the hole HO may be selectively etched to form third recessions RS3. The semiconductor patterns SP may be etched by an isotropic etching process using an etchant that can selectively etch the semiconductor patterns SP. The isotropic etching process may cause each of the second patterns SP to have a reduced width in the second direction D2. Each of the third recessions RS3 may be defined by a bottom surface of the second dielectric layer ILD2, a sidewall of the semiconductor pattern SP, and a top surface of the first dielectric layer ILD1. The third recession RS3 may lie between a pair of the vertical insulation patterns VIP adjacent to each other (see FIG. 31C).

The sidewalls of the semiconductor patterns SP exposed to the hole HO and the third recessions RS3 may be doped with impurities to form second impurity regions SD2. In each of the semiconductor patterns SP, a channel region CH may be defined between the first impurity region SD1 and the second impurity region SD2.

Referring to FIGS. 32 and 33A to 33E, a partial etching may be performed on the vertical insulation patterns VIP and the gate dielectric layers GI exposed to the hole HO and the third recessions RS3. The vertical insulation patterns VIP and the gate dielectric layers GI may be etched by an isotropic etching process using an etchant that can selectively etch the vertical insulation patterns VIP and the gate dielectric layers GI. As the vertical insulation patterns VIP and the gate dielectric layers GI are partially etched, the third recessions RS3 may expand. For example, the third recession RS3 between a pair of neighboring vertical insulation patterns VIP may have an increased width in the first direction D1 (see FIG. 33C).

A first electrode layer ELL may be conformally formed on a top surface of the substrate 100. In some embodiments, the first electrode layer ELL may be formed over the entire top surface of the substrate 100. The first electrode layer ELL may partially fill the third recessions RS3. The first electrode layer ELL may be on, and in some embodiments, cover, the second impurity regions SD2. In some embodiments, the first electrode layer ELL may directly contact the second impurity regions SD2.

Referring to FIGS. 34 and 35A to 35E, the first electrode layer ELL may be patterned to form first electrodes EL1 filling the third recessions RS3. For example, the formation of the first electrodes EL1 may include forming insulation patterns to fill the third recessions RS3 and using the insulation patterns as an etching mask to remove portions of the first electrode layer ELL that are not covered with the insulation patterns.

An isotropic etching process may be performed on the vertical insulation patterns VIP and the gate dielectric layers GI exposed to the hole HO, which may form fourth recessions RS4. The isotropic etching process may continue until the vertical insulation patterns VIP and the gate dielectric layers GI are removed from between the first electrodes EL1. The isotropic etching process may cause each of the vertical insulation patterns VIP to have a reduced width in the second direction D2.

Referring back to FIGS. 14, 15, and 16A to 16E, a dielectric layer DL may be conformally formed on the first electrodes EL1. A second electrode EL2 may be formed on the dielectric layer DL such that the hole HO may contain and, in some embodiments, be completely filled with, the second electrode EL2. A planarization process may be performed until a top surface of the third dielectric layer ILD3 is exposed. First and second contacts CNT1 and CNT2 may be formed to be respectively connected to the first and second conductive lines CL1 and CL2.

According to some embodiments of the inventive concepts, a three-dimensional semiconductor memory device may include the memory cell transistors and the data storage elements (e.g., capacitors) that are three-dimensionally stacked on the substrate. This configuration may increase integration of the memory device. A three-dimensional semiconductor memory device according to some embodiments of the inventive concepts may be applicable to cryogenic computing performed at a temperature below 100K.

It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When a certain example embodiment may be implemented differently, a specific process order may be performed differently from the described order. For example, two consecutively described processes may be performed substantially at the same time or performed in an order opposite to the described order.

In the accompanying drawings, variations from the illustrated shapes as a result, for example, of manufacturing techniques and/or tolerances, are to be expected. Thus, the example embodiments of the inventive concepts should not be construed as being limited to the particular shapes of regions illustrated herein but may be construed to include deviations in shapes that result, for example, from a manufacturing process. For example, an etched region illustrated as a rectangular shape may be a rounded or certain curvature shape. Thus, the regions illustrated in the figures are schematic in nature, and the shapes of the regions illustrated in the figures are intended to illustrate particular shapes of regions of devices and not intended to limit the scope of the present inventive concepts. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Although some embodiments of the inventive concepts have been discussed with reference to accompanying figures, it will be understood that various changes in form and details may be made therein without departing from the spirit and scope of inventive concepts. It therefore will be understood that the embodiments described above are just illustrative but not limitative in all aspects.

What is claimed is:

1. A semiconductor memory device, comprising:
a stack structure comprising a plurality of layers vertically stacked on a substrate, each of the plurality of layers comprising
a first dielectric layer, a semiconductor layer, and a second dielectric layer that are sequentially stacked, and
a first conductive line in the second dielectric layer and extending in a first direction;
a second conductive line extending vertically through the stack structure; and
a capacitor in the stack structure and spaced apart from the second conductive line, the capacitor comprising a first electrode,
wherein the semiconductor layer comprises semiconductor patterns extending in a second direction, intersecting the first direction, between the first conductive line and the substrate,
wherein the second conductive line is between a pair of the semiconductor patterns adjacent to each other in the first direction, and
wherein an end of at least one of the semiconductor patterns is electrically connected to the first electrode.

2. The device of claim 1, wherein the semiconductor layer further comprises an extension part extending in the first direction between the first conductive line and the substrate,
wherein the semiconductor patterns extend in the second direction from the extension part.

3. The device of claim 2, wherein the stack structure comprises a first stack structure and a second stack structure adjacent each other,
wherein a common source line is between the first stack structure and the second stack structure, the common source line being electrically connected to the extension part of the semiconductor layers of the first stack structure and the second stack structure, respectively.

4. The device of claim 1, wherein each of the semiconductor patterns comprises a first impurity region, a second impurity region, and a channel region between the first and second impurity regions,
wherein the first conductive line is electrically connected to the first impurity region of the at least one of the semiconductor patterns, and
wherein the first electrode is electrically connected to the second impurity region of the at least one of the semiconductor patterns.

5. The device of claim 1, wherein the capacitor comprises:
a plurality of first electrodes;
a dielectric layer on the plurality of first electrodes; and
a second electrode on the dielectric layer.

6. The device of claim 1, wherein the second conductive line comprises a plurality of second conductive lines, and
wherein a pair of the plurality of second conductive lines are adjacent to opposite sides of the at least one of the semiconductor patterns.

7. The device of claim 1, wherein the semiconductor patterns of the plurality of layers vertically overlap each other, and
wherein the second conductive line extends vertically and is adjacent to sidewalls of the semiconductor patterns of the plurality of layers.

8. A semiconductor memory device, comprising:
a stack structure including a plurality of layers vertically stacked on a substrate; and
a second conductive line penetrating the stack structure and extending vertically,
wherein each of the plurality of layers of the stack structure comprises:
a semiconductor pattern extending in a second direction, the semiconductor pattern comprising a first impurity region, a second impurity region, and a channel region between the first and second impurity regions;
a first conductive line electrically connected to the first impurity region and extending in a first direction intersecting the second direction; and
a data storage element electrically connected to the second impurity region, and
wherein the second conductive line is adjacent to the channel region of the semiconductor pattern.

9. The device of claim 8, wherein the semiconductor pattern of each of the plurality of layers comprises a plurality of semiconductor patterns, and
wherein the plurality of semiconductor patterns in each of the plurality of layers are arranged along the first direction.

10. The device of claim 8, wherein the semiconductor patterns of the plurality of layers vertically overlap each other, and
wherein the second conductive line extends vertically and is adjacent to the channel region of the semiconductor patterns of the plurality of layers.

11. The device of claim 8, wherein the data storage element comprises:
a first electrode connected to the second impurity region;
a second electrode adjacent to the first electrode; and
a dielectric layer between the first and second electrodes.

12. The device of claim 8, wherein the stack structure comprises a first stack structure and a second stack structure,
wherein the first and second stack structures are arranged along the second direction, and
wherein the first and second stack structures are mirror-symmetric each other about an imaginary plane that runs between the first and second stack structures.

13. The device of claim 12, further comprising a common source line between the first and second stack structures,
wherein the semiconductor patterns of the first and second stack structures are connected to the common source line.

14. The device of claim 8, wherein the second conductive line comprises a plurality of second conductive lines,
wherein one of a pair of the second conductive lines adjacent to each other is adjacent to one side of the channel region of the semiconductor pattern, and
wherein the other of the pair of the second conductive lines adjacent to each other is adjacent to an opposite side of the channel region of the semiconductor pattern.

15. The device of claim 8, wherein the second conductive line is on a top surface, a bottom surface and sidewalls of the channel region of the semiconductor pattern.

16. The device of claim 8, wherein the semiconductor pattern comprises a first part extending vertically and a second part extending in the first direction from the first part, and
wherein the second conductive line is adjacent to the first and second parts.

17. A semiconductor memory device, comprising:
a stack structure including a plurality of layers stacked vertically on a substrate, each of the plurality of layers including a plurality of memory cell transistors;
a word line extending vertically from a top surface of the substrate and connected to gates of the memory cell transistors that are vertically stacked;
a bit line extending in a first direction parallel to the top surface of the substrate and connected to a source of respective ones of the memory cell transistors in one layer of the plurality of layers; and
a capacitor connected to a drain of respective ones of the memory cell transistors.

18. The device of claim 17, wherein each of the memory cell transistors comprises a semiconductor pattern comprising a channel region,
wherein the semiconductor patterns of the memory cell transistors in the one layer of the plurality of layers are located at a first level, and
wherein the bit line is located at a second level higher than the first level.

19. The device of claim 17, wherein each of the memory cell transistors comprises a semiconductor pattern including a channel region, and
wherein the semiconductor pattern extends in a second direction parallel to the top surface of the substrate, the second direction intersecting the first direction.

20. The device of claim 17, wherein the capacitor comprises:
a first electrode connected to the drain of each of the memory cell transistors;
a dielectric layer on the first electrode; and
a second electrode on the dielectric layer.

* * * * *